(12) United States Patent
Nguyen et al.

(10) Patent No.: US 11,974,500 B2
(45) Date of Patent: Apr. 30, 2024

(54) MOLECULAR SEMICONDUCTORS CONTAINING DIKETOPYRROLOPYRROLE AND DITHIOKETOPYRROLOPYRROLE CHROMOPHORES FOR SMALL MOLECULE OR VAPOR PROCESSED SOLAR CELLS

(71) Applicant: The Regents of the University of California, Santa Barbara, CA (US)

(72) Inventors: Thuc-Quyen Nguyen, Santa Barbara, CA (US); Arnold Bernarte Tamayo, Glendale, CA (US); Bright Walker, Goleta, CA (US); Tyler Kent, Newport Beach, CA (US); Chunki Kim, Goleta, CA (US); Mananya Tantiwiwat, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 15/882,642

(22) Filed: Jan. 29, 2018

(65) Prior Publication Data

US 2018/0233674 A1    Aug. 16, 2018

Related U.S. Application Data

(63) Continuation of application No. 15/094,576, filed on Apr. 8, 2016, which is a continuation of application No. 12/748,266, filed on Mar. 26, 2010.
(Continued)

(51) Int. Cl.
*H10K 85/60* (2023.01)
*B82Y 10/00* (2011.01)
(Continued)

(52) U.S. Cl.
CPC .......... *H10K 85/6572* (2023.02); *B82Y 10/00* (2013.01); *H10K 30/30* (2023.02);
(Continued)

(58) Field of Classification Search
None
See application file for complete search history.

(56) References Cited

U.S. PATENT DOCUMENTS 8,404,864 B2    3/2013    Hao
9,018,397 B2    4/2015    Hao
(Continued)

FOREIGN PATENT DOCUMENTS

JP    2004-175674 A    6/2004
JP    2004-206893 A    7/2004
(Continued)

OTHER PUBLICATIONS

Tamayo, A. B. et al. "A Low Band Gap, Solution Processable Oligothiophene with a Diketopyrrolopyrrole Core for Use in Organic Solar Cells". J. Phys. Chem. C 2008, 112, 11545-11551 (Year: 2008).*

(Continued)

*Primary Examiner* — Richard A Huhn
(74) *Attorney, Agent, or Firm* — Morrison & Foerster LLP

(57) ABSTRACT

Optoelectronic devices, such as photovoltaic devices, comprising a low band gap, solution processable diketopyrrolopyrrole or dithioketopyrrolopyrrole chromophore core or cores are disclosed. Also disclosed are methods of fabricating such optoelectronic devices.

11 Claims, 18 Drawing Sheets

LIGHT

Related U.S. Application Data

(60) Provisional application No. 61/163,789, filed on Mar. 26, 2009.

(51) Int. Cl.
| | |
|---|---|
| C08G 61/12 | (2006.01) |
| H10K 30/30 | (2023.01) |
| H10K 85/10 | (2023.01) |
| H10K 85/20 | (2023.01) |
| H10K 30/82 | (2023.01) |

(52) U.S. Cl.
CPC ....... *H10K 85/113* (2023.02); *H10K 85/1135* (2023.02); *H10K 85/211* (2023.02); *H10K 85/215* (2023.02); *H10K 85/615* (2023.02); *H10K 85/649* (2023.02); *H10K 85/655* (2023.02); *H10K 85/657* (2023.02); *C08G 61/126* (2013.01); *H10K 30/82* (2023.02); *Y02E 10/549* (2013.01)

(56) References Cited

U.S. PATENT DOCUMENTS

| | | |
|---|---|---|
| 2004/0151944 A1 | 8/2004 | Onikubo et al. |
| 2007/0228359 A1 | 10/2007 | Heim et al. |
| 2008/0217581 A1 | 9/2008 | Yamamoto et al. |
| 2008/0315187 A1 | 12/2008 | Bazan et al. |
| 2009/0032808 A1 | 2/2009 | Bazan et al. |
| 2009/0108255 A1 | 4/2009 | Bazan et al. |
| 2010/0236525 A1 | 9/2010 | Ng et al. |
| 2010/0326525 A1 | 12/2010 | Nguyen et al. |
| 2011/0004004 A1 | 1/2011 | Hao |
| 2013/0172575 A1 | 7/2013 | Hao |
| 2016/0301017 A1 | 10/2016 | Nguyen et al. |

FOREIGN PATENT DOCUMENTS

| | | | | |
|---|---|---|---|---|
| JP | 2006-117591 A | 5/2006 | | |
| JP | 2007-059483 A | 3/2007 | | |
| JP | 2007-266285 A | 10/2007 | | |
| JP | 2008-071863 A | 3/2008 | | |
| JP | 2008-174468 A | 7/2008 | | |
| WO | WO-2005/049695 A1 | 6/2005 | | |
| WO | WO-2008/000664 A1 | 1/2008 | | |
| WO | WO-2008000664 A1 * | 1/2008 | ............. | B82Y 10/00 |
| WO | WO-2008/044302 A1 | 4/2008 | | |
| WO | WO2009047104 A2 | 4/2009 | | |
| WO | WO2009047104 A3 | 6/2009 | | |

OTHER PUBLICATIONS

Cao, D. et al. (2006). "Synthesis and Characterization of Novel Red-Emitting Alternating Copolymers Based on Fluorene and Diketopyrrolopyrrole Derivatives," *J. Poly. Sci.* (Part A). 44:2395-2405.

Closs, F. et al. (1987). "2,5-Diazapentalenes," *Agnew. Chem. Int. Ed. Engl.* 26(6):552-554.

Laquai, F. et al. (2009). "Excitation Energy Transfer in Organic Materials: From Fundamentals to Optoelectronic Devices," *Macromol. Rapid Commun.* 30:1203-1231.

Lin, Y et al. (2012). "Small Molecule Semiconductors For High-Efficiency Organic Photovoltaics," *Chem. Soc. Rev.* 41(11):4245-4272.

Liu, J. et al. (2014). "Solution-Processed Molecular Bulk Heterojunction Solar Cells," in *Organic Photovoltaics: Materials, Device Physics, and Manufacturing Technologies*, C. Brabec et al. (eds.), Wiley-VCH Verlang GmbH & Co., Second Edition, pp. 95-137.

Lloyd, M.T. et al. (Nov. 2007). "Photovoltaics From Soluble Small Molecules," *Materials Today* 10(11):34-41.

Mei, J. et al. (2010). "Synthesis of Isoindigo-Based Oligothiophenes for Molecular Bulk Heterojunction Solar Cells," *Organic Letters*, 12(4):660-663.

Roncali, J. (Nov. 2009). "Molecular Bulk Heterojunctions: An Emerging Approach to Organic Solar Cells," *Accounts of Chem. Res.* 42(11): 1719-1730.

Sonar, P. et al. (May 14, 2010). "Solution Processable Low Bandgap Diketopyrrolopyrrole (DPP) Based Derivatives: Novel Acceptors For Organic Solar Cells+," *J. Mater Chem.* 20(18):3517-3776.

Tamayo, A.B. (2008). "A Low Band Gap, Solution Processable Oligothiophene with a Diketopyrrolopyrrole Core for Use in Organic Solar Cells," *J. Phys. Chem. C.* 112(30):11545-11551.

Tamayo, A.B. (2008). "A Low Band Gap, Solution Processable Oligothiophene with a Diketopyrrolopyrrole Core for Use in Organic Solar Cells," (Supporting Information), 7 pages.

Tamayo, A. et al. "Oligothiophenes with a Diketopyrrolopyrrolo Core for Efficient Solution-Processed BHJ Solar Cells," Poster presented on Mar. 27, 2008 at Materials Research Society Spring Meeting (meeting dates Mar. 24-28, 2008), San Francisco, California, one page.

Tamayo, A. et al. "High Performance, Solution-Processed Organic Solar Cells Using A Low Band Gap Oligothiophene With A Diketopyrrolopyrrole Chromophore," Poster presented on Aug. 12, 2008 at SPIE Optics+Photonics Meeting (meeting dates Aug. 10-14, 2008), San Diego, California, one page.

Tang, C.W. et al. (1989). "Electroluminescence of doped organic thin films," *J. of Appl. Phys.*, 65(9):3610-3616.

Tantiwiwat, M. et al. (2008). "Oligothiophene Derivatives Functionalized with a Diketopyrrolopyrrolo Core for Solution-Processed Field Effect Transistors: Effect of Alkyl Substituents and Thermal Annealing," *J. Phys. Chem. C.* 112(44): 17402-17407.

Thomsen, I. et al. (1984). "Thiation With 2,4-Bis (4-Methoxyphenyl)-1,3,2,4-Dithiadiphosphetane 2,4-Disulfide: N-Methylthiopyrrolidone," *Organic Sytheses* Collective vol. 62:158-163.

Thomsen, I. et al. (1990). "Thiation With 2,4-Bis (4-Methoxyphenyl)-1,3,2,4-Dithiadiphosphetane 2,4-Disulfide: N-Methylthiopyrrolidone," *Organic Sytheses* Collective vol. 7:372-375.

Walker, B. et al. (2009). "Nanoscale Phase Separation and High Photovoltaic Efficiency in Solution-Processed, Small-Molecule Bulk Heterojunction Solar Cells," *Adv. Funct. Mater.* 19:3063-3069.

Walker, B. et al. (2011, e-pub. Nov. 4, 2010). "Small Molecule Solution-Processed Bulk Heterojunction Solar Cells," *Chem. Mater.* 23(3):470-482.

Wienk, M.M. et al. (2008). "Narrow-Bandgap Diketo-Pyrrolo-Pyrrole Polymer Solar Cells: The Effect of Processing on the Performance," *Adv. Mater.* 20:2556-2560.

Zambounis, J.S et al. (Jul. 10, 1997). "Latent Pigments Activated By Heat," *Nature* 388:131-132.

Zhang, X. et al. (Feb. 28, 2006). "Highly Dichroic Benzo-2,1,3-Thiadiazole Dyes Containing Five Linearly π-Conjugated Aromatic Residues, with Fluorescent Emission Ranging from Green to Red, In A Liquid Crystal Quest-Host System+," *J. Mater. Chem.* 16(8): 736-740.

Zhao, X. et al. (2010). "Solution-Processable Crystalline Platinum-Acetylide Oligomers with Broadband Absorption for Photovoltaic Cells," *Chem. Matter*, 22:2325-2332.

Zrig, S. et al. (May 9, 2007). "A-Type Regioregular Oligothiophenes: Synthesis and Second-Order NLO Properties," *J. Org. Chem.* 72(15): 5855-5858.

\* cited by examiner

MOLECULAR SEMICONDUCTORS CONTAINING DIKETOPYRROLOPYRROLE AND DITHIOKETOPYRROLOPYRROLE CHROMOPHORES FOR SMALL MOLECULE OR VAPOR PROCESSED SOLAR CELLS

CROSS-REFERENCE TO RELATED APPLICATIONS

This application is a continuation of U.S. patent application Ser. No. 15/094,576 filed Apr. 8, 2016, now abandoned, which is a continuation of U.S. patent application Ser. No. 12/748,266 filed Mar. 26, 2010, now abandoned, which claims priority benefit of U.S. Provisional Patent Application No. 61/163,789, filed Mar. 26, 2009. The entire contents of those applications are hereby incorporated by reference herein in their entirety.

STATEMENT REGARDING FEDERALLY SPONSORED RESEARCH OR DEVELOPMENT

This invention was made with Government support under grants N000140510677 and N000140811226 awarded by the Office of Naval Research, and grant DE-FG02-06ER46324 awarded by the Department of Energy. The Government has certain rights in this invention.

BACKGROUND OF THE INVENTION

Solar cells based on organic semiconductors are evolving into a promising cost-effective alternative to silicon-based solar cells due to low-cost fabrication by solution-processing, ease of processing, light weight, and compatibility with flexible substrates. Gunes et al. *Chem. Rev.* 2007, 107, 1324; Roncali, J., *Acc. Chem. Res.* 2009, 42, 1719. Devices based on these materials were predicted to have an efficiency of 10% based on theoretical models. Scharber et al. *J. Adv. Mater.* 2006, 18, 789. For instance, solution processed bulk heterojunction (BHJ) solar cells using poly(3-hexylthiophene) (P3HT) as the electron donor and [6,6]-phenyl C61-butyric acid methyl ester (PCBM) as the electron acceptor have been reported to have efficiencies as high as 5.2%. Kim et al. *Nature Mater.* 2006, 5, 197. Although this system is capable of yielding some of the highest reported efficiencies among organic photovoltaics, it suffers from two significant shortcomings: i) the P3HT-PCBM mixture does not absorb light with wavelengths longer than about 650 nm, and thus a large fraction of sunlight is wasted in this system; and ii) the P3HT must have a relatively high molecular weight and very high regioregularity. Most commercially available P3HT yields BHJ devices with efficiencies much lower than 5%. Synthesizing "good" P3HT can be problematic as the consistency between different batches of P3HT can vary.

Recently, there has been a significant effort to address the light absorption problem, and a large number of materials have been designed which have low band gaps and are able to absorb light at wavelengths up to 800 or 900 nm. Although such materials are successfully able to absorb a large fraction of the solar spectrum, most of them do not yield efficient BHJ photovoltaics due to inadequate electrical properties such as low charge carrier mobilities, incorrectly aligned HOMO and LUMO levels, or poor solid state morphologies.

The most successful low bandgap material reported as of early 2009 has been poly[2,6-(4,4-bis-(2-ethylhexyl)-4H-cyclopenta[2, 1-b;3,4-b']dithiophene)-alt-4,7-(2,1,3-benzothiadiazole)] (PCPDTBT). In this case, photovoltaics with efficiencies of close to 6% have been reported. However, the material is polymeric and there have been problems reproducing results using PCPDTBT from different sources.

The absorption problem can also be solved by fabricating "tandem" solar cells, in which two BHJ photovoltaics are stacked on top of each other, with each layer absorbing a different fraction of the solar spectrum. Efficiencies as high as 6.5% have been reported using this type of system; however, fabricating two photovoltaic layers on top of each other adds a significant amount of complexity to the device architecture and difficulty in processing.

One material that has been used as an organic semiconductor in electronic devices is a diketopyrrolopyrrole-based polymer; efficiencies as high as 4.7% were reported for this material. See U.S. Patent Application Publication No. 2007/0228359; see also WO 2008/000664.

Solution-processed solar cells based on conjugated small molecule donors and fullerene acceptors have also been investigated by a number of research groups. As of March 2009, small molecule-based solar cell devices have power conversion efficiencies ranging from 0.3% to 1.3%. Schmidt-Mende et al. *Science* 2001, 293, 1119. These efficiencies remain low when compared to either thermally deposited small molecule bilayer solar cells or polymer-based solar cells. Despite the lower performance attained thus far, conjugated small molecules can potentially offer several advantages over polymeric materials, making them promising materials for solution-processed solar cells. For example, molecular organic semiconductors, such as oligothiophenes and oligoacenes, display higher hole and electron mobilities than their polymeric analogues as a result of better molecular ordering. Most important, conjugated small molecules do not suffer from batch to batch variations, broad molecular weight distributions, end group contamination, and difficult purification methods, as is the situation for their polymeric counterparts.

These devices have distinct advantages over previous optoelectronic devices. First, the material is not a polymer, making the synthesis and purification easier and more repeatable than for similar conjugated polymers. Second, the material has desirable electronic properties such as favorable HOMO level, LUMO level, and hole mobility ($\sim 10^{-4}$ cm$^2$/Vs). Third, the material has desirable optical properties, including a very high optical density and good overlap with the solar spectrum in the solid state. Fourth, the efficiencies observed in photovoltaics fabricated using this system are higher than those previously reported for solution-processed, non-polymeric photovoltaics. Oligothiophene derivatives functionalized with a diketopyrrolopyrrolo core have been used in solution-processed field effect transistors (Tantiwiwat et al., J. Phys. Chem. C, 112:17402 (2008)).

BRIEF SUMMARY OF THE INVENTION

The present invention is directed to an optoelectronic device comprising of a mixture of a non-polymeric electron-donating chromophore based on a diketopyrrolopyrrole (DPP) structure, as well as an electron-accepting material such as a fullerene or methanofullerene, and a method of fabricating the device by solution processing. Also disclosed are non-polymeric electron donating chromophores based on the DPP structure.

In one embodiment, the invention embraces an optoelectronic device comprising a) a first hole-collecting electrode; b) an optional hole-transporting layer; c) a layer comprising a mixture of an electron donor material and an electron acceptor material; and d) a second electron-collecting electrode, wherein the electron donor material comprises a compound of the following general Formula I:

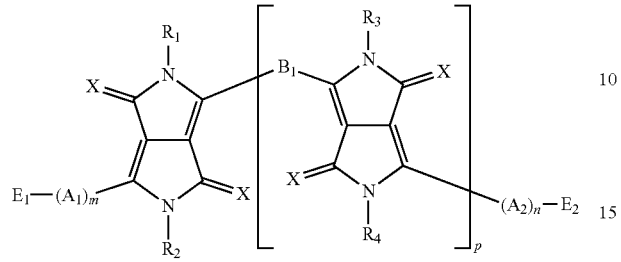

wherein X is oxygen or sulfur;
A$_1$ and A$_2$ are independently selected from substituted and unsubstituted aryl or heteroaryl groups, wherein each individual A$_1$ within the (A$_1$)$_m$ moiety can be independently selected from a substituted or unsubstituted aryl or heteroaryl group, and each individual A$_2$ within the (A$_2$)$_n$ moiety can be independently selected from a substituted or unsubstituted aryl or heteroaryl group;
B$_1$ is independently selected from substituted and unsubstituted aryl or heteroaryl groups;
m is independently selected from 1, 2, 3, 4, 5, 6, 7, 8, or 9;
n is independently selected from 1, 2, 3, 4, 5, 6, 7, 8, or 9;
p is independently selected from 0 or 1;
E$_1$ and E$_2$ are independently selected from a nonentity, H, or a substituted or unsubstituted aryl or heteroaryl group or a C$_1$-C$_{12}$ alkyl group; and
R$_1$, R$_2$, R$_3$, and R$_4$ are independently selected from H, C$_1$-C$_{12}$ alkyl, and —C(=O)—O—C$_1$-C$_{12}$ alkyl.

In one embodiment, the device is a photovoltaic device.
In one embodiment, X is oxygen. In another embodiment, X is sulfur.
In one embodiment, A$_1$ and A$_2$ are independently selected from the group consisting of thiophene, bithiophene, terthiophene, thienothiophene, dithienothiophene, benzothiophene, isobenzothiophene, benzodithiophene, cyclopentadithiophene, indole, benzene, naphthalene, anthracene, indene, fluorene, pyrene, azulene, furan, pyrrole, pyridine, oxazole, thiazole, thiazine, pyrimidine, pyrazine, imidazole, benzoxazole, benzoxadiazole, benzothiazole, benzimidazole, benzofuran, isobenzofuran, thiadiazole, pyridothiadiazole, and carbazole. In another embodiment, A$_1$ and A$_2$ are thiophene. In another embodiment, the thiophene moieties bonded to the diketopyrrolopyrrole core are bonded to the core via the 2-position of the thiophene. In another embodiment, the thiophene moieties bonded to the E$_1$ and E$_2$ moieties are bonded to the E$_1$ and E$_2$ moieties via the 5-position of the thiophenes. In another embodiment, the thiophene moieties bonded to the diketopyrrolopyrrole core are bonded to the remainder of the molecule via the 5-position of the thiophene, the thiophene moieties bonded to the E$_1$ and E$_2$ moieties are bonded to the remainder of the molecule via the 2-position of the thiophenes, and, if either or both of m and n are greater than 1, any thiophene-thiophene bond is bonded via a bond between the 2- and 5-positions of the thiophenes.

In one embodiment, m=n=1. In another embodiment, m=n=2. In another embodiment, m=n=3.

In another embodiment, A$_1$ is selected from

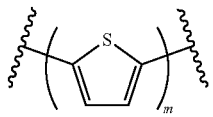

where m is 1, 2, or 3. In another embodiment, A$_2$ is selected from

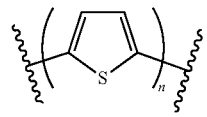

where n is 1, 2, or 3.
In another embodiment, A$_1$ is selected from

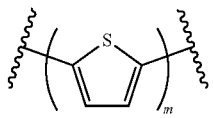

where m is independently 1, 2, or 3, and A$_2$ is selected from

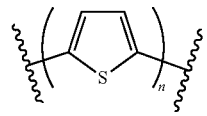

where n is independently 1, 2, or 3. In another embodiment, A$_1$ is selected from

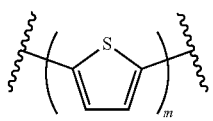

where m is 1, and A$_2$ is selected from

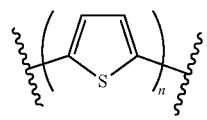

where n is 1; or where m=n=2, or where m=n=3.
In another embodiment, A$_1$ is selected from

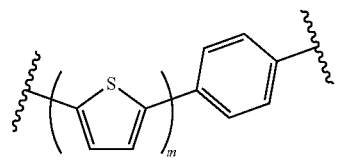

where m is 1, 2, or 3. In another embodiment, $A_2$ is selected from

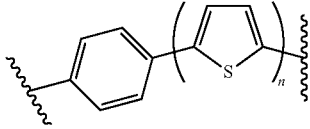

where n is 1, 2, or 3. In another embodiment, $A_1$ is selected from

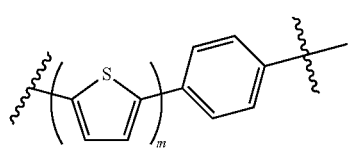

where m is independently 1, 2, or 3, and $A_2$ is selected from

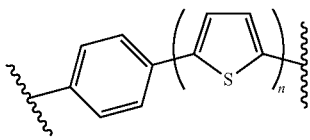

where n is independently 1, 2, or 3. In another embodiment, $A_1$ is selected from

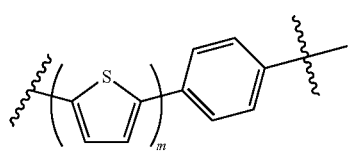

where m is 1, and $A_2$ is selected from

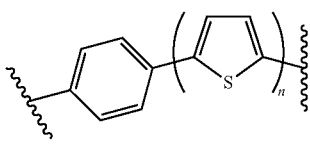

where n is 1; or where m=n=2, or where m=n=3.

In one embodiment, $B_1$ is independently selected from the group consisting of thiophene, bithiophene, terthiophene, thienothiophene, dithienothiophene, benzothiophene, isobenzothiophene, benzodithiophene, cyclopentadithiophene, indole, benzene, naphthalene, anthracene, indene, fluorene, pyrene, azulene, furan, pyrrole, pyridine, oxazole, thiazole, thiazine, pyrimidine, pyrazine, imidazole, benzoxazole, benzoxadiazole, benzothiazole, benzimidazole, benzofuran, isobenzofuran, thiadiazole, pyridothiadiazole, carbazole,

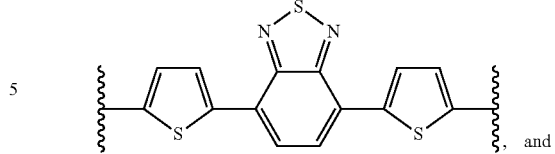

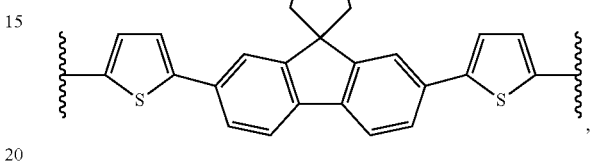

, and

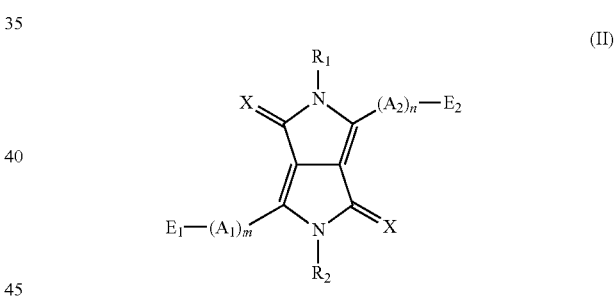

, where the bonds ending in wavy lines indicate the attachment of the $B_1$ moiety to the remainder of the molecule.

In one embodiment, $R_1$, $R_2$, $R_3$, and $R_4$ are the same and are selected from hexyl, 2-ethylhexyl, t-butoxycarbonyl, and trimethylsilyl.

In one embodiment, the invention embraces an optoelectronic device comprising a) a first hole-collecting electrode; b) an optional hole-transporting layer; c) a layer comprising a mixture of an electron donor material and an electron acceptor material; and d) a second electron-collecting electrode, wherein the electron donor material comprises a compound of the following general Formula II:

$$\text{(II)}$$

wherein X is oxygen or sulfur; $A_1$ and $A_2$ are selected from substituted and unsubstituted aryl or heteroaryl groups, wherein each individual $A_1$ within the $(A_1)_m$ moiety can be independently selected from a substituted or unsubstituted aryl or heteroaryl group, and each individual $A_2$ within the $(A_2)_n$ moiety can be independently selected from a substituted and unsubstituted aryl or heteroaryl group; m is independently selected from 1, 2, 3, 4, 5, 6, 7, 8, or 9; n is independently selected from 1, 2, 3, 4, 5, 6, 7, 8, or 9; $E_1$ and $E_2$ are independently selected from a nonentity, H, or a substituted or unsubstituted aryl or heteroaryl group or a $C_1$-$C_{12}$ alkyl group; and $R_1$ and $R_2$ are independently selected from H, $C_1$-$C_{12}$ alkyl, and —C(=O)—O—$C_1$-$C_{12}$ alkyl.

In one embodiment, the device is a photovoltaic device.

In one embodiment, X is oxygen. In another embodiment, X is sulfur.

In one embodiment, $A_1$ and $A_2$ are independently selected from the group consisting of thiophene, bithiophene, terthiophene, thienothiophene, dithienothiophene, benzothiophene, isobenzothiophene, benzodithiophene, cyclopentadithiophene, indole, benzene, naphthalene, anthracene, indene, fluorene, pyrene, azulene, furan, pyrrole, pyridine, oxazole, thiazole, thiazine, pyrimidine, pyrazine, imidazole, benzoxazole, benzoxadiazole, benzothiazole, benzimidazole, benzofuran, isobenzofuran, thiadiazole, pyridothiadiazole, and carbazole. In another embodiment, $A_1$ and $A_2$ are thiophene. In another embodiment, the thiophene moieties bonded to the diketopyrrolopyrrole core are bonded to the core via the 2-position of the thiophene. In another embodiment, the thiophene moieties bonded to the $E_1$ and $E_2$ moieties are bonded to the $E_1$ and $E_2$ moieties via the 5-position of the thiophenes. In another embodiment, the thiophene moieties bonded to the diketopyrrolopyrrole core are bonded to the remainder of the molecule via the 5-position of the thiophene, the thiophene moieties bonded to the $E_1$ and $E_2$ moieties are bonded to the remainder of the molecule via the 2-position of the thiophenes, and, if either or both of m and n are greater than 1, any thiophene-thiophene bond is bonded via a bond between the 2- and 5-positions of the thiophenes.

In one embodiment, m=n=1. In another embodiment, m=n=2. In another embodiment, m=n=3.

In another embodiment, $A_1$ is selected from

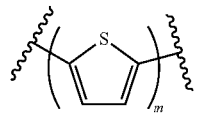

where m is 1, 2, or 3. In another embodiment, $A_2$ is selected from

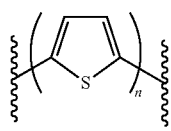

where n is 1, 2, or 3. In another embodiment, $A_1$ is selected from

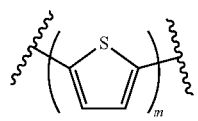

where m is independently 1, 2, or 3, and $A_2$ is selected from

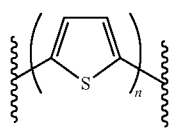

where n is independently 1, 2, or 3. In another embodiment, $A_1$ is selected from

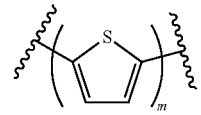

where m is 1, and $A_2$ is selected from

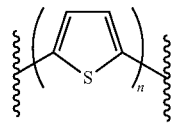

where n is 1; or where m=n=2, or where m=n=3.

In another embodiment, $A_1$ is selected from

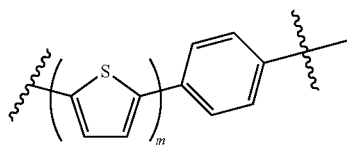

where m is 1, 2, or 3. In another embodiment, $A_2$ is selected from

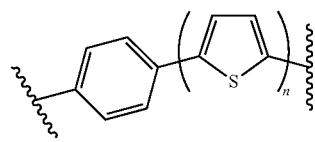

where n is 1, 2, or 3. In another embodiment, $A_1$ is selected from

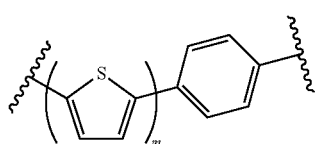

where m is independently 1, 2, or 3, and $A_2$ is selected from

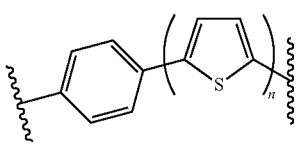

where n is independently 1, 2, or 3. In another embodiment, $A_1$ is selected from

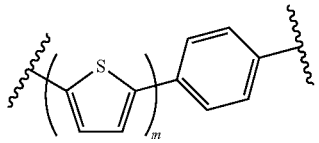

where m is 1, and $A_2$ is selected from

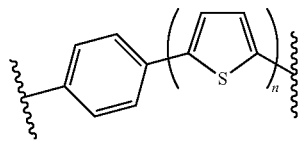

where n is 1; or where m=n=2, or where m=n=3.

In one embodiment, $R_1$ and $R_2$ are the same and are selected from hexyl, 2-ethylhexyl, t-butoxycarbonyl, and trimethylsilyl.

In one embodiment, the invention embraces an optoelectronic device comprising a) a first hole-collecting electrode; b) an optional hole-transporting layer; c) a layer comprising a mixture of an electron donor material and an electron acceptor material; and d) a second electron-collecting electrode, wherein the electron donor material comprises a compound of the following general Formula IIa:

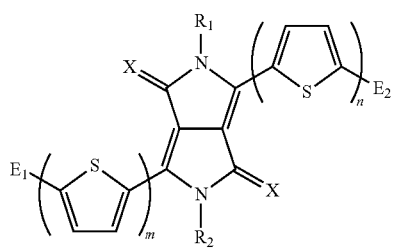

(IIa)

wherein X is oxygen or sulfur; m is independently selected from 1, 2, 3, 4, 5, 6, 7, 8, or 9; n is independently selected from 1, 2, 3, 4, 5, 6, 7, 8, or 9; $E_1$ and $E_2$ are independently selected from a nonentity, H, or a substituted or unsubstituted aryl or heteroaryl group or a $C_1$-$C_{12}$ alkyl group; and $R_1$ and $R_2$ are independently selected from H, $C_1$-$C_{12}$ alkyl, and —C(=O)—O—$C_1$-$C_{12}$ alkyl.

In one embodiment, the device is a photovoltaic device.

In one embodiment, X is oxygen. In another embodiment, X is sulfur.

In one embodiment, m=n=1. In another embodiment, m=n=2. In another embodiment, m=n=3.

In another embodiment, $A_1$ is selected from

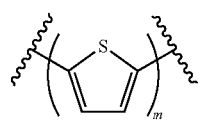

where m is 1, 2, or 3. In another embodiment, $A_2$ is selected from

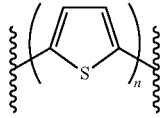

where n is 1, 2, or 3.
In another embodiment, $A_1$ is selected from

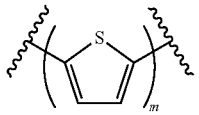

where m is independently 1, 2, or 3, and $A_2$ is selected from

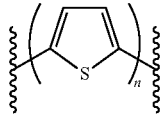

where n is independently 1, 2, or 3. In another embodiment, $A_1$ is selected from

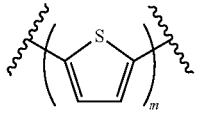

where m is 1, and $A_2$ is selected from

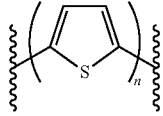

where n is 1; or where m=n=2, or where m=n=3.

In another embodiment, $A_1$ is selected from

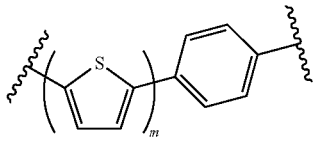

where m is 1, 2, or 3. In another embodiment, $A_2$ is selected from

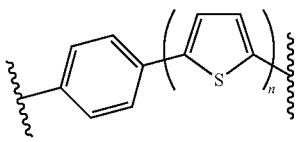

where n is 1, 2, or 3. In another embodiment, $A_1$ is selected from

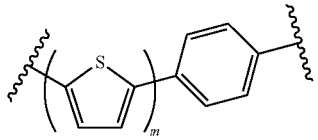

where m is independently 1, 2, or 3, and $A_2$ is selected from

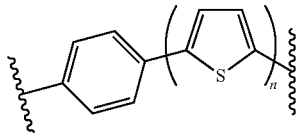

where n is independently 1, 2, or 3. In another embodiment, $A_1$ is selected from

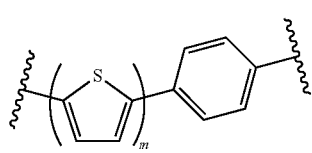

where m is 1, and $A_2$ is selected from

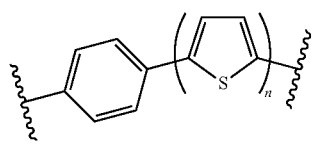

where n is 1; or where m=n=2, or where m=n=3.

In one embodiment, $R_1$ and $R_2$ are the same and are selected from hexyl, 2-ethylhexyl, t-butoxycarbonyl, and trimethylsilyl.

In one embodiment, the invention embraces an optoelectronic device comprising a) a first hole-collecting electrode; b) an optional hole-transporting layer; c) a layer comprising a mixture of an electron donor material and an electron acceptor material; and d) a second electron-collecting electrode, wherein the electron donor material comprises a compound of the following general Formula IIb:

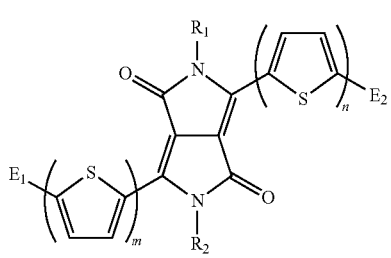

wherein m is independently selected from 1, 2, 3, 4, 5, 6, 7, 8, or 9; n is independently selected from 1, 2, 3, 4, 5, 6, 7, 8, or 9; $E_1$ and $E_2$ are independently selected from a nonentity, H, or a substituted or unsubstituted aryl or heteroaryl group or a $C_1$-$C_{12}$ alkyl group; and $R_1$ and $R_2$ are independently selected from H, $C_1$-$C_{12}$ alkyl, and —C(=O)—O—$C_1$-$C_{12}$ alkyl.

In one embodiment, the device is a photovoltaic device.

In one embodiment, m=n=1. In another embodiment, m=n=2. In another embodiment, m=n=3.

In another embodiment, $A_1$ is selected from

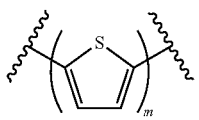

where m is 1, 2, or 3. In another embodiment, $A_2$ is selected from

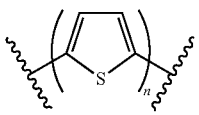

where n is 1, 2, or 3. In another embodiment, $A_1$ is selected from

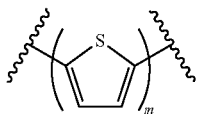

where m is independently 1, 2, or 3, and $A_2$ is selected from

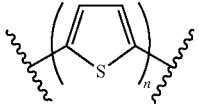

where n is independently 1, 2, or 3. In another embodiment, $A_1$ is selected from

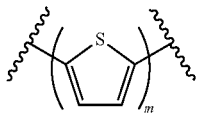

where m is 1, and $A_2$ is selected from

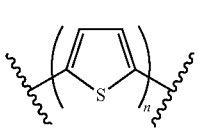

where n is 1; or where m=n=2, or where m=n=3.

In another embodiment, $A_1$ is selected from

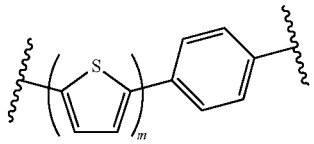

where m is 1, 2, or 3. In another embodiment, $A_2$ is selected from

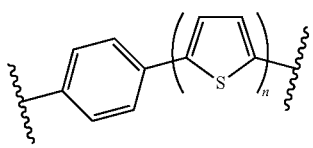

where n is 1, 2, or 3. In another embodiment, $A_1$ is selected from

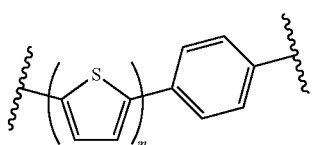

where m is independently 1, 2, or 3, and $A_2$ is selected from

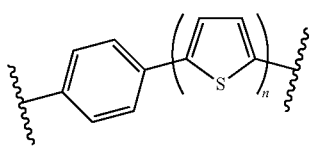

where n is independently 1, 2, or 3. In another embodiment, $A_1$ is selected from

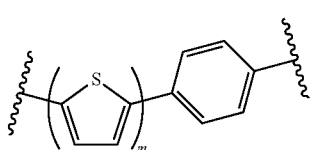

where m is 1, and $A_2$ is selected from

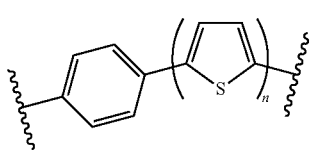

where n is 1; or where m=n=2, or where m=n=3.

In one embodiment, $R_1$ and $R_2$ are the same and are selected from hexyl, 2-ethylhexyl, t-butoxycarbonyl, and trimethylsilyl.

In one embodiment, the invention embraces an optoelectronic device comprising a) a first hole-collecting electrode; b) an optional hole-transporting layer; c) a layer comprising a mixture of an electron donor material and an electron acceptor material; and d) a second electron-collecting electrode, wherein the electron donor material comprises a compound of the following general Formula IIc:

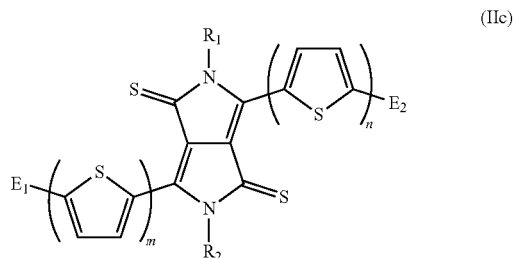

(IIc)

wherein m is independently selected from 1, 2, 3, 4, 5, 6, 7, 8, or 9; n is independently selected from 1, 2, 3, 4, 5, 6, 7, 8, or 9; $E_1$ and $E_2$ are independently selected from a nonentity, H, or a substituted or unsubstituted aryl or heteroaryl group or a $C_1$-$C_{12}$ alkyl group; and $R_1$ and $R_2$ are independently selected from H, $C_1$-$C_{12}$ alkyl, and —C(=O)—O—$C_1$-$C_{12}$ alkyl.

In one embodiment, the device is a photovoltaic device.

In one embodiment, m=n=1. In another embodiment, m=n=2. In another embodiment, m=n=3.

In another embodiment, $A_1$ is selected from

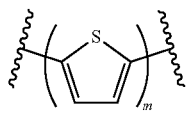

where m is 1, 2, or 3. In another embodiment, $A_2$ is selected from

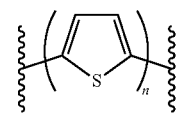

where n is 1, 2, or 3. In another embodiment, $A_1$ is selected from

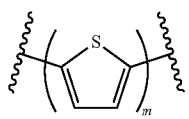

where m is independently 1, 2, or 3, and $A_2$ is selected from

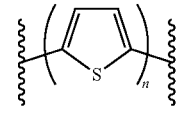

where n is independently 1, 2, or 3. In another embodiment, $A_1$ is selected from

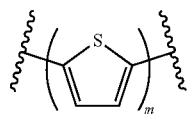

where m is 1, and $A_2$ is selected from

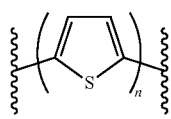

where n is 1; or where m=n=2, or where m=n=3.

In another embodiment, $A_1$ is selected from

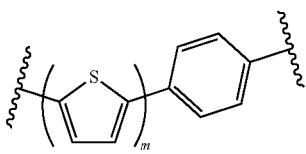

where m is 1, 2, or 3. In another embodiment, $A_2$ is selected from

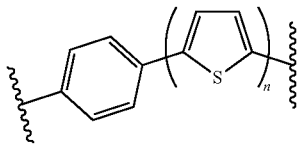

where n is 1, 2, or 3. In another embodiment, $A_1$ is selected from

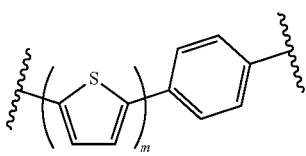

where m is independently 1, 2, or 3, and $A_2$ is selected from

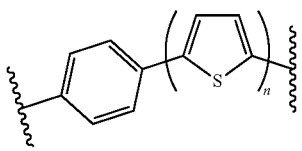

where n is independently 1, 2, or 3. In another embodiment, $A_1$ is selected from

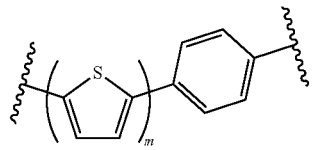

where m is 1, and $A_2$ is selected from

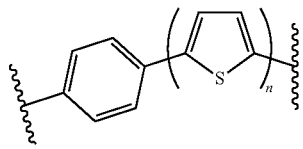

where n is 1; or where m=n=2, or where m=n=3.

In one embodiment, $R_1$ and $R_2$ are the same and are selected from hexyl, 2-ethylhexyl, t-butoxycarbonyl, and trimethylsilyl.

In one embodiment of any of the above devices, the first electrode comprises indium tin oxide.

In one embodiment of any of the above devices, the optional hole transporting layer is present and comprises poly(3,4-ethylene dioxythiophene:poly(styrenesufonate) (PEDOT:PSS).

In one embodiment of any of the above devices, the electron acceptor is a fullerene electron acceptor. In another embodiment of any of the above devices, the fullerene electron acceptor is [6,6]-phenyl C61-butyric acid methyl ester (PCBM). In another embodiment of any of the above devices, the fullerene electron acceptor is $PC_{71}BM$.

In one embodiment of any of the above devices, the electron acceptor is a vinazene, a perylenetetracaroxylicacid-dianhydrides, or a perylenetetracaroxylicacid-diimide.

In one embodiment of any of the above devices, the electron acceptor is an inorganic acceptor selected from $TiO_2$ (titanium dioxide) and ZnO (zinc oxide). In one embodiment of any of the above devices, the electron acceptor is $TiO_2$ (titanium dioxide). In one embodiment of any of the above devices, the titanium dioxide is anatase. In another embodiment of any of the above devices, the titanium dioxide is rutile. In another embodiment of any of the above devices, the titanium dioxide is amorphous. In one embodiment of any of the above devices, the titanium dioxide is prepared by depositing a sol-gel precursor solution, for example by spincasting or doctorblading, and sintering at a temperature between about 300° C. and 500° C. The precursor can comprise titanium isopropoxide or another titanium alkoxide, or a mixture of titanium alkoxides.

In one embodiment of any of the above devices, the electron donor:electron acceptor ratio is between about 3:7 to about 7:3 parts by mass.

In one embodiment of any of the above devices, the layer comprising a mixture of an electron donor material and an electron acceptor material is about 50 nm to about 150 nm in thickness.

In one embodiment of any of the above devices, the second electrode comprises aluminum, silver or magnesium.

In one embodiment of any of the above devices, the first electrode can comprise Au or a material having a work function higher than the work function of the second electrode. In one embodiment of any of the above devices, the second electrode can comprise an ITO substrate modified using a self-assembled monolayer of 3-aminopropyltrimethoxysiloxane or a material having a work function lower than the work function of the first electrode. In one embodiment of any of the above devices, the first electrode can comprise Au or a material having a work function higher than the work function of the second electrode, and the second electrode can comprise an ITO substrate modified using a self-assembled monolayer of 3-aminopropyltrimethoxysiloxane or a material having a work function lower than the work function of the first electrode.

In one embodiment of any of the above devices, the device exhibits an external quantum efficiency of about 25% or greater between the wavelengths of about 550 nm to about 750 nm.

In one embodiment of any of the above devices, the electron donor:electron acceptor layer is cast from a solution comprising a solvent and the electron donor and the electron acceptor. In various embodiments of any of the above devices, the solvent can comprise chloroform, thiophene, trichloroethylene, or carbon disulfide, or a mixture of any of the foregoing solvents.

In another embodiment, the invention embraces a compound of Formula I.

In another embodiment, the invention embraces an electronic device comprising a compound of Formula I In another embodiment, the invention embraces a compound of Formula I where p=0.

In another embodiment, the invention embraces an electronic device comprising a compound of Formula I where p=0.

In another embodiment, the invention embraces a compound of Formula I where p=1.

In another embodiment, the invention embraces an electronic device comprising a compound of Formula I where p=1.

In another embodiment, the invention embraces a compound of Formula II.

In another embodiment, the invention embraces an electronic device comprising a compound of Formula II.

In another embodiment, the invention embraces a compound of Formula IIa.

In another embodiment, the invention embraces an electronic device comprising a compound of Formula IIa.

In another embodiment, the invention embraces a compound of Formula IIb.

In another embodiment, the invention embraces an electronic device comprising a compound of Formula IIb.

In another embodiment, the invention embraces a compound of Formula IIc.

In another embodiment, the invention embraces an electronic device comprising a compound of Formula IIc.

In another embodiment, the invention embraces compound A:

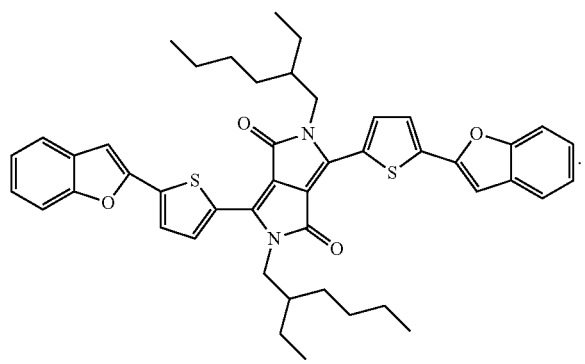

(Compound A)

In another embodiment, the invention embraces an electronic device comprising the compound A.

In another embodiment, the invention embraces 2,5-di-(2-ethylhexyl)-3,6-bis-(5"-n-hexyl-[2,2';5',2" ]terthiophen-5-yl)-pyrrolo[3,4-c]pyrrole-1,4-dione (SMDPPEH):

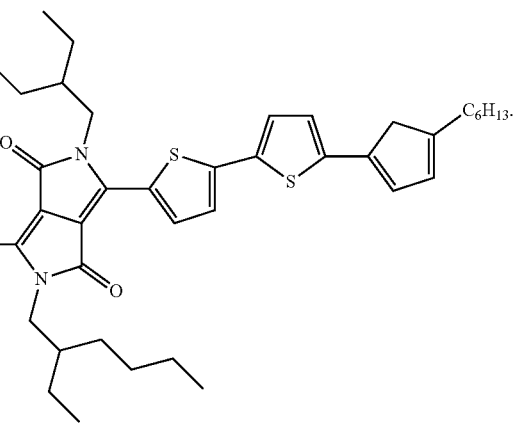

(SMDPPEH)

In another embodiment, the invention embraces an electronic device comprising the compound SMDPPEH.

In another embodiment, the invention embraces compound (4):

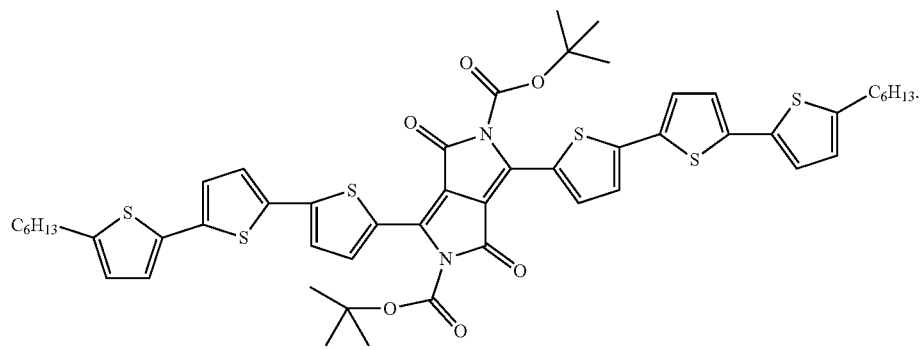

(Compound (4))

In another embodiment, the invention embraces an electronic device comprising the compound 4.

In another embodiment, the invention embraces the compound C6PT1C6.

In another embodiment, the invention embraces an electronic device comprising the compound C6PT1C6.

In another embodiment, the invention embraces the compound C6PT2C6.

In another embodiment, the invention embraces an electronic device comprising the compound C6PT2C6.

In another embodiment, the invention embraces the compound C6PT3C6.

In another embodiment, the invention embraces an electronic device comprising the compound C6PT3C6.

In another embodiment, the invention embraces the compound EHPT2C6.

In another embodiment, the invention embraces an electronic device comprising the compound EHPT2C6.

In another embodiment, the invention embraces the compound C6PT2.

In another embodiment, the invention embraces an electronic device comprising the compound C6PT2.

In another embodiment, the invention embraces the compound 26 of Example 11.

In another embodiment, the invention embraces an electronic device comprising the compound 26 of Example 11.

In another embodiment, the invention embraces the compound 36 of Example 12.

In another embodiment, the invention embraces an electronic device comprising the compound 36 of Example 12.

BRIEF DESCRIPTION OF THE FIGURES

FIG. 17A shows the structure of Material 4. FIG. 17B shows, at left, an energy level diagram comparing HOMO and LUMO values of C4PT2C6 (Material 3) with PCBM, and at right, an energy level diagram comparing HOMO and LUMO values of C4PT2C6 (Material 3) with Material 4.

FIG. 19A, conventional "normal" device. FIG. 19B, inverted device.

DETAILED DESCRIPTION OF THE INVENTION

Figure 1:
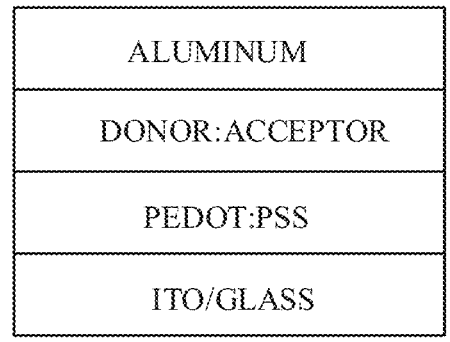
FIG. 1 depicts the architecture of one embodiment of the devices of the invention.

Thiophene-based oligomers have not yet been investigated as donor materials in solar cells, as they do not absorb strongly in the red and near-infrared part of the solar spectrum where most photons are concentrated. Excellent overlap between the absorption of the semiconducting material and the terrestrial solar spectrum is a key requirement for increasing solar cell efficiencies. Another reason why oligothiophenes have not been as readily incorporated into solution-processed devices is due to their low solubility in common organic solvents, as a result of strong intermolecular π-π interactions. To make oligothiophenes that exhibit absorption at long wavelengths, electron donors (e.g., arylamines) and acceptors (e.g., cyano, benzothiadiazole) have been appended onto their backbone. The addition of these groups changes the redox properties of the materials and thereby their absorption properties.

To make oligothiophenes that can be solution-processed, a variety of functional groups have been incorporated as side chains such as charged groups, acyl groups, alkylsulfanyl groups, alkylsilyl groups, ether-based dendrons and straight and branched alkyl moieties. Other approaches include attaching solubilizing groups that can be thermally removed after film deposition and to partially disrupt the strong intermolecular π-π interactions by designing star-shaped or cross-shaped systems.

One potential strategy to make suitable donor materials using oligothiophenes is to incorporate highly absorbing chromophores that are used to make dyes and pigments. One such chromophore is 3,6-diaryl-2,5-dihydro-pyrrolo[3,4-c]pyrrole-1,4-dione, more commonly known as diketopyrrolopyrrole (DPP). DPP-containing materials are bright and strongly fluorescent with exceptional photochemical, mechanical and thermal stability and are therefore used in industrial applications as high performance pigments in paints, plastics, and inks. DPP-based molecular materials, however, are not soluble in most common organic solvents due to the concurrent strong H-bonding and π-π intermolecular interactions in the solid state. Soluble derivatives, however, can be made by attaching solubilizing groups including ionic groups, charged, or neutral long alkyl chains, and organic protecting groups such as t-Boc on the 3,4-positions (i.e., the lactam N atoms) and/or on the 2,5-positions of the DPP moiety. It has been shown that the solid state packing and optical properties of DPP containing materials are dependent on the nature of these substituents. DPP-containing oligothiophenes can self-assemble in the solid state forming unexpected nanostructures. The self-assembly process can be controlled by the number of thiophene rings and the nature of the aliphatic chains attached to N atoms.

Abbreviations and Definitions

Abbreviations used herein are as follows: 5-di-(2-ethylhexyl)-3,6-bis-(5"-n-hexyl-[2,2';5',2" ]terthiophen-5-yl)-pyrrolo[3,4-c]pyrrole-1,4-di one (SMDPPEH); Atomic force microscopy (AFM); cyclic voltametry (CV); diketopyrrolopyrrole (DPP); external quantum efficiency (EQE); indium tin oxide (ITO); organic field-effect transistors (OFETs); poly(3-hexylthiophene) (P3HT); [6,6]-phenyl C61-butyric acid methyl ester (PCBM); poly(3,4-ethylene dioxythiophene:poly(styrenesufonate) (PEDOT:PSS); power conversion efficiency (PCE).

"($C_1$-$C_{12}$)-alkyl" is intended to embrace a saturated linear, branched, cyclic, or a combination of linear and/or branched and/or cyclic hydrocarbon chain(s) and/or ring(s) of 1 to 12 carbon atoms. Examples of "($C_1$-$C_{12}$)-alkyl" include, but are not limited to, methyl, ethyl, n-propyl, isopropyl, cyclopropyl, n-butyl, isobutyl, sec-butyl, t-butyl, cyclobutyl, cyclopropyl-methyl, methyl-cyclopropyl, pentyl, or 2-ethylhexyl, where the point of attachment of the alkyl group to the remainder of the molecule can be at any chemically possible location.

Optoelectronic Device Structure and Fabrication

In one embodiment, the optoelectronic device of the invention comprises the following layers:
a) a first hole-collecting electrode, optionally coated onto a transparent substrate;
b) an optional layer or layers adjacent to the first electrode, such as a hole-transporting layer;
c) a layer comprising a mixture of an electron donor of the general Formula I, II, IIa, IIb, or IIc, and an electron acceptor (donor:acceptor);
d) an optional layer or layers such as hole-blocking, exciton-blocking, or electron-transporting layers; and
e) a second electron-collecting electrode.

Typically, the first electrode can be transparent, allowing light to enter the device, but in some embodiments, the second electrode can be transparent. In some embodiments, both electrodes are transparent.

In another embodiment, the optoelectronic device of the invention comprises the following layers:
a) indium tin oxide (ITO) coated glass (a first electrode),
b) poly(3,4-ethylene dioxythiophene:poly(styrene-sufonate) (PEDOT:PSS),
c) a mixture of electron-donating chromophores of the general Formula I, II, IIa, IIb, or IIc, and an electron-acceptor (donor:acceptor), and
e) a metal electrode (a second electrode);
where layer (d) in the previous embodiment is absent.

In one configuration, where light passes though a transparent first electrode (such as ITO-coated glass), it is absorbed by the donor:acceptor mixture, which results in the separation of electrical charges and migration of the charges to the electrodes, yielding a usable electrical potential (FIG. 1).

The first electrode can be made of materials such as indium-tin oxide, indium-magnesium oxide, cadmium tinoxide, tin oxide, aluminum- or indium-doped zinc oxide, gold, silver, nickel, palladium and platinum. Preferably the first electrode has a high work function (4.3 eV or higher).

The optional layer adjacent to the first electrode is preferably polystyrenesulfonic acid-doped polyethylenedioxythiophene (PEDOT:PSS). Other hole transporting materials, such as polyaniline (with suitable dopants), or N,N'-diphenyl-N,N'-bis(3-methylphenyl)[1,1'-biphenyl]-4,4'-diamine (TPD), can be used.

One method of fabricating the optoelectronic device is as follows: A conductive, transparent substrate is prepared from commercially available indium tin oxide-coated glass and polystyrenesulfonic acid doped polyethylenedioxythiophene using standard procedures. A solution containing a mixture of the donor and acceptor materials is prepared so that the ratio of donor to acceptor is between 1:99 and 99:1 parts by mass; more preferably between 3:7 and 7:3 parts by mass. The overall concentration of the solution may range between 0.1 mg/mL and 100 mg/mL, but is preferably in the range of 10 mg/mL and 30 mg/mL.

The electron acceptor is preferably [6,6]-phenyl C61-butyric acid methyl ester (PCBM), but may be a different fullerene (including, but not limited to, C71-PCBM), a tetracyanoquinodimethane, a vinazene, a perylene tetracarboxylic acid-dianhydride, a perylene tetracarboxylic acid-diimide, an oxadiazole, carbon nanotubes, or any other organic electron acceptor, such as those compounds disclosed in U.S. 2008/0315187.

In other embodiments, the electron acceptor is an inorganic acceptor selected from $TiO_2$ (titanium dioxide) and ZnO (zinc oxide). The titanium dioxide can anatase, rutile, or amorphous. A titanium dioxide layer can be prepared by depositing a sol-gel precursor solution, for example by spincasting or doctorblading, and sintering at a temperature between about 300° C. and 500° C. When an inorganic layer is used, component (c) of the optoelectronic device described above can be comprised of a layer of electron-donating chromophores of the general Formula II and an inorganic electron-acceptor layer. Alternatively, the inorganic material can be dispersed in the electron-donating chromophores to create a single layer. Preparation of $TiO_2$ for use in solar cells is described in Brian O'Regan & Michael Grätzel Nature 353:737 (1991) and Serap Günes et al., 2008 Nanotechnology 19 424009.

Useful solvents include chloroform, toluene, chlorobenzene, methylene dichloride and carbon disulfide. However, the solvent used may be any solvent which dissolves or partially dissolve both donor and acceptor materials and has a non-zero vapor pressure.

The solution of donor and acceptor is deposited onto the transparent conductive substrate by spin casting, ink-jet printing, roll-to-roll coating or any process which yields a continuous film of the donor-acceptor mixture such that the thickness of the film is within the range of 10 to 1000 nm, more preferably between 50 and 150 nm.

In certain embodiments, the layer of the donor and acceptor is cast from a solution comprising a solvent and the electron donor and the electron acceptor. The solvent can comprise chloroform, thiophene, trichloroethylene, or carbon disulfide, or a mixture of any of the foregoing solvents. The solvent can also include processing additives, such as those disclosed in US Patent Application Publication Nos. 2009/0032808, 2008/0315187, or 2009/0108255. For example, 1,8-octanedithiol can be added to the solvent/donor/acceptor mixture in an amount of about 1% or at least about 1%, about 2% or at least about 2%, about 3% or at least about 3%, about 4% or at least about 4%, about 5% or at least about 5%, about 8% or at least about 8%, or about 10% or at least about 10%. The additive, such as 2% 1,8-octanedithiol, can be added to any organic solvent used to cast the layer of donor/acceptor, such as chloroform.

An additional layer or layers of material (i.e., the layer(s) adjacent to the second electrode) may optionally be deposited on top of the donor-acceptor film in order to block holes or excitons, act as an optical buffer, or otherwise benefit the electrical characteristics of the device. 2,9-dimethyl-4,7-diphenyl-1,10-phenanthroline can act as a hole-blocking or exciton-blocking material, while 4,4',4"-tris[N-(3-methylphenyl)-N-phenylamino]triphenylamine and polyethylene dioxythiophene can act as exciton-blocking materials.

Finally, a metal electrode is deposited on top of the structure by thermal evaporation, sputtering, or some other process. The metal is preferably aluminum, silver or magnesium, but may be any metal. In some embodiments, the device is annealed before and/or after evaporation of the metal electrode.

Hole and electron mobilities are important parameters to consider in the fabrication/function of bulk heterojunction solar cells. For optimal device performance, a balance in the mobility of both charge carriers is desirable. Preferably, the electron and hole mobilities are both on the order of $10^{-4}$ cm$^2$/Vs or higher. More preferably, the electron mobilities are on the order of $10^{-3}$ cm$^2$/Vs or higher. In some embodiments, the electron mobilities are on the order of $10^{-4}$ cm$^2$/Vs or higher, and the hole mobilities are between $10^{-8}$ cm$^2$/Vs and $10^{-4}$ cm$^2$/Vs or higher. In other embodiments, the electron mobilities are on the order of $10^{-3}$ cm$^2$/Vs or higher, and the hole mobilities are between $10^{-8}$ cm$^2$/Vs and $10^{-4}$ cm$^2$/Vs or higher.

Optoelectronic devices of the present invention have excellent photovoltaic properties. In some embodiments, the power conversion efficiency (PCE) is at least 0.5%, at least 1.0%, at least 2.0%, at least 3.0%, or at least 4.0%. In some embodiments, the short circuit current density is greater than 3.0 mA/cm$^2$, and preferably greater than 8 mA/cm$^2$. In some embodiments, the open circuit voltage is between 0.6 and 1.0 V or higher. In some embodiments, the device exhibits an external quantum efficiency of approximately 25% or greater between 550-750 nm.

The morphological properties of the donor:acceptor films can be measured using atomic force microscopy or other surface-sensitive techniques. Preferably, the films will have a root-mean-squared surface roughness of less than 1.0 nm, more preferably less than 0.5 nm.

For embodiments of the devices using an inverted device architecture, the first electrode can comprise Au or another material having a work function higher than the work function of the second electrode, while the second electrode can comprise an ITO substrate modified using a self-assembled monolayer of 3-aminopropyltrimethoxysiloxane or another material having a work function lower than the work function of the first electrode.

Electron-Donating Chromophores

Electron-donating chromophores useful in fabricating the devices described herein can be of the formulas I, II, IIa, IIb, or IIc as described herein. For example, the electron-donating chromophores can be of the following general Formula II:

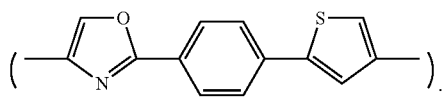
(II)

wherein
X is oxygen or sulfur;
A$_1$ and A$_2$ are selected from substituted and unsubstituted aryl or heteroaryl groups, wherein each individual A$_1$ within the (A$_1$)$_m$ moiety can be independently selected from a substituted or unsubstituted aryl or heteroaryl group, and each individual A$_2$ within the (A$_2$)$_n$ moiety can be independently selected from a substituted and unsubstituted aryl or heteroaryl group;
m is independently selected from 1, 2, 3, 4, 5, 6, 7, 8, or 9;
n is independently selected from 1, 2, 3, 4, 5, 6, 7, 8, or 9;
E$_1$ and E$_2$ are independently selected from a nonentity, H, or a substituted or unsubstituted aryl or heteroaryl group or a C$_1$-C$_{12}$ alkyl group;
and
R$_1$ and R$_2$ are independently selected from H, C$_1$-C$_{12}$ alkyl, and —C(=O)—O—C$_1$-C$_{12}$ alkyl.

In certain embodiments, X is sulfur. In other embodiments, X is oxygen.

In certain embodiments, the one or more substituted or unsubstituted aryl or heteroaryl groups A$_1$ and A$_2$ are independently selected from the group consisting of thiophene, bithiophene, terthiophene, thienothiophene, dithienothiophene, benzothiophene, isobenzothiophene, benzodithiophene, cyclopentadithiophene, indole, benzene, naphthalene, anthracene, indene, fluorene, pyrene, azulene, furan, pyrrole, pyridine, oxazole, thiazole, thiazine, pyrimidine, pyrazine, imidazole, benzoxazole, benzoxadiazole, benzothiazole, benzimidazole, benzofuran, isobenzofuran, thiadiazole, pyridothiadiazole, and carbazole. Each individual A$_1$ group in an (A$_1$)$_m$ chain, and each individual A$_2$ in an (A$_2$)$_n$ chain, can be independently selected. Thus, for example, when m=3, the (A$_1$)$_3$ chain can be:

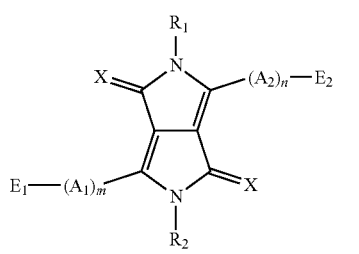

The aryl or heteroaryl groups are directly connected to each other at any valence where a bond to another group is chemically possible, and in a manner so as to allow conjugation of the delocalized electrons between the aryl or heteroaryl groups and any other aryl or heteroaryl groups to which they are bonded, such as the diketopyrrolopyrrole core moieties.

In certain embodiments, the moieties E$_1$ and E$_2$ are independently selected from n-hexyl (—C$_6$H$_{13}$) and benzofuran

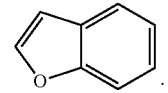

In other embodiments, when E$_1$ and/or E$_2$ is benzofuran, the benzofuran moiety is attached to the remainder of the molecule at the 2-position of the benzofuran ring.

In certain embodiments, m=n=3. In other embodiments, m=n=2. In other embodiments, m=n=1.

In certain embodiments, the moieties R$_1$ and R$_2$ are independently selected from the group consisting of hexyl, 2-ethylhexyl, t-butoxycarbonyl, and trimethylsilyl. In another embodiment, the same group selected for R$_1$ is also used for the R$_2$ group.

In certain embodiments, the electron-donating chromophore comprises compound A, which has the following formula:

(Compound A)

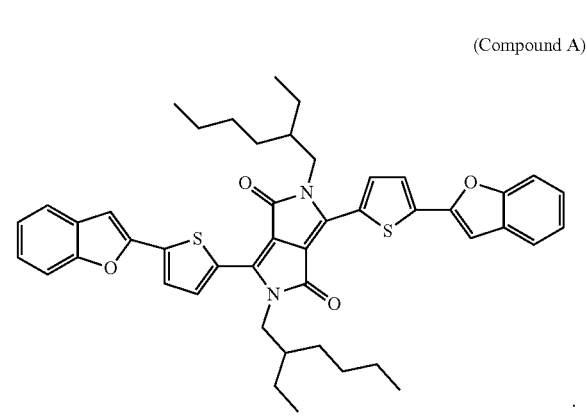 [SMILES: CCCCC(CC)CN1C(=O)C2=C(c3ccc(-c4cc5ccccc5o4)s3)N(CC(CC)CCCC)C(=O)C2=C1c1ccc(-c2cc3ccccc3o2)s1]

In other embodiments, the electron-donating chromophore comprises 2,5-di-(2-ethylhexyl)-3,6-bis-(5"-n-hexyl-[2,2';5',2"]terthiophen-5-yl)-pyrrolo[3,4-c]pyrrole-1,4-dione (SMDPPEH), which has the following formula:

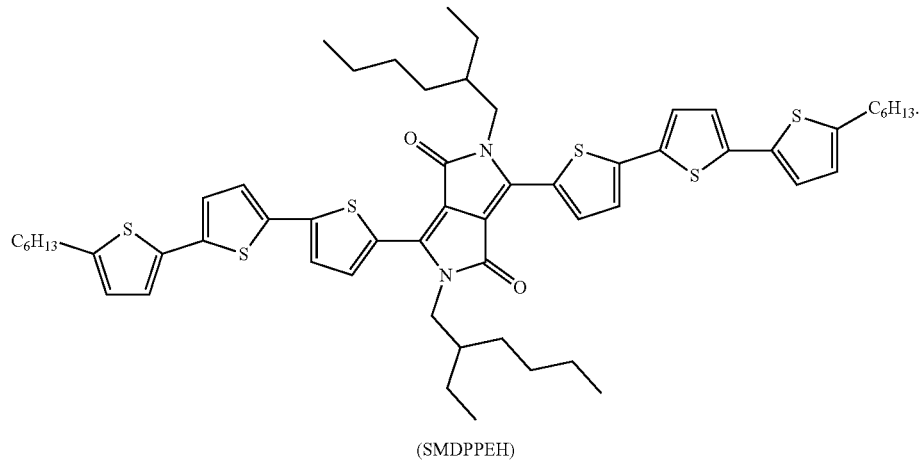

(SMDPPEH)

In other embodiments, the electron-donating chromophore comprises compound (4), which has the following formula:

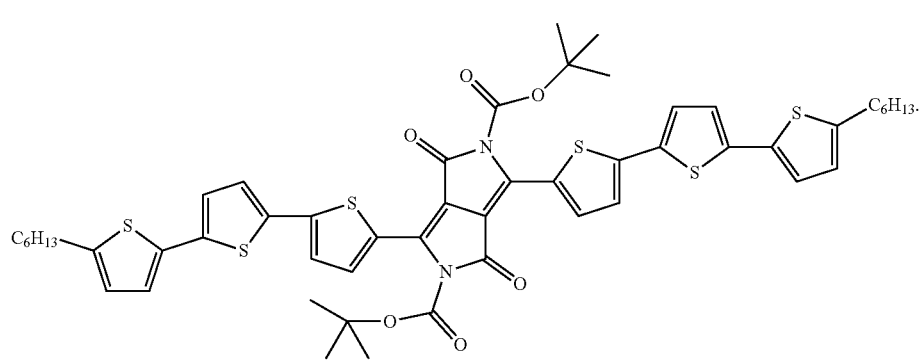

(Compound (4))

In other embodiments, the electron-donating chromophore comprises C6PT1C6. In other embodiments, the electron-donating chromophore comprises C6PT2C6. In other embodiments, the electron-donating chromophore comprises C6PT3C6. In other embodiments, the electron-donating chromophore comprises EHPT2C6. In other embodiments, the electron-donating chromophore comprises C6PT2. The structures of C6PT1C6, C6PT2C6, C6PT3C6, EHPT2C6, and C6PT2 are described in Example 10 below. In other embodiments, the electron-donating chromophore comprises compound 26 of Example 11. In other embodiments, the electron-donating chromophore comprises compound 36 of Example 12.

Excellent solubility and high thermal stability of the electron-donating chromophores leads to a more robust optoelectronic device. In some embodiments, the electron-donating chromophore has a solubility of >20 mg/mL in chloroform, chlorobenzene or toluene. In some embodiments, the electron-donating chromophore is thermally stable up to 250° C.

Conversion of Diketopyrrolopyrroles to Dithioketopyrrolopyrroles

Syntheses of diketopyrrolopyrroles are presented in the Examples below. Once the diketopyrrolopyrroles have been prepared, reaction with Lawesson's reagent or other thiation agents converts the diketopyrrolopyrroles into dithioketopyrrolopyrroles. Exemplary protocols are provided in Closs and Gompper, Angew. Chem. Int. Ed. Engl. 26(6):552 (1987), and in Thomsen et al., Organic Syntheses, Coll. Vol. 7, p. 372 (1990); Vol. 62, p. 158 (1984).

Use of Diketopyrrolopyrroles and Dithioketopyrrolopyrroles as Electron Acceptors While the diketopyrrolopyrroles and dithioketopyrrolopyrroles described herein are described primarily as electron donors, compounds of the formula I, II, IIa, IIb, and IIc can also be used as electron acceptor materials. For use as an electron acceptor, the diketopyrrolopyrrole or dithioketopyrrolopyrrole should have a relatively low LUMO level, about 0.3 eV or more lower than the LUMO of the electron donor it will be used with. It should also have a reasonably high electron mobility to serve as an acceptor, such as an electron mobility about or on the order of $10^{-6}$ cm$^2$/Vs or higher, preferably about or on the order of $10^{-4}$ cm$^2$/Vs or higher, more preferably about or on the order of $10^{-3}$ cm$^2$/Vs or higher. Lowering the LUMO and increasing electron mobility can be accomplished by using electron withdrawing groups (such as fluoro, chloro, cyano, trifluoromethyl, etc.) attached to the conjugated system, or by using electron deficient aryl groups (such as pyridine or benzothiadiazole); see Prashant Sonar, J. Mater. Chem., 2010, DOI: 10.1039/b924404b.

Inverted Device Architecture

In some cases, it can be advantageous to have the substrate act as a cathode, while the top electrode acts as the anode. For example, using the substrate to collect electrons can allow a stable, high work function metal such as gold or nickel to be used as the top electrode. This can be achieved by modifying the work function of the substrate or using an n-type substrate.

Figure 19A:
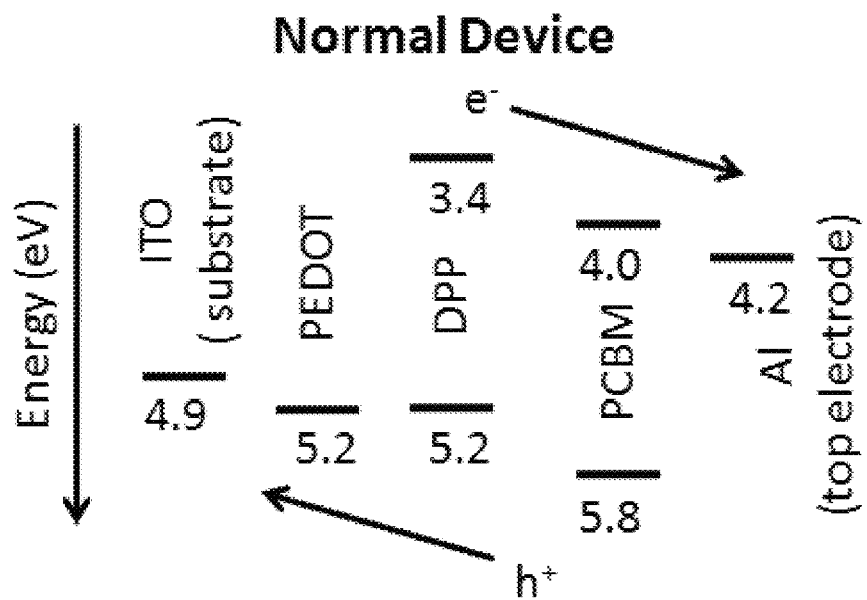
FIG. 19A and FIG. 19B show energy level diagrams for devices of the invention.
Figure 19B:
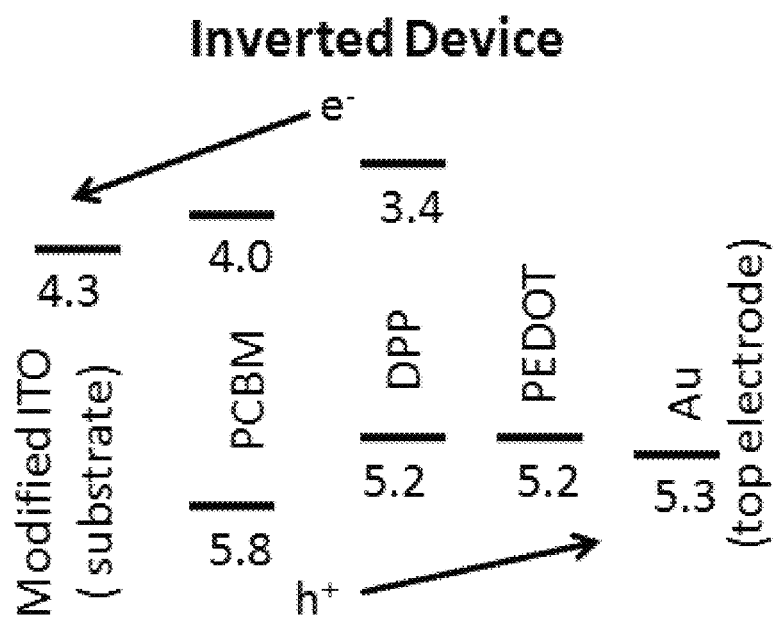

FIG. 19A shows an energy level diagram for a normal device, while FIG. 19B shows an energy level diagram for an inverted device. In the normal device, photo-generated holes travel to an ITO substrate while photo-generated electrons travel to a top electrode consisting of a relatively low work-function metal such as Al. In the inverted devices, the charge carriers flow in the opposite direction, where electrons travel to the substrate while holes travel to the top electrode and are collected by a relatively high work function metal such as Au. This configuration has the advantage that a relatively stable metal is used as the top electrode, which can increase the lifetime of the device. Such inverted devices are shown in Example 16 below.

EXAMPLES

Example 1: Synthesis of Compound 4

Compound 4 was synthesized according to the following synthetic procedure:

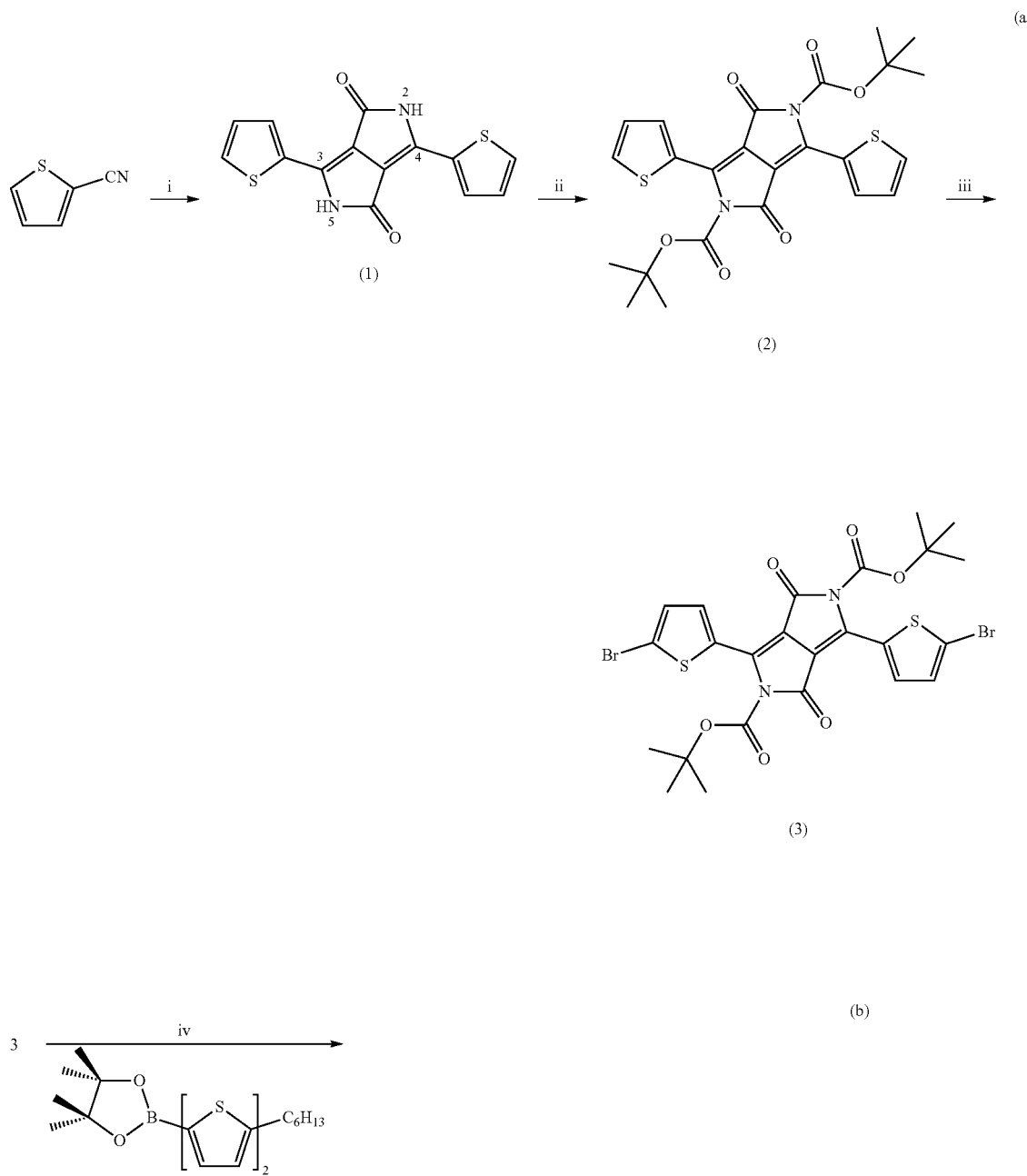

-continued

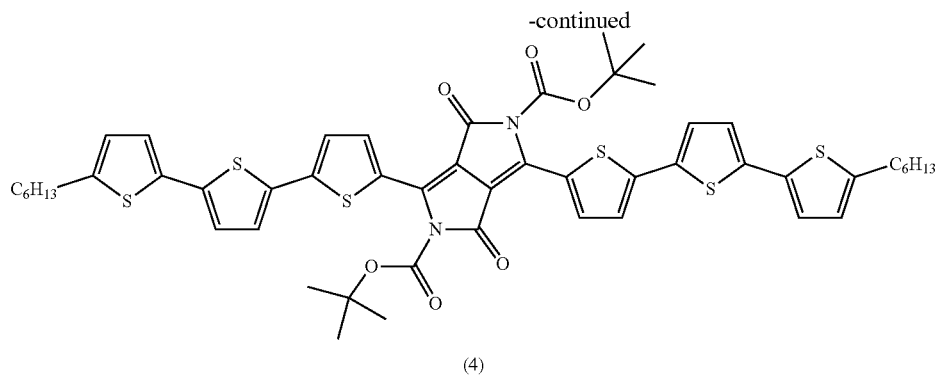

(4)

i) 0.5 eq. di-n-butylsuccinate, t-BuOK, t-amyl alcohol 120° C., under Ar, 24 hrs; ii) 5.0 eq di-t-Boc, 0.1 eq NEt$_3$, under Ar, 24 hours; iii) 2.05 eq. N-bromosuccinimide, CHCl$_3$, dark, under Ar, 48 hrs; iv) Pd$_2$(dba)$_3$, KHP (t-Bu)$_3$, toluene/DME (1:1), 2.0 molar K$_3$PO$_4$, 90° C., under Ar, 16 hrs.

Part A. The parent 2,5-dihydro-1,4-dioxo-3,6-dithienylpyrrolo[3,4-c]-pyrrole (1) was prepared in 55% yield following a previously reported procedure which comprises the reaction of 2-thiophenecarbonitrile with 0.5 eq of di-n-butyl succinate ester and an excess of potassium t-butoxide using 2-methyl-2-butanol as solvent. See Tamayo et al., J. Phys. Chem. C 112:15543 (2008) and references therein.

Part B. Compound (2) was synthesized according to a modified literature procedure. Zambounis et al. *Nature* 1997, 388, 131. In a three-necked, oven-dried 100 mL round bottom flask, 1 (3.0 g, 10.0 mmol) was dissolved in 150 mL of anhydrous tetrahydrofuran (THF) and the resulting solution was purged with argon for ten minutes. Dimethylaminopyridine (DMAP 3.0 g, 25 mmol) was added and the reaction mixture was stirred for 15 minutes under argon at room temperature. Di-tert-butyl-dicarbonate (11.0 g, 50 mmol) was then added and the mixture was stirred for 24 hours, after which the solvent was removed in vacuo to obtain a brownish red solid. Petroleum ether (250 mL) was poured into the crude product and the resulting suspension was stirred for 1 hour. The solids were then collected by vacuum filtration and further washed with several portions of petroleum ether. The crude product was purified by flash chromatography using chloroform as eluent and the solvent was removed in vacuo giving 4.0 g of pure product as a shiny crystalline red powder. (yield: 4.0 g, 80.2%).

Analysis: NMR (400 MHz, CDCl$_3$, ppm) δ=8.28 (dd, J=4.0 Hz, 1.2 Hz, 2H), 7.68 (dd, J=4.0 Hz, 1.2 Hz, 2H), 7.19 (dd, J=8.0 Hz, 4.0 Hz, 4.0 Hz, 2H), 1.60 (s, 18H). MS (ESI-TOF): Calculated for C$_{24}$H$_{24}$N$_2$O$_6$S$_2$: 500.11. Found: 501 (M$^+$+H). CHN Analysis: Calcd. C, 57.58; H, 4.83; N, 5.60. Found: C, 57.23; H, 4.88; N, 5.73.

Part C. Compound (3) was synthesized according to a modified literature procedure. Zhang et al. *J. Mater. Chem.* 2006, 16, 736. In a three-necked, oven-dried 150 mL round bottom flask covered with aluminum foil, 2 (2.623 g, 4.0 mmol) was dissolved in 150 mL of anhydrous CHCl$_3$, covered with aluminum foil and stirred at room temperature under argon for 15 minutes. N-bromosuccinimide (1.500 g, 8.4 mmol) was then added and the reaction mixture was kept at room temperature and stirred for 48 hours. The reaction mixture was poured into 400 mL of methanol and the resulting suspension was stirred at room temperature for 15 minutes. The solid was then collected by vacuum filtration and was washed with several portions of hot distilled water and hot methanol to obtain 1.98 g of pure product as shiny dark purple powder (yield: 1.98 g, 60.2%).

Analysis: $^1$H NMR (400 MHz, CDCl$_3$, ppm) δ=8.08 (d, J=4.0 Hz, 2H), 7.15 (d, J=4.0 Hz, 2H), 1.63 (s, 18H). MS (ESI-TOF): Calculated for C$_{30}$H$_{38}$Br$_2$N$_2$O$_2$S$_2$: 655.93. Found 656 (M$^+$+H). CHN Analysis: Calcd. C, 43.78; H, 3.37; N, 4.25. Found: C, 43.67; H, 3.30; N, 4.21.

Part D. Compound (4) was synthesized according to a modified literature procedure. Zrig et al. *J. Org. Chem.* 2007, 72, 5855. In an three-necked, oven-dried 100 mL round bottom flask, 3 (0.6825 g, 1.00 mmol) and 5'-hexyl-2,2'-bisthiophene boronic acid pinacol ester (2.25 mmol) were dissolved in 15 mL of anhydrous toluene and 20 ml of anhydrous 1,2-dimethoxyethane and the resulting solution degassed for ten minutes.

Tris(dibenzylideneacetone)dipalladium(0) (14 mg, 0.0153 mmol), and tri-tert-butylphosphonium tetrafluoroborate (18 mg, 0.0620 mmol) were then added and the mixture degassed for another five minutes. A degassed 2.0 molar solution of potassium phosphate (5 mL) was then added and the reaction mixture stirred and heated to 90° C. under argon overnight. The reaction mixture was allowed to cool down to room temperature after which it was poured into 400 mL of methanol and was then stirred for 30 minutes. The precipitated solid was then collected by vacuum filtration and was washed with several portions of distilled water, methanol, isopropanol and petroleum ether. The crude product was purified by flash chromatography using chloroform as eluent and the solvent removed in vacuo giving a shiny green crystalline powder (yield: 0.65 g, 65.0%).

Analysis: $^1$H NMR (400 MHz, CDCl$_3$, ppm) δ=8.28 (d, J=4.0 Hz, 2H), 7.21 (dd, J=4.0 Hz, 4H), 7.04 (dd, J=4.0 Hz, 4H), 6.71 (d, J=4.0 Hz, 2H), 2.81 (t, J=8.0 Hz, 4H), 1.68-1.72 (m, 4H), 1.66 (s, 18H), 1.22-1.46 (m, 10), 0.90 (t, J=7.2 Hz, 6H). MS (FAB): Calculated for C$_{52}$H$_{56}$N$_2$O$_6$S$_6$: 996.25. Found 996. MS (FAB): Calculated for C$_{52}$H$_{56}$N$_2$O$_6$S$_6$: 996.25. Found 996. Calcd. C, 62.62; H, 5.66; N, 2.81. Found: C, 62.30; H, 5.64; N, 2.85.

Example 2. Device Fabrication

Indium tin oxide (ITO)-coated glass substrates (Thin Film Devices) were cleaned with detergent and de-ionized water after which the substrates were sonicated for 10 minutes in soap solution, de-ionized water, acetone and isopropanol. The ITO substrates were then treated in a UV ozone cleaner for 30 minutes followed by spin coating a solution of poly(3,4-ethylene dioxythiophene:poly(styrenesulfonate) (PEDOT:PSS, Baytron P) (5000 rpm for 40 seconds). The PEDOT:PSS film was dried at 140° C. inside a glovebox for 15 minutes which yielded a film ~60 nm thick. A 2% (w/v) blend solution of compound (4) and PCBM (Nano-C, USA) in chloroform ($CHCl_3$) was filtered through a 0.45 μm poly(tetrafluoroethylene) (PTFE) filter and spin coated at 1500 rpm for 60 seconds on top of the PEDOT:PSS layer. Subsequently, aluminum (1200 Å) was thermally evaporated at a pressure of $1 \times 10^{-7}$ Torr at room temperature using a shadow mask. Illumination was done through the glass slide using light from 150 W Newport-Oriel AM 1.5G light source operating at 100 mW/cm². Mobility measurements were done using the following diode structures: ITO/PEDOT:PSS/active material/Au for holes and Al/active material/Al for electrons. Au (1000 Å) and Al (500 Å) electrodes were thermally evaporated at a pressure of $1 \times 10^{-7}$ Torr at room temperature using a shadow mask (Angstrom Engineering, Inc.). The active layer thicknesses in all devices obtained by AFM were approximately 100-110 nm. All fabrications and characterization were performed under nitrogen.

Example 3. Electrochemical and Photophysical Characterization of (4)

Cyclic voltammetry (CV) was performed using an EG&G potentiostat/galvanostat model 283. Anhydrous dichloromethane was used as the solvent under an inert atmosphere, and 0.1 M solution tetra-butyl ammonium hexafluorophosphate was used as the supporting electrolyte. A glassy carbon rod was used as the working electrode, a platinum wire was used as the counter electrode, and a silver wire was used as a pseudo reference electrode. The redox potentials are obtained by taking the average of anodic and cathodic waves and are reported relative to a ferrocenium/ferrocene ($Cp_2Fe^+/Cp_2Fe$, 0.475 V versus SCE in dichloromethane) redox couple used as an internal reference. UV-visible absorption spectra were recorded on a Shimadzu UV-2401 PC dual beam spectrometer. Steady-state fluorescence experiments at room temperature were performed using a PT1 (Lawrenceville, NJ) Quantum Master fluorimeter equipped with a Xenon lamp excitation source and a Hamamatsu (Japan) 928 PMT using 90° angle detection for solution samples.

The CV of (4) exhibits one reversible oxidation process and one reduction process at 0.43 V and at −1.61 V, respectively. Based on the measured oxidation and reduction potentials, (4) has HOMO and LUMO energy levels of −5.03 eV and −3.0 eV, respectively. These values are within the required electronic levels for BHJ solar cells when PCBM is used as the electron acceptor.

Figure 2:
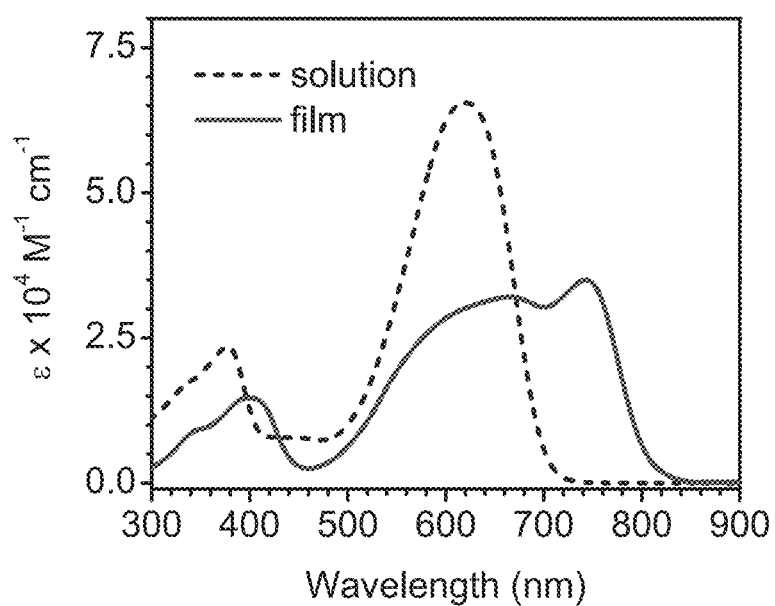
FIG. 2 depicts the solution and film absorption of compound (4) in solution and on a quartz substrate.

FIG. 2 shows a plot of the solution and film absorption spectra of (4) in chloroform and on quartz, respectively. The high degree of conjugation between the electron donating thiophene rings and the electron accepting DPP moiety, is demonstrated in solution where the compound shows a broad and featureless absorption band with a $\lambda_{max}$=616 nm corresponding to the intramolecular charge transfer (ICT) transition. This absorption band is bathochromically shifted relative to the π-π* transitions in water soluble sexithiophenes, which occur between 400-500 nm in dilute solutions. The film absorption of pure (4) on a quartz substrate spin-coated from a 2% (w/v) chloroform solution is significantly broadened and exhibits two absorption bands centered at 660 nm and 742 nm. These peaks are 44 nm and 126 nm red-shifted from the main absorption band observed in solution, respectively. The first absorption band is quite broad and is likely due to the same charge transfer band seen in solution and the shift in the peak maximum is due to aggregation in the solid state. The second sharp absorption band is possibly due to ordered aggregation, which is confirmed by AFM (see Example 4). The optical gap of the compound is reduced from 1.72 eV to 1.5 eV based on solution to solid state absorption. One reason for this significant change might be the coplanarization of the thiophene rings due to molecular ordering, similar to what has been observed for spun cast films of thiophene oligomers and polymers.

Example 4. Film Morphology of (4)

Tapping mode atomic force microscopy (AFM) topographic and phase images of pure (4) and the blends were obtained using the Multi-Mode microscope and the controller NanoScope IIIa (Veeco Inc.). Images were collected in air using silicon probes with a typical spring constant of 1-5 nN/m and a resonant frequency of 75 kHz (Budget Sensors).

Figure 3:
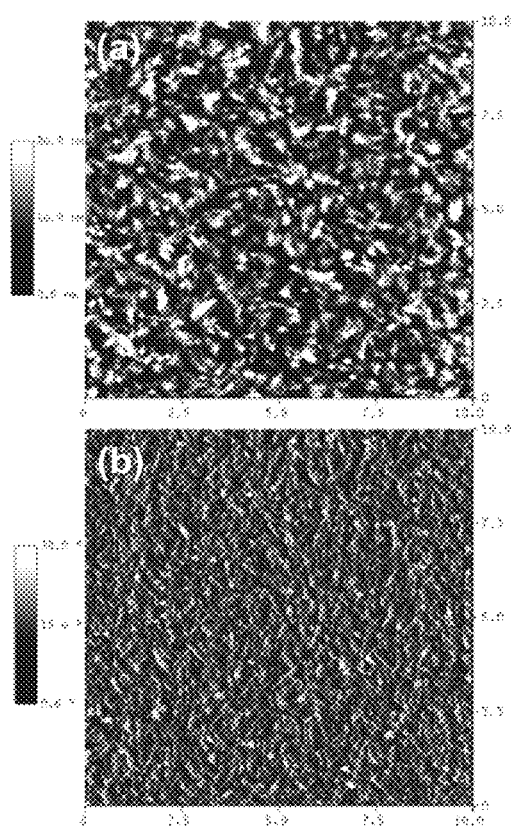
FIG. 3 depicts tapping mode AFM (10 μm×10 μm) topographical (a) and phase (b) images of pristine film of (4) spin-coated from chloroform on quartz substrate.

FIG. 3 shows the topographic and phase images of (4) spin-coated from $CHCl_3$ onto a quartz substrate. Fiber-like structures are observed in the topographic and phase images indicating a high degree of molecular order. The hole mobility, $\mu_h$, of (4) was measured to be $3 \times 10^{-6}$ cm²/V·s using the ITO/(4)/Au diode configuration. This value is comparable with hole mobilities measured for small molecules (i.e. $\sim 10^{-6}$ cm²/V·s, for triphenylamine derivatives) and conjugated polymers that are used as electron donors for solar cells (i.e. $\sim 10^{-5}$ cm²/V·s for P3HT, as determined by using the SCLC model). However, it is known that hole mobilities change when mixed with PCBM as both hole and electron mobilities depend on factors such as blend ratio and film morphology.

Example 5. Photovoltaic Properties and Film Morphology of (4):PCBM Blend

Figure 4:
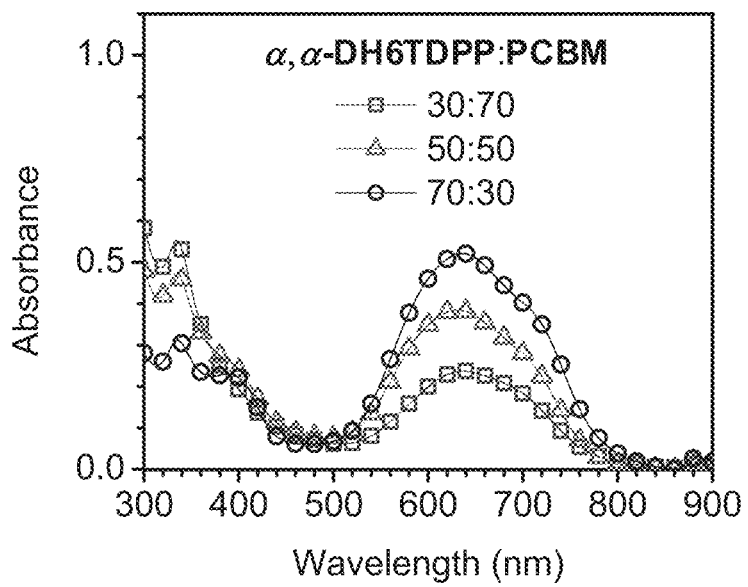
FIG. 4 depicts absorption of blends containing compound (4) and PCBM in various ratios, spin-coated on quartz from chloroform solutions with a 2% (w/v) total concentration.

To demonstrate the potential of (4) as an electron donor in photovoltaic devices, BHJ devices were fabricated by spin-coating from 2% (w/v) chloroform solutions comprising a mixture of (4) and PCBM in different blend ratios (30:70, 50:50, and 70:30). FIG. 4 shows the film absorption spectra of the various blends. It can be seen that as the amount of PCBM decreases, the peak at 300 nm assigned to PCBM decreases in intensity with the simultaneous appearance of a shoulder band around 740 nm that was previously assigned to the aggregation of (4). However, the absorption band is not as intense as the one seen in the pure film probably due to disruption of the solid state packing of (4) with the addition of PCBM, as previously observed for conjugated polymers where PCBM inhibits crystallization. Melzer et al. *Adv. Funct. Mater.* 2004, 14, 865.

Figure 5:
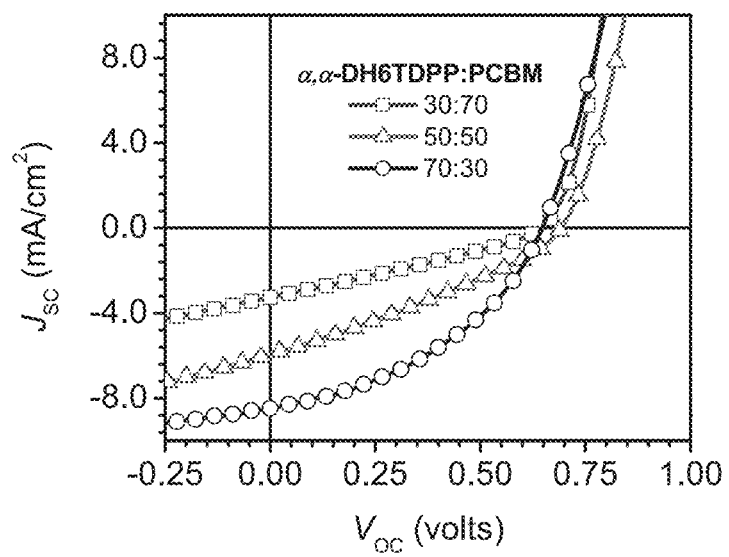
FIG. 5 depicts J-V characteristics of organic solar cells prepared from compound (4):PCBM blends: 30:70 (squares), 50:50 (triangles) and 70:30 (circles) under AM 1.5 irradiation (100 mW/cm$^2$).
Figure 6:
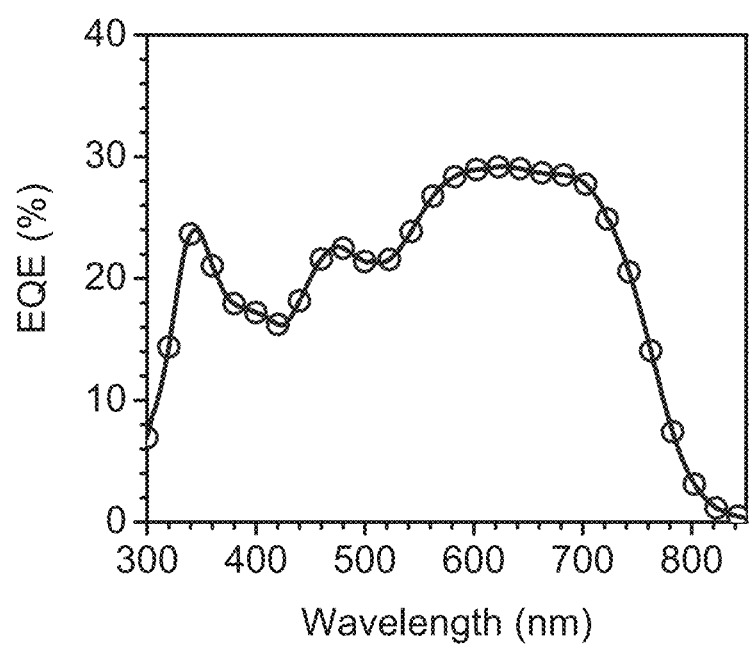
FIG. 6 depicts external quantum efficiency (EQE) curve for a device using 70:30 blend of (4):PCBM.

FIG. 5 shows the current density versus voltage curves for devices using 30:70, 50:50 and 70:30 blend ratios under AM 1.5 simulated solar illumination at an intensity of 100 mW/cm². A summary of photovoltaic properties is given in Table 1. The best devices based on 30:70 blend ratios delivered a short circuit current density of 3.13 mA/cm² and an open circuit voltage of 0.63 V. Combined with a fill factor of 0.27, the device gave a power conversion efficiency of 0.53%. The short circuit current density increased significantly when the donor-acceptor blend ratio was changed to 50:50 and 70:30. The open circuit voltage, however, remained relatively constant. A short circuit current density of 8.42 mA/cm² and an open circuit voltage of 0.67 V were obtained from the device employing a 70:30 blend ratio. The power conversion efficiency of the device was calculated to be 2.33% with a fill factor of 0.45. This power conversion efficiency value is the highest among solution-processed small molecule-based BHJ solar cells reported in the literature. This device exhibits external quantum efficiencies close to 25% at 343 nm and close to 30% between 550-750 nm (see FIG. 6), the former being mainly due to the PCBM acceptor while the latter is attributed to the donor material.

TABLE 1

Effect of (4) and PCBM blend ratio on the device characteristics.

| Ratio (4):PCBM | $V_{OC}$ (volts) | $J_{SC}$ (mA/cm²) | η (%) | FF |
|---|---|---|---|---|
| 30:70 | 0.63 | 3.13 | 0.53 | 0.27 |
| 50:50 | 0.65 | 5.42 | 1.20 | 0.34 |
| 70:30 | 0.67 | 8.42 | 2.33 | 0.45 |

Figure 7:
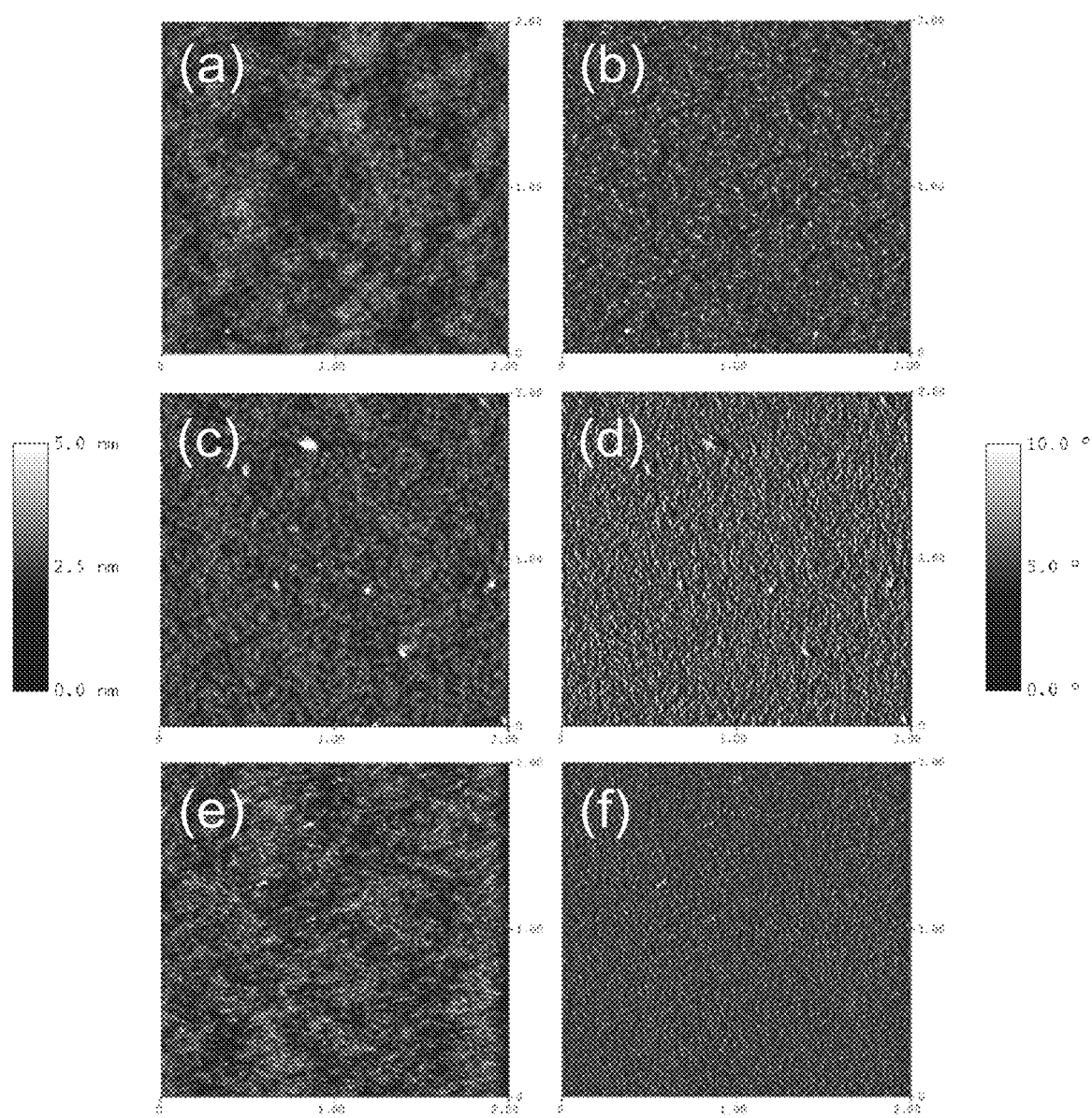
FIG. 7 depicts AFM topography (a, c and e) and phase images (b, d and f) of actual devices fabricated from films spun cast from (4):PCBM blends with the following ratios 30:70 (a,b), 50:50 (c,d) and 70:30 (e,f).

AFM topographical and phase images collected in the areas between the Al electrodes of the devices are shown in FIG. 7. Overall, there is no micron-sized phase segregation occurred for the three donor:acceptor ratios used. The 30:70 (4):PCBM film surface is very smooth, with a RMS ~0.45 nm. Increasing the donor:acceptor ratio leads to increased surface roughness (~1.0 nm for 70:30 (4):PCBM film). Some degrees of intermolecular interactions of (4) is maintained in the blended film as evidenced by the fiber-like structures in the topographic and phase images (FIG. 7). The devices fabricated from the 30:70 (FIG. 7 a,b), 50:50 (FIG. 7 b,c), and 70:30 (FIG. 7 e,f) blend ratios show minimal or no visible phase separation, but at a higher donor ratio (70:30), nanostructures can be observed from the topographic image (FIG. 7 e,f). This continuous film morphology with the absence of large phase segregation combined with the increase in absorption at longer wavelengths brought by the increase in donor concentration can account for the increase in device performance.

The hole and electron mobilities were measured for 30:30, 50:50 and 70:30 blend ratios using the hole-only and electron-only diode structures. The mobility values were extracted using the SCLC model. Blom et al. *Phys. Rev. B* 1997, 55, 656. It was found that the electron mobilities do not change significantly as the donor concentration increases. The electron mobilitites are 3, 5 and 6×10⁻⁴ cm²/Vs for 30%, 50% and 70% acceptor contents, respectively. In contrast, the hole mobilities exhibited a more pronounced dependence on the concentration of donor material, increasing by more than an order of magnitude from 2×10⁻⁸ to 5×10⁻⁷ cm²/Vs as the concentration of donor material was decreased from 30% to 70%. It is evident that the charge transport properties are more balanced at high donor concentration, resulting in improved device efficiency. From these results, the electron and hole mobilities are different by three orders of magnitudes. Thus, higher efficiency can be achieved if one can further improve the hole mobility.

The optimal donor concentration in this system is much larger than optimal blend ratios previously observed for solution-processed conjugated polymer/PCBM mixtures. This may be because large concentrations of (4) do not disrupt the percolation of the PCBM phase as polymers do. In this system, a high donor concentration is not seen to adversely affect device properties as with polymers, but allows for enhanced light absorption by the chromophore and increased order in film morphology, in addition to balancing charge transport properties.

Figure 8:
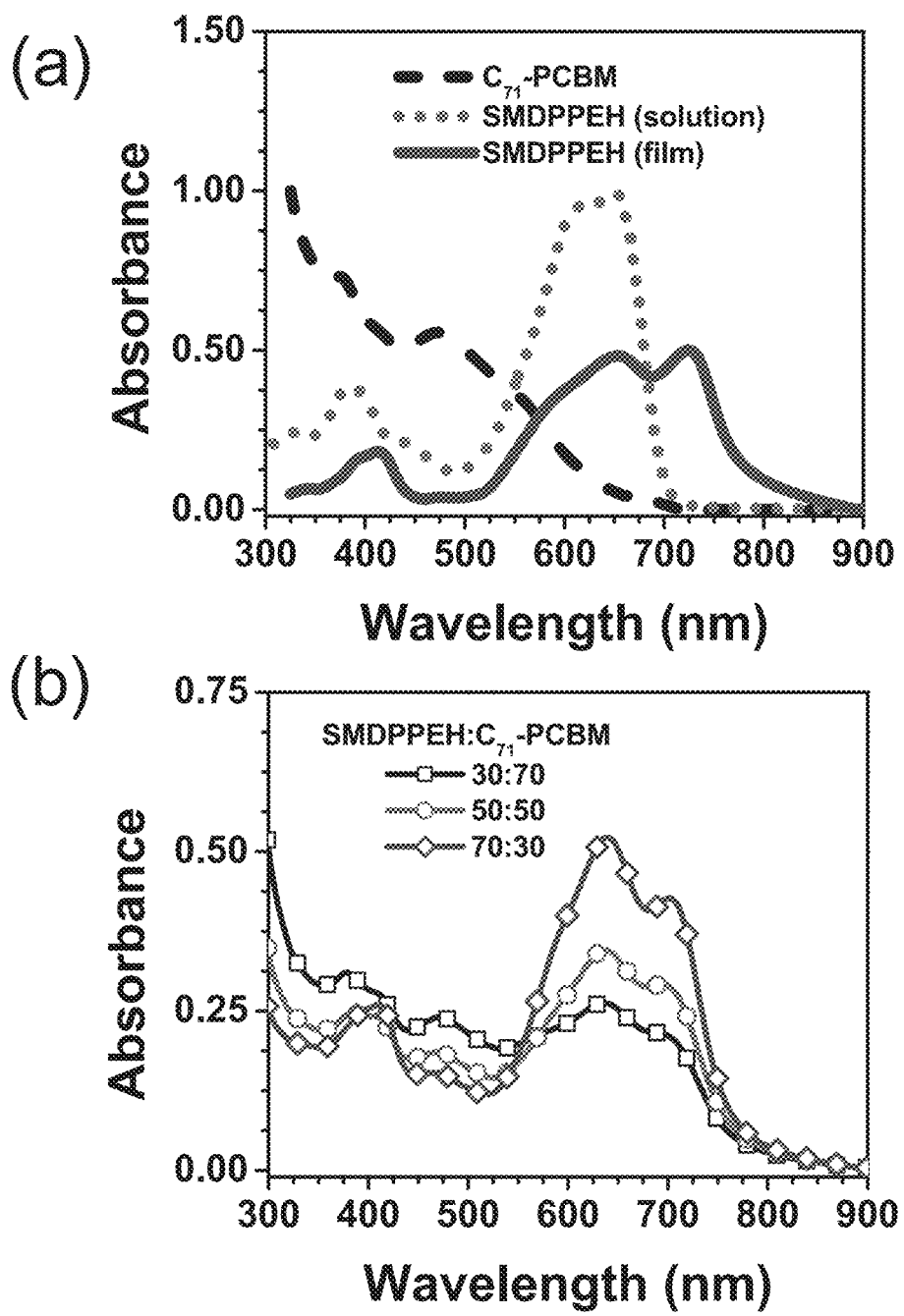
FIG. 8 depicts a) optical absorption spectra for SMDPPEH in a chloroform solution (dotted line) and in a thin film (solid line) and C$_{71}$-PCBM film (dashed line); (b) Optical absorption spectra of SMDPPEH:C$_{71}$-PCBM at various ratios: 30:70 (open squares), 50:50 (open circles), and 70:30 (open diamonds).

Example 6. Electrochemical and Photophysical Characterization of SMDPPEH and SMDPPEH:PCBM Blend The optical properties of SMDPPEH in solution (dotted line) and in film (solid line) together with that of $C_{71}$-PCBM (dashed line) are shown in FIG. 8(a). The absorption of SMDPPEH exhibits a broad and intense intramolecular charge transfer band in solution that onsets around 700 nm with a peak maximum ca. 660 nm (ε=~10⁵ L/mol–cm). The corresponding film contains an even broader absorption region that extends to 800 nm. The 720 nm band in the film has been observed previously in highly ordered oligothiophene-DPP systems and assigned to strong intermolecular interactions. When mixed with the fullerene acceptor, which has an absorption band centered at 480 nm, the resulting blend film gives a very good spectral coverage. The hole mobility of a pure SMDPPEH film is ~1.0×10⁻⁴ cm²/V·s based on the SCLC model, which is two orders of magnitude higher than that of the t-Boc-derivative. (Tamayo et al., *J. Phys. Chem. C* 112:15543 (2008)). The hole mobility of SMDPPEH is comparable to that of (P3HT).

FIG. 8(b) shows the film absorption spectra of the various blend ratios. The thicknesses of the films are around 80 nm irrespective of the blend ratio. It can be seen that as the amount of $C_{71}$-PCBM decreases, the absorption peak at 480 nm assigned to $C_{71}$-PCBM decreases with the concomitant increase in the absorption bands at 620 nm and 710 nm, which are assigned to SMDPPEH. These DPP absorption bands are blue-shifted by 20 nm and 30 nm, respectively, compared to the absorption peaks in the pure film probably due to disruption of the solid state packing of SMDPPEH by the addition of $C_{71}$-PCBM.

Figure 9:
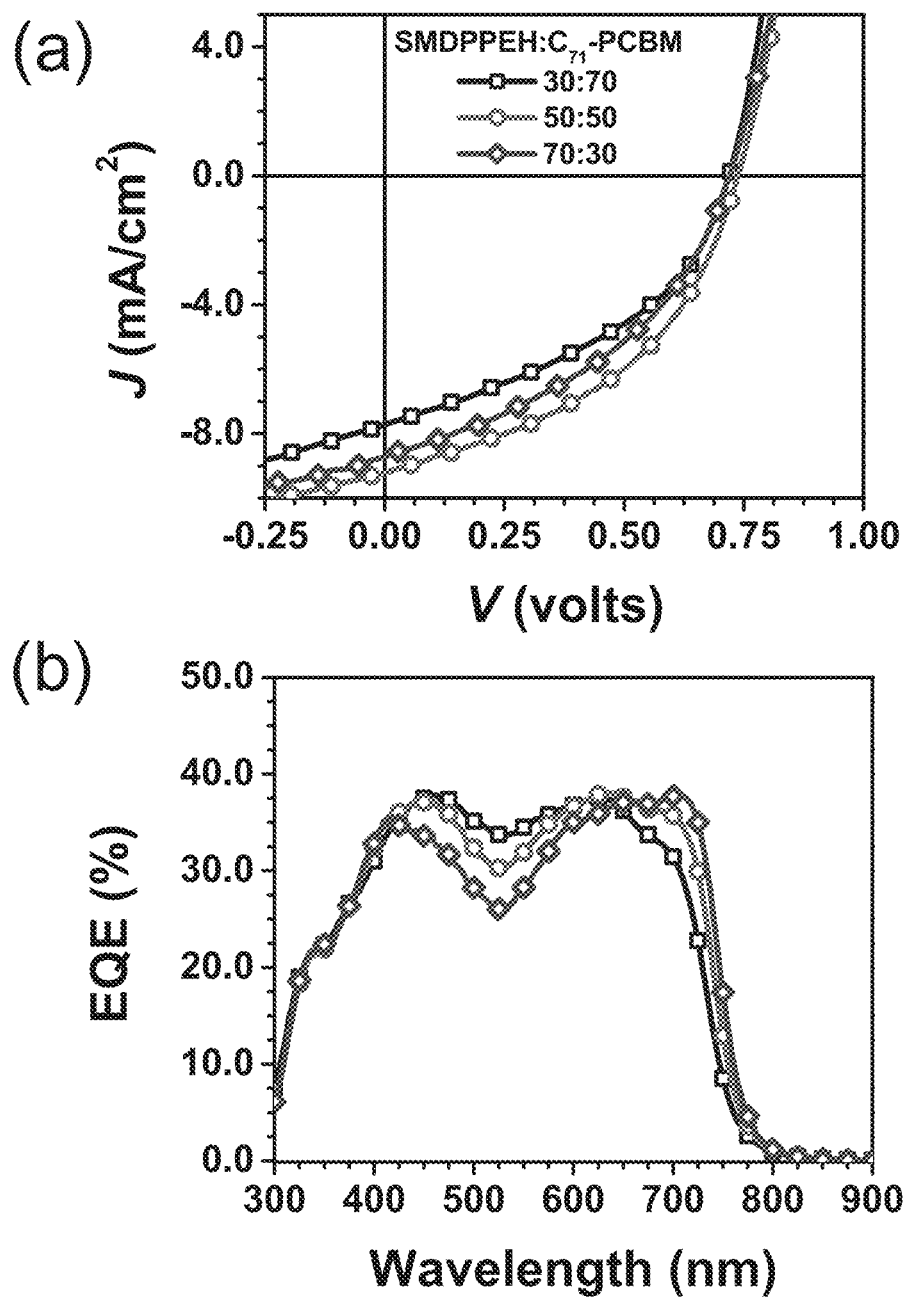
FIG. 9 depicts (a) current density-voltage characteristics and (b) EQE of BHJ solar cells as a function of SMDPPEH:C$_{71}$-PCBM donor-acceptor ratio: 30:70 (open squares), 50:50 (open circles), and 70:30 (open diamonds).

FIG. 9(a) shows the current density versus voltage (J-V) characteristics for devices using 30:70, 50:50, and 70:30 blend ratios of SMDPPEH:$C_{71}$-PCBM. A summary of photovoltaic properties is given in Table 1. The open-circuit voltages ($V_{OC}$)=0.72-0.75 V for the three sets of devices are independent of the blend ratios. The slight increase in $V_{OC}$ is consistent with the lower HOMO energy level of SMDPPEH (5.2 eV as determined by ultraviolet photoelectron spectroscopy, UPS) compared to HOMO energy level of the (4) (4.9 eV as determined by UPS). In contrast, the short-circuit current densities ($J_{SC}$) are dependent on the donor-acceptor ratio. The devices based on 30:70 blend ratios delivered a short circuit current density of 7.7 mA/cm² and a fill factor of 0.41 giving a PCE of 2.4%. The short-circuit current density increases to 9.2 mA/cm² when the donor-acceptor blend ratio was changed to 50:50. Combined with a slightly increased fill factor of 0.45, a PCE of 3.0% is achieved, which is the highest reported $J_{SC}$ and PCE for solution-processed, small molecule based BHJ solar cells. Changing the blend ratio to 70:30, however, slightly decreases both $J_{SC}$ and fill factor to 8.7 mA/cm² and 0.35, respectively, giving a PCE of 2.2%.

From the external quantum efficiency (EQE) spectra shown in FIG. 9(b), it is clear that the absorption bands at 480 nm, 620 nm and 710 nm significantly contribute to the device photocurrent in all blend ratios. The EQE spectra show that the contribution of $C_{71}$-PCBM decreases as its concentration changes from 70% to 50% to 30%. This is consistent with the decrease in the amount of absorption at 480 nm assigned to $C_{71}$-PCBM in the blend film (see FIG. 8b). In contrast, the peaks at 620 nm and 710 nm in the EQE spectra assigned to SMDPPEH do not significantly change as a function of blend ratio. The EQE does not track with the film absorption at 620 nm and 710 nm which double in intensity when the amount of donor is increased from 30% to 70%. One possible explanation is that the donor domains increase in size due to increase in the donor concentration such that some generated excitons do not reach a donor-acceptor interface.

The hole and electron mobilities for all the blends are given in Table 2. The hole mobilities are of the order of $10^{-4}$-$10^{-5}$ cm$^2$/V·s and are not significantly different from the measured hole mobility of the pure donor film irrespective of the blend ratio. Similarly, the electron mobilities are also of the order of $10^{-4}$ cm$^2$/V·s. These carrier mobilities are comparable to those measured for high performance BHJs solar cells based on P3HT:PCBM blends. Importantly, the electron and hole mobilities of the blends are quite balanced which may help explain the high PCEs observed for this donor-acceptor system.

TABLE 2

Summary of hole and electron mobilities and solar cell characteristics of various SMDPPEH:C$_{71}$-PCBM ratios

| SMDPPEH:C$_{71}$-PCBM Ratio (20 mg/ml) | $V_{OC}$ (volts) | $J_{SC}$ (mA/cm$^2$) | FF | η (%) | $\mu_{hole}$ (cm$^2$/V-s) | $\mu_{electron}$ (cm$^2$/-s) |
|---|---|---|---|---|---|---|
| 30:70 | 0.72 | 7.7 | 0.41 | 2.4 | 0.4 × 10$^{-4}$ | 6.3 × 10$^{-4}$ |
| 50:50 | 0.75 | 9.2 | 0.44 | 3.0 | 1.0 × 10$^{-4}$ | 4.8 × 10$^{-4}$ |
| 70:30 | 0.72 | 8.7 | 0.35 | 2.2 | 1.6 × 10$^{-4}$ | 1.9 × 10$^{-4}$ |

Example 7. Film Morphology of SMDPPEH

Figure 10:
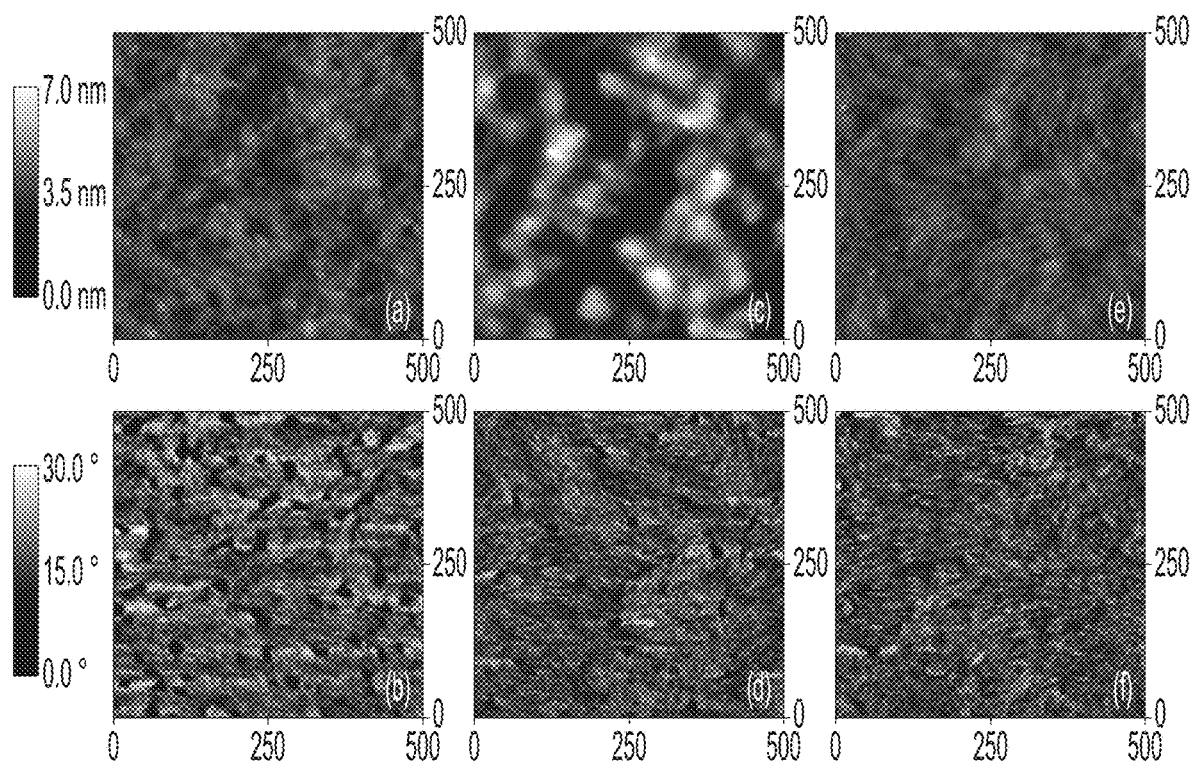
FIG. 10 depicts AFM topographic (a,c,e) and phase (b,d,f) images of SMDPPEH:C$_{71}$-PCBM films spun from 2% (w/v) solution at various ratios: 30:70 (a and b), 50:50 (c and d), and 70:30 (e and f). Images are 500 nm×500 nm in size.

The AFM images of the as-cast films of SMDPPEH:C$_{71}$-PCBM with different blend ratios are given in FIG. 10. All the films are very smooth independent of the donor-acceptor blend ratio. The average rms (root-mean-squared) surface roughnesses are ~0.3 nm, 0.5 nm and 0.3 nm for the 30:70, 50:50, and 70:30 blend ratios, respectively. No significant macro-scale phase segregation was observed in any of the films. The 30:70 SMDPPEH:C$_{71}$-PCBM blend shows two distinct domains in both topographical and phase images—both fiber-like structures and oval-shaped features (FIGS. 10 (a) and (b)). The domain sizes for the fibers increase as the amount of donor material is increased from 30% to 50% and 70%. The oval-shaped features (i.e., light spots in the height images and dark spots in the phase images) become smaller in size when the amount of C$_{71}$-PCBM is decreased. From these images, it can be inferred that the fiber-like structures are donor-rich domains and the oval-shaped features are acceptor-rich domains. In all the ratios, a high degree of ordering is observed. Combined with the absence of large phase separation, this favorable ordered network of donor and acceptor domains in the blend film can also help explain the high PCEs observed for the devices.

Example 8. Synthesis of Compound A, 3,6-bis(5-(benzofuran-2-yl)thiophen-2-yl)-2,5-bis(2-ethylhexyl)pyrrolo[3,4-c]pyrrole-1,4-dione (SMBFu)

In a three-necked, oven-dried 100 mL round-bottom flask, 3,6-bis-(5-bromo-thiophen-2-yl)-2,5-di-n-octyl-pyrrolo[3,4-c]pyrrole-1,4-dione (0.683 g, 1.00 mmol) (Wienk, M. M., Turbiez, M., Gilot, J. & Janssen, R. A. J., Adv. Mater. 20, 2556-2560 (2008)) was mixed with 15 mL of anhydrous toluene and 10 ml of 2.0 M potassium phosphate and the resulting mixture was degassed for 10 min. Benzofuran-2-boronic acid (0.375 g, 2.25 mmol), tris(dibenzylideneacetone)dipalladium(0) (14 mg, 0.0153 mmol), and tri-tert-butylphosphonium tetrafluoroborate (18 mg, 0.0620 mmol) were then added to the mixture and then degassed again for 5 minutes. The reaction mixture was stirred and heated to 90° C. under argon overnight. The reaction mixture was allowed to cool down to room temperature, after which it was poured into 300 mL of methanol and then stirred for 30 min. The precipitated solid was then collected by vacuum filtration and washed with several portions of distilled water, methanol, isopropanol, and petroleum ether. The crude product was purified by flash chromatography using chloroform as eluent, and the solvent was removed in vacuo to obtain a pure product. 3,6-bis(5-(benzofuran-2-yl)thiophen-2-yl)-2,5-bis(2-ethylhexyl)pyrrolo[3,4-c]pyrrole-1,4-dione is formed as a shiny, dark-green powder (yield: 67.2%). mp 233° C. $^1$H NMR (250 MHz, CDCl$_3$, ppm) δ=9.01 (d, J=4.0 Hz, 2H), 7.48-7.61 (m, 6H), 7.20-7.36 (m, 6H), 7.05 (s, 2H), 4.85 (dd, J=4.0 Hz, 0.5 Hz, 4H) 1.98 (m, 2H), 1.20-1.50 (m, 20H), 0.80-1.00 (m, 12H). MS (LR-EI) m/z: [M$^+$] calculated for C$_{38}$H$_{44}$N$_{22}$N$_2$O$_2$S$_4$: 756.31, found 756.03. CHN analysis: calcd: C, 72.89; H, 6.39; N, 3.70. found: C, 72.35; H, 6.33; N, 3.88.

Example 9. Fabrication of Solar Cells Incorporating SMBFu

Solar cells were fabricated by spin-casting the active bulk heterojunction layer onto a 50 nm layer of H.C. Stark Baytron P 4083 poly(3,4-ethylenedioxythiophene):poly(styrenesulfonate) on Corning 1737 active-matrix liquid-crystal-display glass patterned with 140 nm of indium tin oxide by Thin Film Devices. An 80-nm-thick aluminum cathode was deposited (area 20 mm$^2$) by thermal evaporation with no heating of the sample. Unless otherwise stated, the bulk heterojunction layer was spin-cast at 2,500 r.p.m. from a solution of SMBFu and PC$_{71}$BM in chloroform at a total solids concentration of 20 mgml$^{-1}$. PC$_{71}$BM was purchased from Nano-C. The active layers were determined to be approximately 95 nm thick using an Ambios XP-100 Stylus profilometer. Device efficiencies were measured with a 150WNewport-Oriel AM 1.5G light source operating at 100 mWcm$^{-2}$ and independently cross-checked using a 300WAM 1.5G source operating at 100 mWcm−2 for verification. Solar-simulator illumination intensity was measured using a standard silicon photovoltaic with a protective KG5 filter calibrated by the National Renewable Energy Laboratory. IPCE spectra measurements were made with a 250 W Xe source, a McPherson EU-700-56 monochromater, optical chopper and lock-in amplifier, and a National Institute of Standards and Technology traceable silicon photodiode for monochromatic power-density calibration. AFM images were taken on a Veeco Innova AFM. Ultraviolet-visible absorption spectroscopy was measured on a Shimadzu 2401 diode array spectrometer. For ultraviolet photoelectron spectroscopy (UPS) measurements, a 75 nm thick Au film was deposited on a precleaned Si substrates with a thin native oxide.

Figure 11:
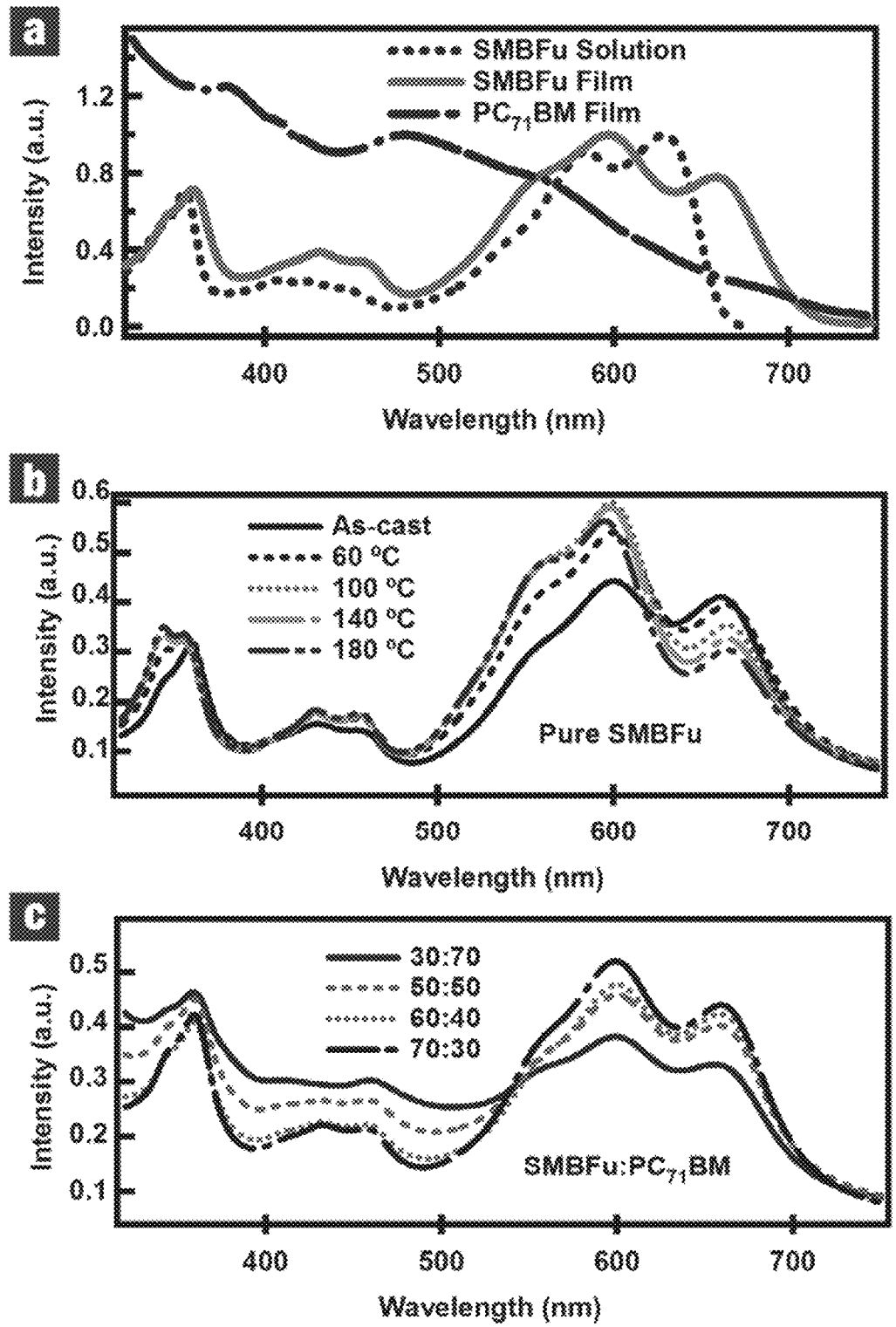
FIG. 11 depicts ultra-violet visible absorption spectra. a, Pure materials in solution and solid state. b, Pure donor films after annealing at different temperatures. As-cast films composed of different donor-acceptor ratios. c, As-cast films composed of different donor-acceptor ratios.

FIG. 11 shows the absorption of pure SMBFu solution and films, pure PC$_{71}$BM film and SMBFu:PC$_{71}$BM films. SMBFu absorbs past 650 nm in solution with a molar absorptivity of 64,000 M−1 cm−1 at 630 nm. The absorption broadens and extends to 710 nm in the solid state (FIG. 11a). The absorption spectrum of the pure SMBFu changes considerably after thermal annealing as shown in FIG. 11b. A significant increase in absorption intensity at 590 nm occurs at annealing temperatures up to 100° C., followed by a decrease in intensity above 100° C. Increases in optical absorption after annealing have been observed for P3HT and are found to derive from aggregation and an increase in the crystallinity of the material, which enhances the probability of optically active $\pi$-$\pi$* electronic transitions. The increase in crystallinity of annealed SMBFu is confirmed by X-ray diffraction (XRD) studies. XRD data shows an increase in the diffraction intensity which implies higher degree of crystallinity after thermal annealing at 100° C. At annealing temperatures above 60° C., the absorption peak at 660 nm begins to decrease. From this information, it is seen that that optimal light absorption for pure SMBFu is achieved after annealing at temperatures between 60° C. and 100° C.

Absorption characteristics of as-cast SMBFu:PC$_{71}$BM films at various blend ratios are shown in FIG. 11c. It can be seen that mixtures of the two materials absorb strongly throughout the range of 300 nm to 700 nm. The absorption of the blends is relatively high in the 500 to 700 nm range for all blend ratios, reflecting the higher optical density of SMBFu relative to PC$_{71}$BM. The SMBFu absorption (550 to 700 nm) increases with an increasing donor content while the PC$_{71}$BM absorption reduces with lower acceptor content in the blends.

Blend (or pure) solutions were then spin coated at spin speeds of 2,000 rpm and concentration of 0.1%. All films were fabricated inside a N$_2$ atmosphere glovebox and were transferred via an airtight sample holder to the UPS analysis chamber. Samples were also kept in a high vacuum chamber overnight to remove solvent residues. The UPS analysis chamber was equipped with a hemispherical electron energy analyzer (Kratos Ultra Spectrometer) and was maintained at $1\times10^{-9}$ Torr. The UPS measurements were carried out using the He I (hv=21.2 eV) source. During UPS measurements, a sample bias of −9 V was used in order to separate the sample and the secondary edge for the analyzer. In order to confirm reproducibility of UPS spectra, the measurements were repeated twice on each set of samples. Thin film XRD spectra were recorded using an X'Pert Phillips Material Research Diffractometer (MRD) at 45 kV and 40 mA with a scanning rate of 0.004 degree per second, and Cu K$\alpha$ radiation (with wavelength $\lambda$=1.5405 Å) with a 2theta-omega configuration. Carrier mobilities were measured using the space charge limited current technique where J-V curves were measured for devices with the architecture ITO/PEDOT:PSS/SMBFu:PC$_{71}$BM/Au for holes and Mg/SMBFu:PC$_{71}$BM/Mg for electrons. Electron mobility measurements were repeated using the architecture Al/SMBFu:PC$_{71}$BM/Ba/Al. Electron mobilities were measured using electrodes with different work functions to ensure that the built-in potential of the devices did not affect the results. Mobilities were extracted by fitting the current density-voltage curves using the Mott-Gurney relationship.

One of the primary reasons that small molecules have not been investigated more extensively as solution processable semiconductors is that they tend to either be insoluble or form rough films. Until now, morphologies have not been achieved which allow efficient charge separation and collection such as those observed in P3HT:PCBM systems. Since it is known that the morphology of the active layer in BHJ solar cells significantly affects the performance, the morphologies of pure SMBFu films and blends with PC71BM were investigated using tapping mode atomic force microscopy (AFM). SMBFu is soluble in chloroform at 60° C. up to ~20 mg/mL and forms smooth films with an average surface roughness of 0.7 nm when spin cast onto indium tin oxide (ITO) coated glass substrates with a 45 nm layer of poly(styrenesulfonic acid) doped poly(ethylenedioxythiophene) (PEDOT:PSS). Annealing pure SMBFu at ~100° C. increases surface roughness to ~1.0 nm.

The solid state structure of mixed donor-acceptor films influences how the material will perform as a BHJ solar cell. The donor and acceptor films should phase separate into an interpenetrating network of donor and acceptor domains, where the ideal domain size of a donor or acceptor material depends largely on the exciton diffusion length in each material. When the domain size of the material is smaller than the exciton diffusion length, this allows many excitons to diffuse to a donor-acceptor interface and undergo charge separation.

Figure 12:
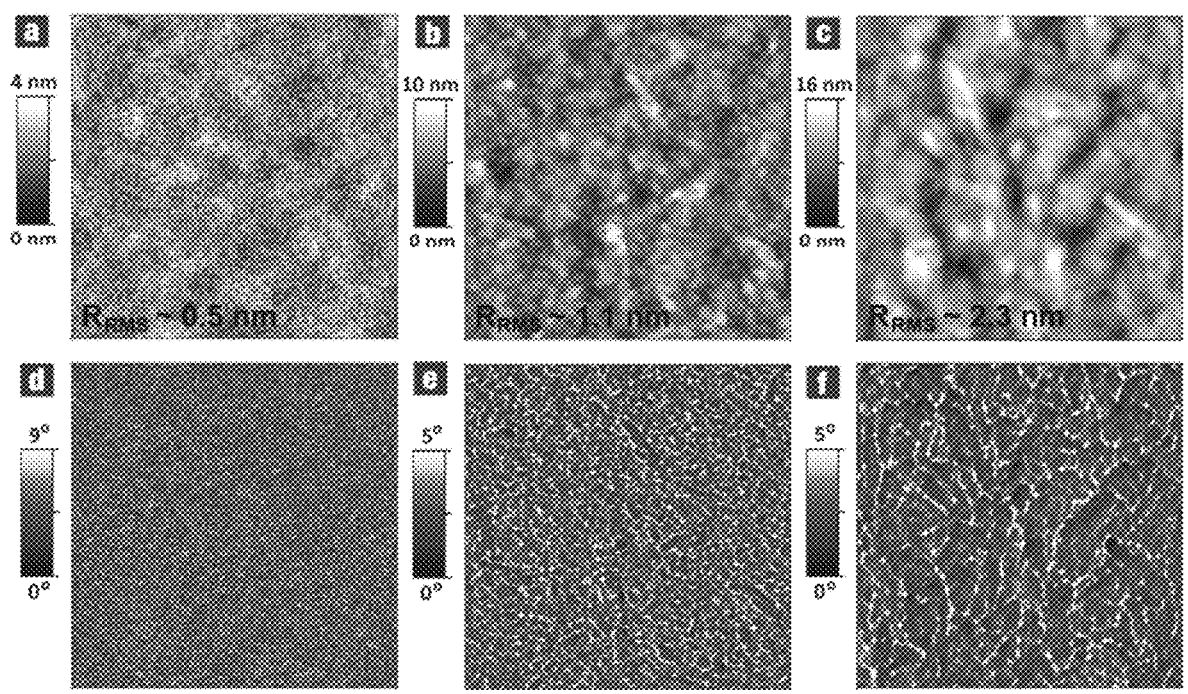
FIG. 12 depicts AFM Images of 70:30 SMBFu:PC71BM films spin-coated on ITO/PEDOT substrates and annealed at various temperatures. a-c, Height images of as-cast film (a), film after annealing at 90° C. (b) and after annealing at 100° C. (c). d-f, Phase images of films as-cast (d), annealed at 90° C. (e) and annealed at 100° C. (f). The scan size for all images is 2 m×2 m.

AFM was used to examine the surface structure of SMBFu:PC$_{71}$BM films as a function of annealing temperature. SMBFu forms good quality films when spin cast with PC$_{71}$BM. Mixtures of SMBFu and PC$_{71}$BM at 20 mg/mL overall concentration in chloroform, spin cast at 2,500 rpm yield films approximately 95 nm thick. FIG. 12 shows the topographic and phase images of as-cast and annealed SMBFu:PC$_{71}$BM (70:30) films. The topographic and phase images of as-cast SMBFu:PC$_{71}$BM are featureless with a surface roughness of ~0.5 nm (FIG. 12a,d). Thermal annealing the SMBFu:PC$_{71}$BM film at temperatures above 80° C. result in significant changes in the film morphology. FIGS. 12b and 12c depict the morphologies of a 70-30 SMBFu:PC$_{71}$BM blend ratio after heating at 90° C. and 100° C. for 10 min in nitrogen, respectively. The topographic image of SMBFu:PC$_{71}$BM annealed at 90° C. comprises small oblong domains between 10-50 nm in width with the surface roughness of ~1.1 nm (FIG. 12b). These oblong domains increase to ~100 nm upon thermal annealing at 100° C., and the surface roughness is ~2.3 nm (FIG. 12c). Similar changes in the film morphology upon thermal annealing are observed for other blend ratios as well.

FIGS. 12e and 12f show the corresponding phase images of the annealed SMBFu:PC$_{71}$BM. The phase images show two distinct domains (orange and blue colors) that form continuous networks. The blue phase was assigned to a donor-rich material and the orange phase was assigned to an acceptor-rich material because the blue-phase and the orange-phase domains increase with the donor and the acceptor contents, respectively. There is a clear dependence between the annealing temperature and the domain size, where the average domain size of the donor material increases from several ten of nanometers when annealing at 90° C. (FIG. 12e) to ~100 nm at 100° C. (FIG. 12f). Thus, the domain sizes at a fixed donor:acceptor ratio can be controlled by varying the annealing temperature. The observed changes in morphology agree well with the absorption and XRD results.

Figure 13:
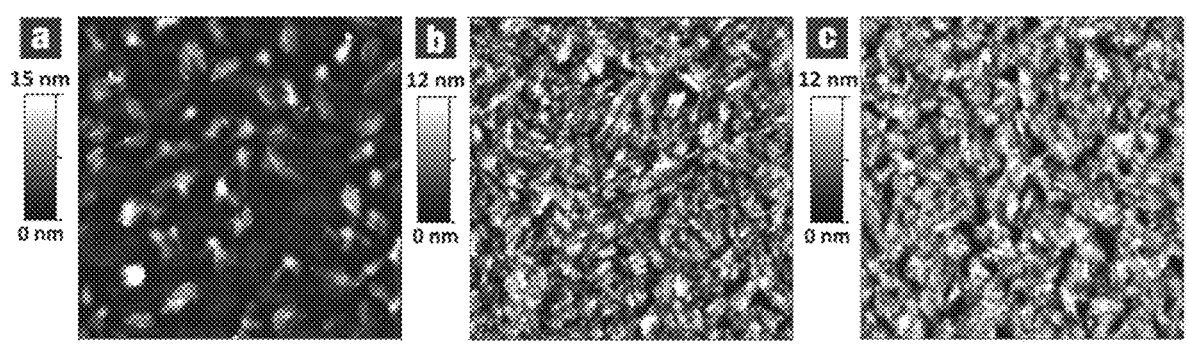
FIG. 13 depicts AFM images of different SMBFu:PC71BM blend ratios spin-coated on ITO/PEDOT substrates and annealed at 100° C. for 10 minutes. Height images for 30:70 (a), 50:50 (b) and 70:30 (c) blend ratios. The scan size for all images is 5 m×5 m.

Next, the effect of donor:acceptor ratio on film morphology was examined. The as-cast SMBFu:PC$_{71}$BM films at various blend ratios are smooth with a surface roughness of less than 1 nm similar to those of FIGS. 12a and 12d. FIG. 13 shows the topographic images of SMBFu:PC$_{71}$BM films at various blend ratios annealed at 100° C. for 10 min. under nitrogen. It can be seen that the 30:70 blend exhibits isolated clusters of rod-like domains of donor material within a matrix of PC$_{71}$BM (FIG. 13a). The average width and length of the rod-like structures are ~80 nm and 440 nm, respectively, while the average surface roughness is 2.3 nm. At a 50:50 ratio, the entire surface is covered with rectangular clusters of rod-like domains (FIG. 13b), with a surface roughness of 2.1 nm. The dimensions of the rod-shaped features are similar to those observed in the 30:70 ratio. The 70:30 ratio shows a morphology similar to the 50:50 ratio, with a somewhat more amorphous nature and smaller acceptor domain sizes filling in the volume between donor domains (FIG. 13c), with an average surface roughness of 2.3 nm. Although the size of the domains on the film surface appear to be somewhat larger than typical exciton diffusion lengths for organic solids, it was observed that SMBFu:PC$_{71}$BM blends exhibit much weaker photoluminescence (PL) than pure SMBFu, with much shorter PL lifetimes (<60 ps for a 60:40 blend vs. 1100 ps, for the pure material), demonstrating that the SMBFu:PC$_{71}$BM heterostructure effectively quenches excitons.

The charge carrier mobilities of BHJ films have a large affect on how a material will perform in a solar cell. Low charge carrier mobilities result in charge accumulation and inefficient charge collection while un-balanced charge carrier mobilities decrease the fill factor (FF) and efficiency of BHJ devices by promoting excessive charge recombination. In order to quantify carrier mobilities for the materials, current density-voltage (J-V) characteristics of single-carrier diodes were measured for pure and blended films. The hole and electron mobilities were extracted using the space-charge limited current (SCLC) model. Pure SMBFu films exhibit hole mobilities on the order of ~1×10$^{-5}$ cm$^2$/Vs before and after annealing at 100° C. s. The average measured hole mobilities for as-cast 30:70, 50:50, 60:40 and 70:30 films were found to be 0.9×10$^{-5}$ cm2/Vs, 2×10$^{-5}$ cm$^2$/Vs, 3×10$^{-5}$ cm$^2$/Vs and 3×10$^{-5}$ cm$^2$/Vs, respectively. The hole mobilities did not change significantly upon annealing. Electron mobilities were found to increase from 2×10$^{-5}$ cm$^2$/Vs to 70×10$^{-5}$ cm$^2$/Vs to 200×10$^{-5}$ cm$^2$/Vs for the 30:70, 50:50 and 70:30 blend ratios, respectively, increasing with the acceptor concentration. The electron mobilities increased after annealing at 100° C. to 90×10$^{-5}$ cm$^2$/Vs to 200×10$^{-5}$ cm$^2$/Vs to 300×10$^{-5}$ cm$^2$/Vs for 30:70, 50:50 and 70:30 blend ratios, respectively. The dramatic increase of the electron mobility at low acceptor concentration suggests that percolation pathways for electron transport do not exist in as-cast films with low fullerene concentrations, but are developed after thermal annealing. The charge carrier mobilities for all different blend ratios before and after annealing were compared. The carrier mobilities were found to be more balanced at high donor concentrations, consistent with the observed increase in fill factor at high donor concentrations. The measured hole mobilities for this series of materials were somewhat surprising, as they did not increase after annealing despite an obvious increase in the crystallinity of the donor material.

Figure 14:
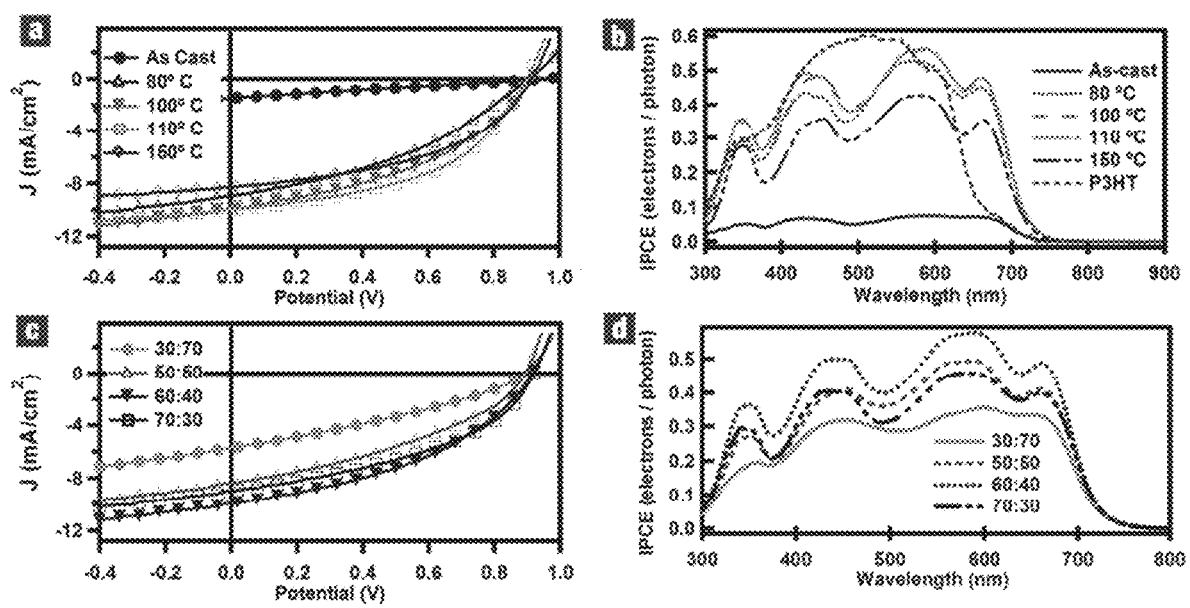
FIG. 14 depicts J-V characteristics and external quantum efficiencies of SMBFu:PC71BM devices: a, J-V curves of a 60:40 SMBFu:PC71BM blend ratio annealed at different temperatures for 3 min. b, EQE spectra of a 60:40 SMBFu:PC71BM blend annealed for 3 minutes at different temperatures (solid lines) compared to a P3HT:PC61BM device (dashes). c, J-V curves of different SMBFu:PC71BM blend ratios after annealing at 100° C. for 10 min. d, EQE spectra of different SMBFu:PC71BM blend ratios after annealing at 100° C. for 10 min.

Finally, the performance of SMBFu:PC$_{71}$BM films in solar cells was examined. FIGS. 14a and 14b show the J-V and the incident photon conversion efficiency (IPCE) characteristics of as-cast and annealed SMBFu:PC$_{71}$BM (60:40) devices under AM 1.5G irradiation at an intensity of 100 mW/cm$^2$ irradiation. The devices were annealed at various temperatures for 3 minutes under nitrogen. The short-circuit current density (J$_{sc}$), V$_{oc}$ and FF for all devices were found to increase after scanning several times. Table 3 summarizes the device results. The V$_{oc}$ is 0.92 V and remains unchanged for all annealing temperatures. The short-circuit current density (J$_{sc}$) is very small for as-cast films (1.45 mA/cm$^2$) and increases substantially to a value of 8.90 mA/cm$^2$ for devices annealed at 80° C. (Table 3). The J$_{sc}$ reaches the maximum value of 9.96 mA/cm$^2$ after annealing at 110° C., a factor of 6 higher than for the as-cast devices. The J$_{sc}$ decreases to 8.31 mA/cm$^2$ for annealing at 150° C. (Table 3). A slight drop in J$_{sc}$ likely is a result of decreased charge separation due to a reduced donor-acceptor interfacial area, consistent with the observed change in the donor and the acceptor domain sizes from the AFM images collected at high annealing temperatures. The FF shows the same trend as the J$_{sc}$. The FF is 0.24 for as-cast devices and increases to 0.38 for devices annealed at 80° C. (Table 3). The FF reaches a maximum value of 0.48 for devices annealed at 110° C. and decreases slightly to 0.46 for those annealed at 150° C. The improved J$_{sc}$ and FF of the device annealed at 110° C. leads to an efficiency of 4.4%, over an order of magnitude higher than the as-cast device (0.33%) (Table 3).

The IPCEs of a 60:40 blend ratio at various annealing temperatures are shown in FIG. 14b. Integrating the IPCE yields the theoretical J$_{sc}$ values which equal to the measured values in the J-V curves+1 mA/cm$^2$. The IPCE of a P3HT:PC$_{61}$BM device is included for comparison (dashed line). The IPCEs of the SMBFu:PC$_{71}$BM devices extend past 700 nm. The IPCE of the as-cast SMBFu:PC$_{71}$BM device is around 10%. The IPCE of the 60:40 device annealed at 100° C. integrates to 10 mA/cm$^2$ similar to the measured J$_{sc}$ (FIG. 14a) and reaches a maximum of 58% at 585 nm. The shape of the EQE spectrum resembles the shape of the absorption spectrum of the blended films, with the notable exception that the relative height of the IPCE plot in the 350-500 nm region is higher than the absorption. This can be explained by a higher charge separation rate for excitons generated in the PC$_{71}$BM phase, due to the smaller PC$_{71}$BM domain sizes as seen in the AFM images (FIG. 12).

FIGS. 14c and 14d show the J-V and the IPCE characteristics of SMBFu:PC$_{71}$BM devices annealed at 100° C. for 10 minutes as a function of the blend ratios. The V$_{oc}$ remains the same for all the blend ratios studied here. Before annealing, J$_{sc}$ is highest (6.7 mA/cm$^2$) for large acceptor concentrations (70% by weight,). After annealing at 100° C., J$_{sc}$ increases with the donor concentration from 5.7 mA/cm$^2$ for 30:70 blend ratio to 8.4 mA/cm$^2$ for 50:50 ratio and reaches the highest value of 9.9 mA/cm$^2$ for the 60:40 blend ratio (Table 3). J$_{sc}$ drops slightly to 9.0 mA/cm$^2$ at higher donor concentration (70:30). The 60:40 ratio appears to result in the best balance of light absorption, exciton diffusion, charge separation and charge collection for both donor and acceptor materials. The FF increases with increasing donor concentration from 0.38 for 30:70 to 0.49 for 70:30 (Table 3), which is likely due to a greater balance of charge carrier mobilities at high donor concentrations. Maximum efficiency of 4.4% occurs at blend ratio of 60:40 or 65:35 at annealing temperatures between 100 and 110° C. The IPCEs observed for different blend ratios after annealing at 100° C. for 10 min are plotted in FIG. 14d. The IPCE increases with the donor concentration. The relative quantum efficiency of the material at different wavelengths does not show a strong dependence on blend ratio as the absorption spectra do, suggesting that the collected current is not limited by the absorption of photons by different materials, but more likely influenced by the donor:acceptor interfacial area and formation of percolation pathways.

The photovoltaic characteristics for different blend ratios and annealing temperatures are summarized in Table 3. The highest performance observed occurred for a 60:40 blend annealed for 3 minutes at 110° C., yielding a short circuit current of 10.0 mA/cm$^2$, a V$_{oc}$ of 0.92 V, a FF of 0.48 and a power conversion efficiency of 4.4%. It is apparent that the annealing temperature which yields the highest efficiency results in donor-rich domain sizes on the order of ~100 nm, higher than expected for efficient exciton diffusion and is slightly higher than annealing temperatures which yield the highest optical absorption. This suggests that percolation paths are underdeveloped at lower temperatures.

Table 3 below compares the device characteristics of different SMBFu:PC$_{71}$BM blend ratios annealed at different temperatures. J$_{SC}$ is the short circuit current density, V$_{OC}$ is the open circuit voltage, FF is the fill factor and η is the overall power conversion efficiency. The architecture is ITO/PEDOT:PSS/SMBFu:PC$_{71}$BM/Al for all devices.

TABLE 3

Device Characteristics of Different SMBFU:PC$_{71}$BM Blend Ratios Annealed at Different Temperatures

| Blend Ratio | Annealing Temp (° C.) | J$_{sc}$ (mA/cm$^2$) | V$_{oc}$ (V) | FF | η (%) |
|---|---|---|---|---|---|
| 60-40 | As-cast | 1.45 | 0.96 | 0.24 | 0.33 |
| 60-40 | 80 | 8.90 | 0.92 | 0.38 | 3.1 |
| 60-40 | 100 | 9.88 | 0.92 | 0.42 | 3.8 |
| 60-40 | 110 | 9.96 | 0.92 | 0.48 | 4.4 |
| 60-40 | 150 | 8.31 | 0.92 | 0.46 | 3.5 |
| 30-70 | As-cast | 6.70 | 0.90 | 0.38 | 2.3 |
| 30-70 | 100 | 5.70 | 0.90 | 0.38 | 2.0 |
| 50-50 | As-cast | 4.81 | 0.94 | 0.35 | 1.6 |
| 50-50 | 100 | 8.38 | 0.90 | 0.45 | 3.4 |
| 60-40 | As-cast | 1.45 | 0.96 | 0.24 | 0.3 |
| 60-40 | 100 | 9.88 | 0.92 | 0.42 | 3.8 |
| 70-30 | As-cast | 0.78 | 0.88 | 0.26 | 0.18 |
| 70-30 | 100 | 9.01 | 0.94 | 0.49 | 4.2 |

Example 10. Synthesis of Additional Diketopyrrolopyrrole Compounds C6PT1C6, C6PT2C6, C6PT3C6, EHPT2C6, and C6PT2

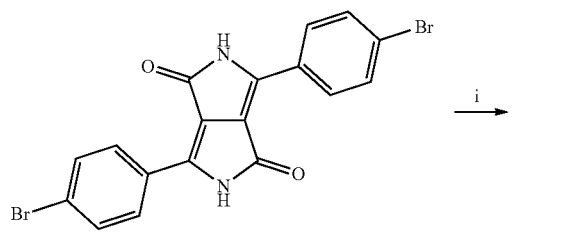

11

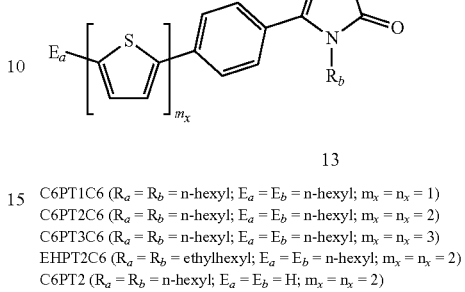

12

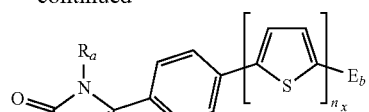

13

C6PT1C6 (R$_a$ = R$_b$ = n-hexyl; E$_a$ = E$_b$ = n-hexyl; m$_x$ = n$_x$ = 1)
C6PT2C6 (R$_a$ = R$_b$ = n-hexyl; E$_a$ = E$_b$ = n-hexyl; m$_x$ = n$_x$ = 2)
C6PT3C6 (R$_a$ = R$_b$ = n-hexyl; E$_a$ = E$_b$ = n-hexyl; m$_x$ = n$_x$ = 3)
EHPT2C6 (R$_a$ = R$_b$ = ethylhexyl; E$_a$ = E$_b$ = n-hexyl; m$_x$ = n$_x$ = 2)
C6PT2 (R$_a$ = R$_b$ = n-hexyl; E$_a$ = E$_b$ = H; m$_x$ = n$_x$ = 2)

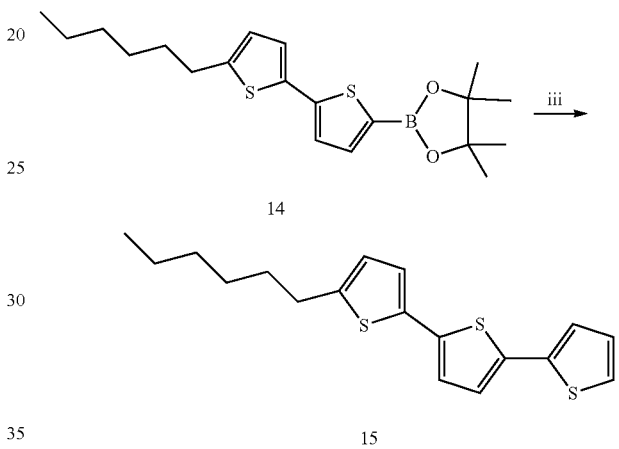

14

15

16

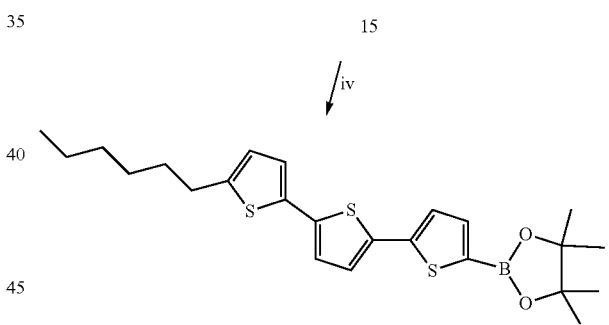

Conditions: (i) Cesium carbonate, alkylbromide, DMF, 40° C.; (ii) appropriate thiophene bronic acid pinacol ester, Pd$_2$(dba)$_3$, HP($^t$Bu)$_3$BF$_4$, K$_3$PO$_4$, THF; (iii) 2-bromothiophene, Pd$_2$(dba)$_3$, HP($^t$Bu)$_3$BF$_4$, K$_3$PO$_4$, THF; (iv) n-BuLi, 2-Isopropoxy-4,4,5,5-tetramethyl-1,3,2-dioxaborolane.

Material Synthesis.

5-Hexyl-2-thiophene boronic acid pinacol ester, 2,2'-bithiophene-5-boronic acid pinacol ester, and 5-hexyl-2,2'-bithiophene-5'-boronic acid pinacol ester were purchased from Sigma-Aldrich Chemical Co. and used as received. Other chemicals and solvents were used as received from commercial sources without further purification. Tetrahydrofuran (THF) was distilled over sodium/benzophenone. 3,6-bis(4-bromophenyl)-2,5-dihydropyrrolo[3,4-c]pyrrolo-1,4-dione, 11, was synthesized following the procedure in D. Cao et al. J. Poly. Sci. A 2006, 44, 2395.

2,5-Dihexyl-3,6-bis(4-bromophenyl)pyrrolo[3,4-c]-pyrrole-1,4-dione (12a)

To a solution of 11 (5.0 g, 11 mmol) in N,N-dimethylformamide (DMF) (50 mL), 1-bromohexane (7.4 g, 45 mmol) and cesium carbonate (11 g, 34 mmol) were added at 40° C. After stirring 24 hr, the reaction mixture was filtered to remove solid. The filtrate was extracted with chloroform and recrystallized from methanol to yield red needle-like crystal (4.1 g, 60%). $^1$H NMR (200 MHz, CDCl$_3$): 7.67 (s, 8H), 3.71 (t, 4H), 1.58 (m, 4H), 1.19 (m, 12H), 0.82 (t, 6H).

2,5-Dihexyl-3,6-bis(4-bromophenyl)pyrrolo[3,4-c]-pyrrole-1,4-dione (12b)

The procedure for the synthesis of 12a was followed to prepare 12b using 2-ethylhexyl bromide (3.5 g, 18 mmol) instead of 1-bromohexane. The crude product was purified by gradient column chromatography on a silical gel with using gradient solvent with dichloromethane/hexane from 1/1 to 2.5/1 (v/v) to yield in 22% (0.66 g). $^1$H NMR (200 MHz, CDCl$_3$): 7.65 (s, 8H), 3.70 (d, 4H), 1.45 (m, 2H), 1.09 (m, 16H), 0.74 (m, 12H).

5-hexyl-2,2':5',2''-terthiophene, (15)

To a mixture of 2-bromothiophene (1.56 g, 9.57 mmol), 5-hexyl-2,2'-bithiophene-5'-boronic acid pinacol ester (3.0 g, 8.0 mmol), tri (dibenzylidene-acetone)palladium (0) (Pd$_2$(dba)$_3$) (0.15 g, 0.17 mmol), tri-tert-butylphosphonium tetrafluoroborate (0.18 g, 0.65 mmol), and potassium phosphate (14 g, 64 mmol), degassed THF/water (30 mL/3 mL) was added. After stirring under argon at 80° C. overnight, the reaction mixture was poured into methanol. The crude product was collected by filtration and purified by column chromatography on a silica gel with hexane to obtain 15 (2.1 g, 81%). $^1$H NMR (200 MHz, CDCl$_3$): 7.20 (m, 2H), 7.04 (m, 4H), 6.68 (d, 1H), 2.79 (t, 2H), 2.64 (m, 2H), 1.33 (m, 6H), 0.89 (t, 3H).

5-hexyl-2,2':5',2''-terthiophene-5''-boronic acid pinacol ester, (16)

To a solution of 15 (1.8 g, 5.4 mmol) in 45 mL of THF, n-BuLi (2.6 mL, 6.5 mmol, 2.5 M in hexane) was added dropwise at −78° C. After stirred for 30 min at −78° C., the solution was warmed to room temperature and stirred for 1 hr. Then, the mixture was cooled down to −78° C. and add 2-isopropoxy-4,4,5,5-tetramethyl-1,3,2-dixoaborolane (1.5 g, 8.1 mmol) at once. The mixture was warmed up to room temperature and stirred overnight. After reaction was quenched with water, the organic layer was extracted by ethyl acetate and dried over magnesium sulfate. After solvent was removed under reduced pressure, the crude product was purified by column chromatography to obtain 16 (1.9 g, 77%). $^1$H NMR (200 MHz, CDCl$_3$): 7.51 (d, 1H), 7.22 (d, 1H), 7.11 (d, 1H), 6.99 (m, 2H), 6.68 (d, 1H), 2.79 (t, 2H), 1.68 (m, 2H), 1.35 (m, 20H), 0.89 (t, 3H).

2,5-Dihexyl-3,6-bis[4-(5-hexylthiophene-2-yl)phenyl]pyrrolo[3,4-c]-pyrrole-1,4-dione, C6PT1C6

To a mixture of 12a (0.75 g, 1.2 mmol), 5-hexyl-2-thiophene boronic acid pinacol ester (0.79 g, 2.7 mmol), Pd$_2$(dba)$_3$ (0.056 g, 0.061 mmol), tri-tert-butylphosphonium tetrafluoroborate (0.11 g, 0.37 mmol), and potassium phosphate (3.11 g, 14.7 mmol), degassed THF/water (30 mL/3 mL) was added. After stirring under argon at 80° C. overnight, the reaction mixture was poured into methanol. The crude product was collected by filtration and purified by gradient column chromatography on a silica gel with chloroform/hexane from 2/1 to 5/1 (v/v) to obtain C6PT1C6 (0.40 g, 42%). $^1$H NMR (200 MHz, CDCl$_3$): 7.83 (d, 4H), 7.68 (d, 4H), 7.24 (d, 2H), 6.78 (d, 2H), 3.79 (t, 4H), 2.84 (4H), 1.68 (m, 8H), 1.23-1.35 (m, 24H), 0.87 (m, 12H).

2,5-Dihexyl-3,6-bis[4-(5-hexyl-2,2'-bithiophene-5-yl)phenyl]pyrrolo[3,4-c]-pyrrole-1,4-dione, C6PT2C6

The procedure for the synthesis of C6PT1C6 was followed using 5-hexyl-2,2'-bithiophene-5'-boronic ester pinacol ester (0.92 g, 2.4 mmol), instead of 5-hexyl thiophene boronic acid pinacol ester to yield in 91% (0.85 g). $^1$H NMR (200 MHz, CDCl$_3$): 7.87 (d, 4H), 7.73 (d, 4H), 7.33 (d, 2H), 7.10 (d, 2H), 7.05 (d, 2H), 6.71 (d, 2H), 3.80 (t, 4H), 2.81 (t, 4H), 1.70 (m, 8H), 1.23-1.43 (m, 24H), 0.87 (m, 12H).

2,5-Dihexyl-3,6-bis[4-(5-hexyl-2,2':5',2''-terthiophene-5''-yl)phenyl]pyrrolo[3,4-c]-pyrrole-1,4-dione, C6PT3C6

The procedure for the synthesis of C6PT1C6 was followed using 5-hexyl-2,2':5',2''-terthiophene-5''-boronic acid pinacol ester (0.90 g, 2.0 mmol), instead of 5-hexyl thiophene boronic acid pinacol ester to yield in 78% (0.68 g). 1H NMR (200 MHz, CDCl$_3$): 7.83 (d, 4H), 7.69 (d, 4H), 7.31 (d, 2H), 7.14 (m, 4H), 6.98 (m, 4H), 6.62 (d, 2H), 3.78 (t, 4H), 2.88 (t, 4H), 1.61 (m, 8H), 1.10-1.40 (m, 24H), 0.82 (m, 12H).

2,5-Dihexyl-3,6-bis[4-(2,2'-bithiophene-5-yl)phenyl]pyrrolo[3,4-c]-pyrrole-1,4-dione, C6PT2

The procedure for the synthesis of C6PT1C6 was followed using 2,2'-bithiophene-5'-boronic acid pinacol ester (0.89 g, 3.1 mmol), instead of 5-hexyl thiophene boronic acid pinacol ester to yield in 78% (0.75 g). $^1$H NMR (200 MHz, CDCl$_3$): 7.88 (d, 4H), 7.74 (d, 4H), 7.35 (d, 2H), 7.27 (m, 4H), 7.19 (d, 2H), 7.06 (m, 2H), 3.80 (t, 4H), 1.66 (m, 4H), 1.24 (m, 12H), 0.84 (t, 6H).

2,5-Dihexyl-3,6-bis[4-(5-hexyl-2,2'-bithiophene-5-yl)phenyl]pyrrolo[3,4-c]-pyrrole-1,4-dione, EHPT2C6

The procedure for the synthesis of C6PT1C6 was followed using 12b (0.58 g, 0.87 mmol) and 5-hexyl-2,2'-bithiophene-5'-boronic ester pinacol ester (0.81 g, 2.2 mmol), instead of 12a and 5-hexyl thiophene boronic acid pinacol ester to yield in 86% (0.75 g). $^1$H NMR (200 MHz, CDCl$_3$): 7.83 (d, 4H), 7.70 (d, 4H), 7.31 (d, 2H), 7.08 (d, 2H), 7.04 (d, 2H), 6.70 (d, 2H), 3.80 (d, 4H), 2.81 (t, 4H), 1.71 (m, 4H), 1.34 (m, 14H), 1.11 (m, 16H), 0.90 (t, 6H), 0.77 (m, 12H).

Example 11. Synthesis of Two-Core Diketopyrrolopyrrole Compounds with Electron-Rich Bridge Moiety
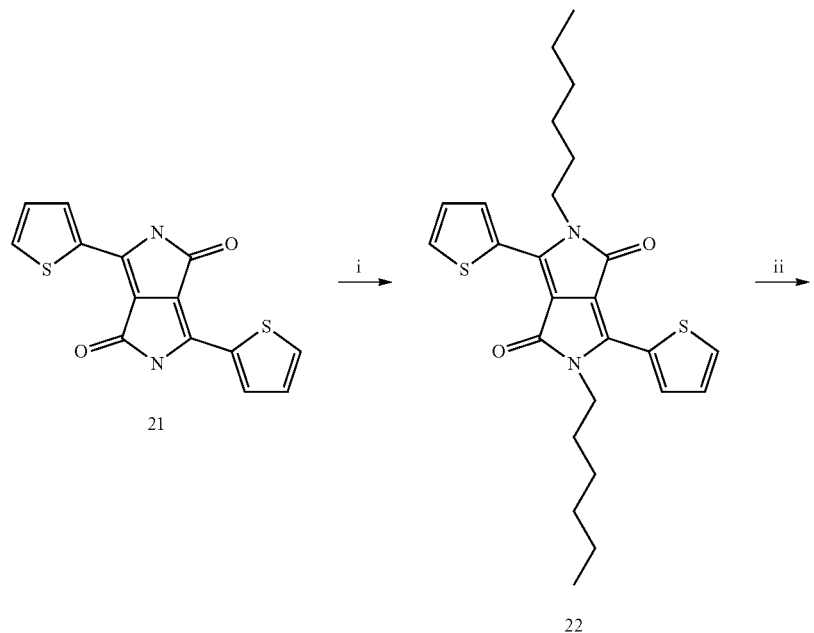
21
22
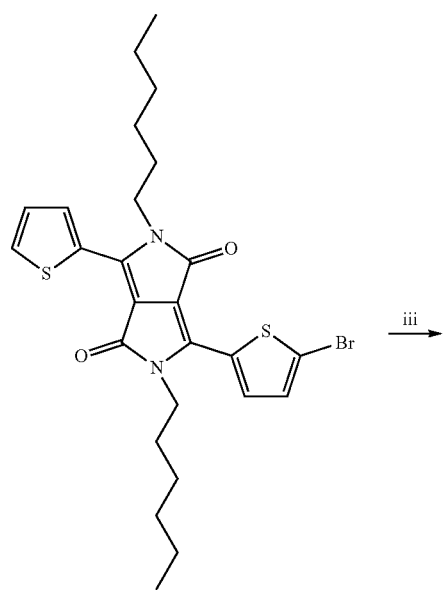
23

-continued
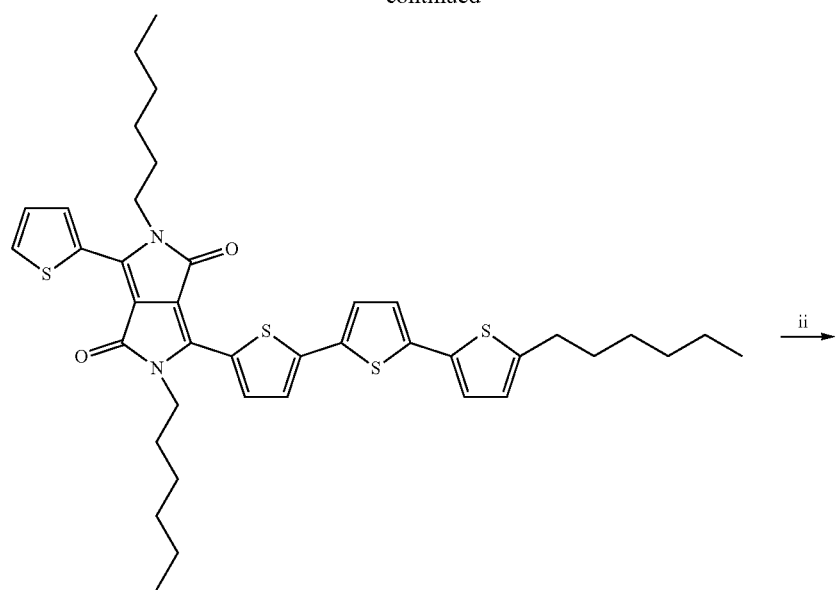
24
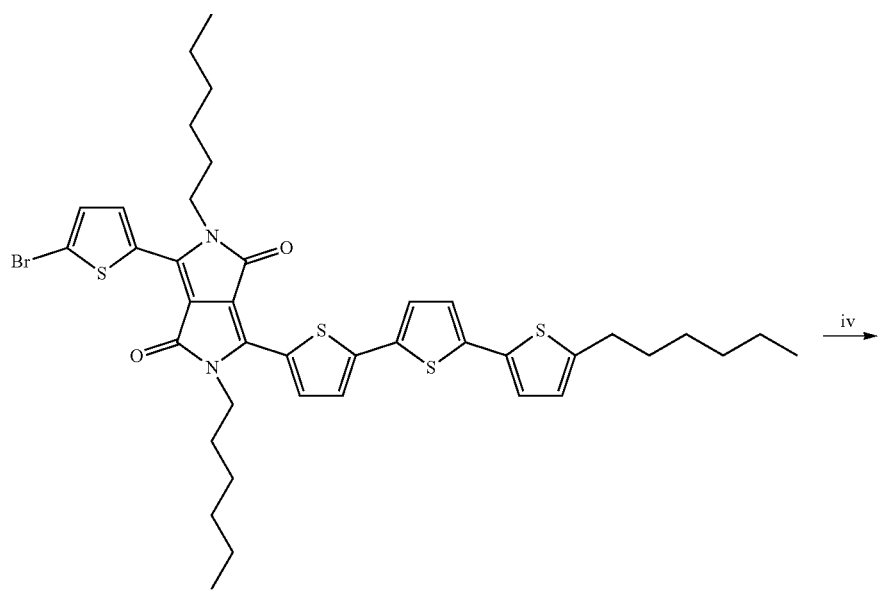
25

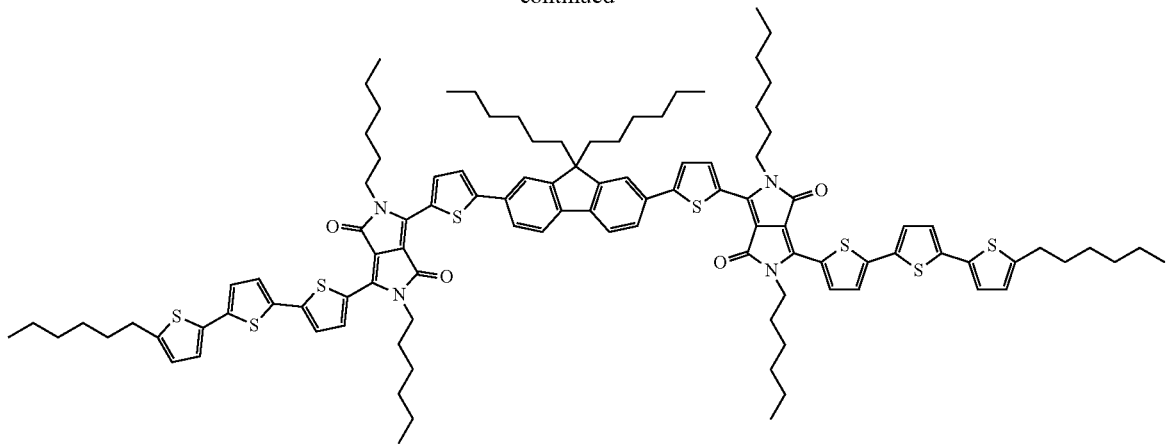

26

2,5-Dihexyl-3,6-dithienylpyrrolo[3,4-c]-pyrrole-1,4-dione (22)

To a solution of 21 (10 g, 33 mmol) in N,N-dimethylformamide (DMF) (100 ml), 1-bromohexane (17 g, 99 mmol) and potassium carbonate (12 g, 83 mmol) were added at 90° C. After stirring 8 hr, the reaction mixture was filtered to remove solid. The filtrate was extracted with chloroform and recrystallized from methanol to yield 2 (9.0 g, 58%). $^1$H NMR (200 MHz, CDCl$_3$): 8.94 (d, 2H), 7.65 (d, 2H), 7.29 (d, 2H), 4.08 (t, 4H), 1.75 (m, 4H), 1.22-1.50 (m, 12H), 0.89 (t, 6H).

2,5-Dihexyl-3-bromothienyl-6-thienylpyrrolo[3,4-c]-pyrrole-1,4-dione (23)

To the solution of 22 (4.5 g, 9.6 mmol) in chloroform (140 ml), N-bromosuccinimide (NBS) (1.14 g, 6.4 mmol) was added. After stirring overnight at room temperature, the reaction mixture was washed with water. The organic layer was dried over magnesium sulfate and solvent was removed by reduced pressure. The crude product was purified by gradient column chromatography on silica gel with chloroform/hexane (from 2/1 to 4/1, v/v) to yield 23 (3.2 g, 91%). $^1$H NMR (200 MHz, CDCl$_3$): 8.95 (d, 1H), 8.67 (d, 1H), 7.67 (d, 1H), 7.29 (d, 1H), 7.23 (d, 1H), 4.02 (m, 4H), 1.71 (m, 4H), 1.22-1.50 (m, 12H), 0.89 (t, 6H).

2,5-Dihexyl-3-thienyl-6-(5-hexyl-2,2':5',2''-terthienylpyrrolo[3,4-c]-pyrrole-1,4-dione (24)

To a mixture of 23 (1.0 g, 1.8 mmol), 5-hexyl-2,2'-bithiophene-5'-boronic acid pinacol ester (0.82 g, 2.2 mmol), tri(dibenzylidene acetone)palladium (0) (Pd$_2$(dba)$_3$) (0.084 g, 0.091 mmol), tri-tert-butylphosphonium tetrafluoroborate (0.16 g, 0.55 mmol), and potassium phosphate (3.1 g, 15 mmol), degassed THF/water (35 ml/2 ml) was added. After stirring under reflux overnight, the reaction mixture was poured into methanol. The crude product was collected by filtration and purified by column chromatography on a silica gel with chloroform/hexane (5/1, v/v) to obtain 24 (1.3 g, 99%). $^1$H NMR (200 MHz, CDCl$_3$): 8.98 (d, 1H), 8.95 (d, 1H), 7.64 (d, 1H), 7.32 (d, 2H), 7.24 (d, 1H), 7.06 (t, 2H), 6.74 (d, 1H), 4.08 (t, 4H), 2.83 (t, 2H), 1.75 (m, 6H), 1.23-1.53 (m, 18H), 0.90 (m, 9H).

2,5-Dihexyl-3-bromothienyl-6-(5-hexyl-2,2':5',2''-terthienylpyrrolo[3,4-c]-pyrrole-1,4-dione (25)

To the solution of 24 (1.3 g, 1.7 mmol) in chloroform (45 ml), NBS (0.34 g, 1.9 mmol) was added. After stirring overnight at room temperature, the reaction mixture was washed with water. The organic layer was dried over magnesium sulfate and solvent was removed by reduced pressure. The crude product was purified by column chromatography on silica gel with chloroform/hexane (4/1, v/v) to yield 5 (1.3 g, 92%). $^1$H NMR (200 MHz, CDCl$_3$): 8.99 (d, 1H), 8.64 (d, 1H), 7.32 (d, 1H), 7.24 (d, 2H), 7.05 (t, 2H), 6.74 (d, 1H), 4.08 (m, 4H), 2.83 (t, 2H), 1.75 (m, 6H), 1.23-1.50 (m, 18H), 0.92 (m, 9H).

9,9-Dihexylfluorene-2,7-bis(2,5-dihexyl-3-thienyl-6-(5-hexyl-2,2':5',2''-terthienyl pyrrolo[3,4-c]-pyrrole-1,4-dione) (26)

To a mixture of 25 (0.80 g, 1.0 mmol), 9,9-dihexylfluorene-2,7-bis(boronic ester pinacol ester) (0.26 g, 0.44 mmol), Pd$_2$(dba)$_3$ (0.070 g, 0.028 mmol), tri-tert-butylphosphonium tetrafluoroborate (0.053 g, 0.18 mmol), and potassium phosphate (1.1 g, 5.2 mmol), degassed THF/water (25 ml/2 ml) was added. After stirring under reflux overnight, the reaction mixture was poured into methanol. The crude product was collected by filtration and purified by gradient column chromatography on a silica gel with chloroform/hexane (from 1/1 to 4/1, v/v) to obtain 26 (0.40 g, 52%). $^1$H NMR (200 MHz, CDCl$_3$): 9.02 (d, 2H), 8.95 (d, 2H), 7.73 (d, 2H), 7.68 (d, 2H), 7.63 (s, 2H), 7.55 (d, 2H), 7.31 (d, 2H), 7.23 (d, 2H), 7.05 (t, 4H), 6.72 (d, 2H), 4.15 (m, 8H), 2.83 (t, 4H), 2.08 (m, 4H), 1.82 (m, 8H), 1.70 (m, 4H), 1.50 (m, 8H), 1.30-1.45 (m, 28H), 1.10 (m, 12H), 0.90 (m, 9H), 0.75 (m, 10H).

Example 12. Synthesis of Two-Core Diketopyrrolopyrrole Compounds with Electron-Deficient Bridge Moiety
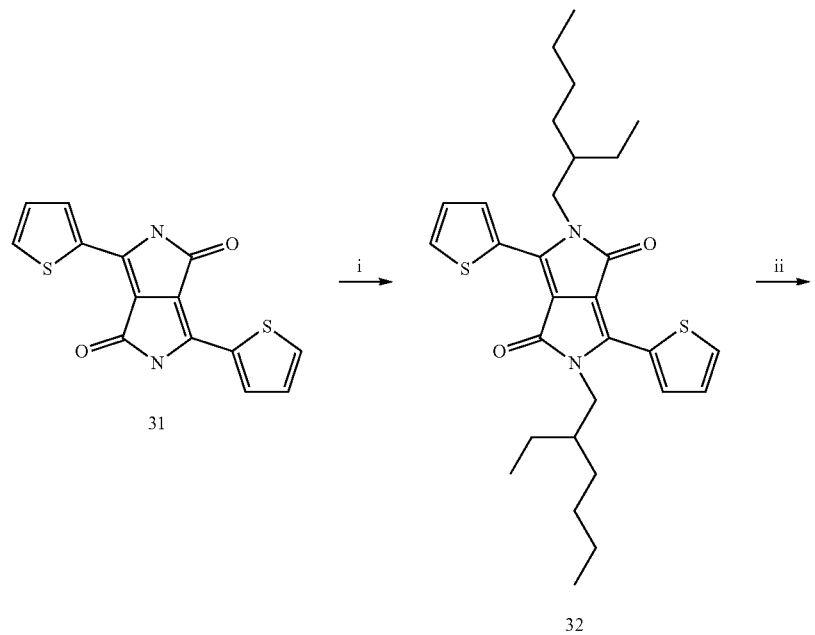
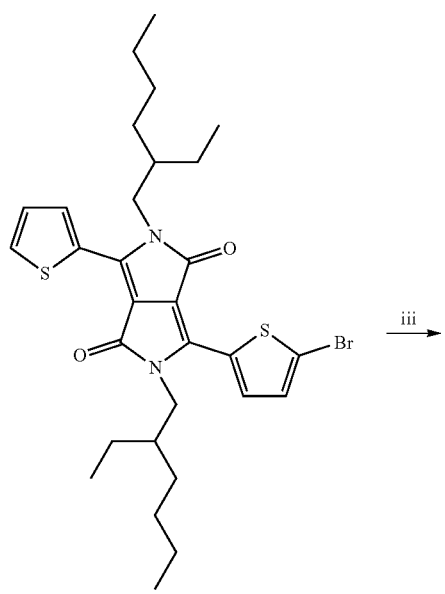

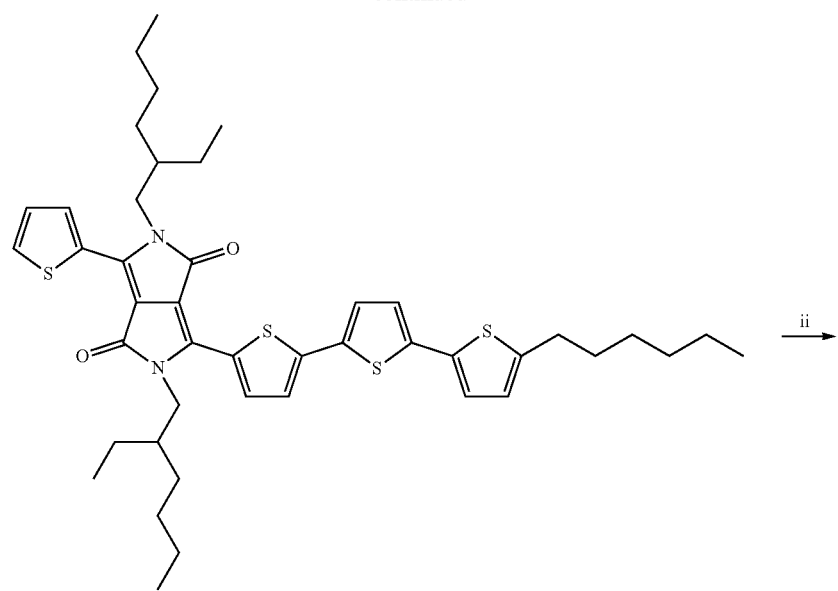
34
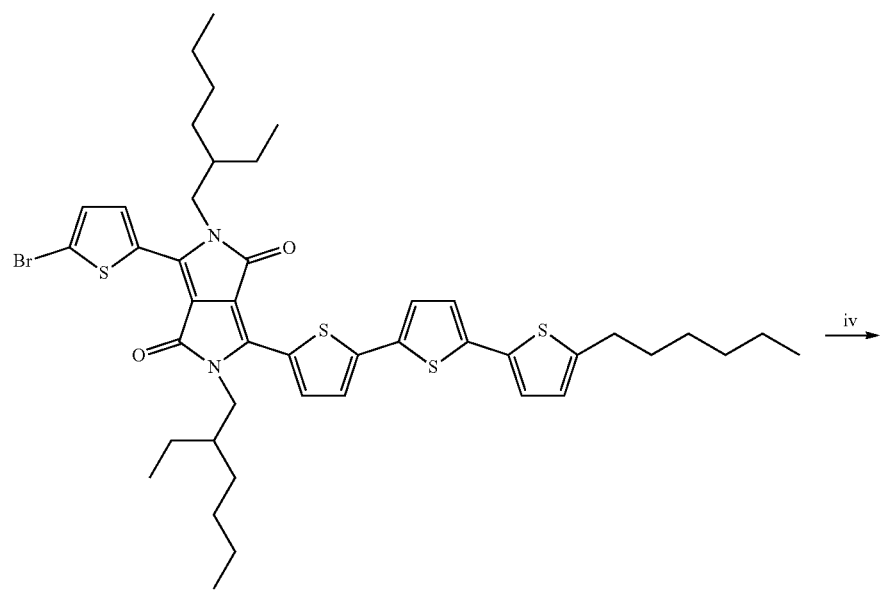
35

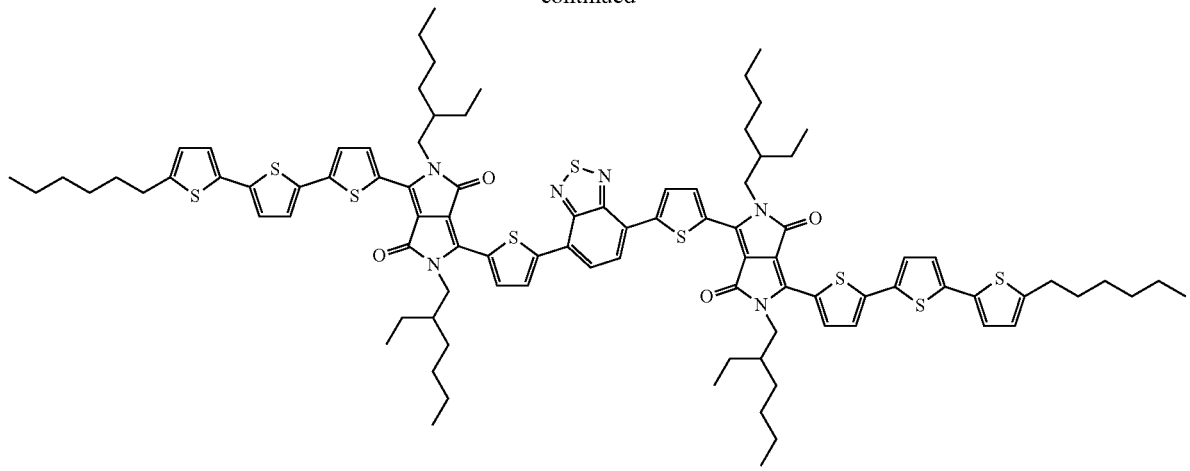

36

2,5-Bis(2-ethylhexyl)-3,6-dithienylpyrrolo[3,4-c]-pyrrole-1,4-dione (32)

To a solution of 31 (5.0 g, 17 mmol) in DMF (70 ml), 2-ethylhexyl bromide (13 g, 67 mmol) and potassium carbonate (6.9 g, 50 mmol) were added at 90° C. After stirring 8 hr, the reaction mixture was filtered to remove solid. The filtrate was extracted with chloroform and dried over magnesium sulfate. Upon evaporating solvent under reduced pressure, the crude product was purified by column chromatography with chloroform/hexane (4/1, v/v) to yield 32 (2.7 g, 32%). $^1$H NMR (200 MHz, CDCl$_3$): 8.90 (d, 2H), 7.63 (d, 2H), 7.29 (d, 2H), 4.04 (d, 4H), 1.83 (m, 2H), 1.22-1.50 (m, 16H), 0.88 (m, 12H).

2,5-Bis(2-ethylhexyl)-3-bromothienyl-6-thienylpyrrolo[3,4-c]-pyrrole-1,4-dione (33)

To the solution of 32 (2.0 g, 3.8 mmol) in chloroform (60 ml), NBS (0.45 g, 2.5 mol) was added. After stirring overnight at room temperature, the reaction mixture was washed with water. The organic layer was dried over magnesium sulfate and solvent was removed by reduced pressure. The crude product was purified by gradient column chromatography on silica gel with chloroform/hexane (from 2/1 to 4/1, v/v) to yield 33 (1.7 g, 75%). $^1$H NMR (200 MHz, CDCl$_3$): 8.94 (d, 1H), 8.67 (d, 1H), 7.67 (d, 1H), 7.29 (d, 1H), 7.24 (d, 1H), 4.02 (m, 4H), 1.90 (m, 2H), 1.25-1.52 (m, 16H), 0.89 (m, 12H).

2,5-Bis(2-ethylhexyl)-3-thienyl-6-(5-hexyl-2,2':5',2''-terthienylpyrrolo[3,4-c]-pyrrole-1,4-dione (34)

To a mixture of 33 (1.0 g, 1.7 mmol), 5-hexyl-2,2'-bithiophene-5'-boronic acid pinacol ester (0.8 g, 2.0 mmol), Pd$_2$(dba)$_3$ (0.076 g, 0.083 mmol), tri-tert-butylphosphonium tetrafluoroborate (0.14 g, 0.50 mmol), and potassium phosphate (2.8 g, 13 mmol), degassed THF/water (30 ml/3 ml) was added. After stirring under reflux overnight, the reaction mixture was poured into methanol. The crude product was collected by filtration and purified by column chromatography on a silica gel with chloroform/hexane (5/1, v/v) to obtain 34 (1.2 g, 94%). $^1$H NMR (200 MHz, CDCl$_3$): 8.98 (d, 1H), 8.92 (d, 1H), 7.63 (d, 1H), 7.32 (d, 2H), 7.24 (d, 1H), 7.06 (t, 2H), 6.74 (d, 1H), 4.08 (d, 4H), 2.83 (t, 2H), 1.90 (m, 2H), 1.70 (m, 2H), 1.20-1.54 (m, 22H), 0.89 (m, 15H).

2,5-Bis(2-ethylhexyl)-3-bromothienyl-6-(5-hexyl-2,2':5',2''-terthienylpyrrolo[3,4-c]-pyrrole-1,4-dione (35)

To the solution of 34 (1.2 g, 1.6 mmol) in chloroform (25 ml), NBS (0.30 g, 1.7 mmol) was added. After stirring overnight at room temperature, the reaction mixture was washed with water. The organic layer was dried over magnesium sulfate and solvent was removed by reduced pressure. The crude product was purified by column chromatography on silica gel with chloroform/hexane (4/1, v/v) to yield 35 (1.2 g, 91%). $^1$H NMR (200 MHz, CDCl$_3$): 9.00 (d, 1H), 8.66 (d, 1H), 7.32 (d, 1H), 7.25 (d, 2H), 7.07 (t, 2H), 6.74 (d, 1H), 4.08 (m, 4H), 2.83 (t, 2H), 1.90 (m, 2H), 1.70 (m, 2H), 1.20-1.55 (m, 22H), 0.92 (m, 15H).

2,1,3-Benzothiadiazole-4,7-bis(2,5-dihexyl-3-thienyl-6-(5-hexyl-2,2':5',2''-terthienyl pyrrolo[3,4-c]-pyrrole-1,4-dione) (36)

To a mixture of 35 (0.86 g, 1.0 mmol), 2,1,3-benzothiadiazole-4,7-bis(boronic acid pinacol ester), (0.17 g, 0.44 mmol), Pd$_2$(dba)$_3$ (0.028 g, 0.031 mmol), tri-tert-butylphosphonium tetrafluoroborate (0.053 g, 0.18 mmol), and potassium phosphate (0.745 g, 3.51 mmol), degassed THF/water (20 ml/1 ml) was added. After stirring under reflux overnight, the reaction mixture was poured into water and extracted with chloroform. The solution was dried over magnesium sulfate, followed by evaporating the solvent under reduced pressure. The crude product was purified by gradient column chromatography on a silica gel with chloroform/hexane (from 1/1 to 5/1, v/v) to obtain 36 (0.67 g, 91%). $^1$H NMR (200 MHz, CDCl$_3$): 9.05 (d, 2H), 8.99 (d, 2H), 7.90 (d, 2H), 7.70 (s, 2H), 7.07 (d, 2H), 7.00 (d, 2H), 6.88 (d, 2H), 6.82 (d, 2H), 6.60 (d, 2H), 3.95 (m, 8H), 2.83 (t, 4H), 1.90 (m, 4H), 1.70 (m, 4H), 1.20-1.55 (m, 44H), 0.92 (m, 30H).

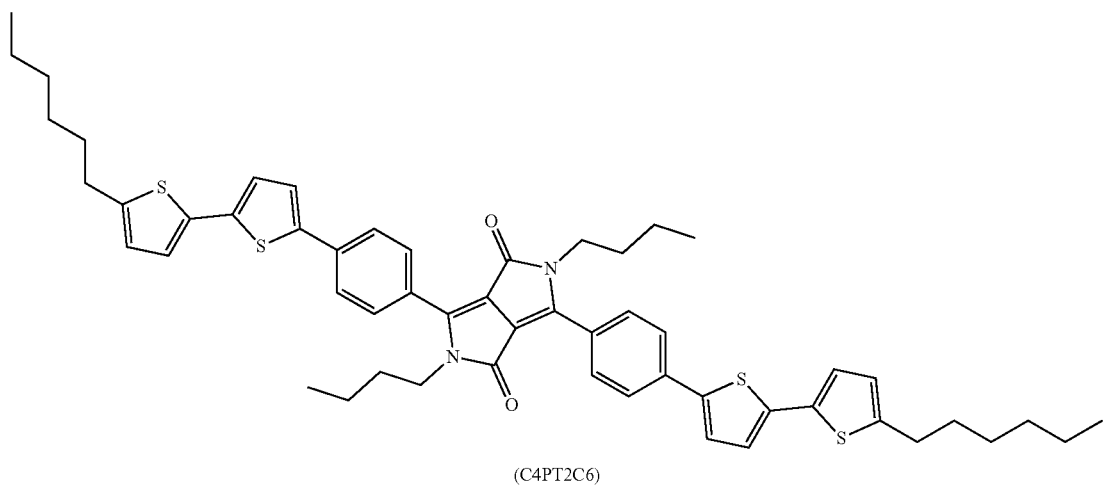

(C4PT2C6)

2,5-Dibutyl-3,6-bis[4-(5-hexyl-2,2'-bithiophene-5-yl)phenyl]pyrrolo[3,4-c]-pyrrole-1,4-dione, C4PT2C6

To a mixture of 2,5-dibutyl-3,6-bis(4-bromophenyl)pyrrolo[3,4-c]-pyrrole-1,4-dione (0.40 g, 0.72 mmol), 5-hexyl-2,2'-bithiophene boronic acid pinacol ester (0.67 g, 1.8 mmol), $Pd_2(dba)_3$ (0.033 g, 0.036 mmol), tri-tert-butylphosphonium tetrafluoroborate (0.062 g, 0.22 mmol), and potassium phosphate (2.4 g, 12 mmol), degassed THF/water (22 mL/2 mL) was added. After stirring under reflux overnight, the reaction mixture was poured into methanol. The crude product was collected by filtration and purified by gradient column chromatography on a silica gel with chloroform/hexane from 2/1 to 5/1 (v/v) to obtain C4PT2C6 (0.55 g, 86%). $^1$H NMR (200 MHz, $CDCl_3$): 7.83 (d, 4H), 7.68 (d, 4H), 7.28 (d, 2H), 7.03 (d, 2H), 7.00 (d, 2H), 6.67 (d, 2H), 3.78 (t, 4H), 2.76 (t, 4H), 1.61 (m, 8H), 1.18-1.46 (m, 16H), 0.83 (m, 12H).

Example 13. Characteristics of Devices with Two-Core Diketopyrrolopyrrole Compounds 2,1,3-Benzothiadiazole-4,7-bis(2,5-dihexyl-3-thienyl-6-(5-hexyl-2,2':5',2''-terthienyl pyrrolo[3,4-c]-pyrrole-1,4-dione) (36) has a band gap of approximately 1.3 eV and an absorption spectrum which extends beyond 900 nm. 9,9-Dihexylfluorene-2,7-bis(2,5-dihexyl-3-thienyl-6-(5-hexyl-2,2':5',2''-terthienyl pyrrolo[3,4-c]-pyrrole-1,4-dione) (26) has a band gap of approximately 1.6 eV and an absorption spectrum which extends to 800 nm.

Figure 15:
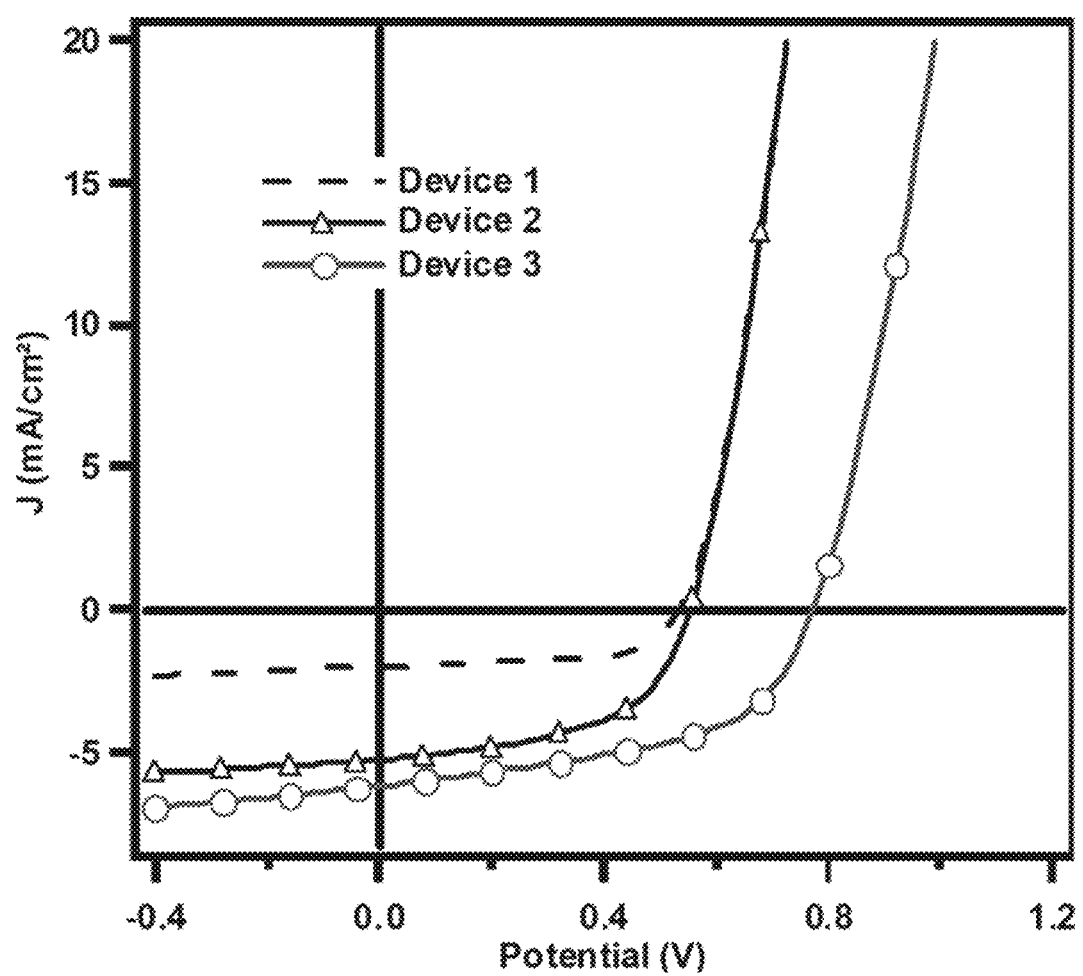
FIG. 15 shows current-voltage curves for certain devices of the invention which use a material having two diketopyrrolopyrrole cores. Device 1, dashed line, prepared with a 50:50 mixture of 36 and PC$_{71}$BM and spincast from chloroform; Device 2, line with triangles, prepared with 50:50 mixture of material 36 and PC$_{71}$BM and spincast from 98% chloroform and 2% 1,8-octanedithiol; Device 3, line with circles, prepared with a 30:70 mixture of material 26 and PC$_{71}$BM and spincast from chloroform.

One example of a device using compound 36 is shown in Device 1 of FIG. 15, which has a device architecture of ITO/PEDOT:PSS/(donor:acceptor blend)/Al). The device was prepared in a manner similar to that describe in Example 9 above. A PEDOT:PSS layer was prepared on an ITO electrode by spincasting a layer of Baytron Clevios P4083 onto a cleaned ITO substrate at 2500 rpm and annealing at 140° C. for 30 minutes. A 50:50 mixture of 36 and $PC_{71}BM$ was dissolved in chloroform at a concentration of 16.7 mg/mL and spincast onto the ITO/PEDOT:PSS at a rate of 2000 rpm. After the active layer was deposited, 80-100 nm of aluminum (Aldrich evaporation grade) was evaporated at a base pressure of $10^{-6}$ Torr and a rate less than or equal to 1.5 Angstrom/second. This yielded a device with a Jsc of 2.2 mA/cm$^2$, a Voc of 0.51 V, a FF of 66% and a power conversion efficiency of 0.74%.

In another example (Device 2 of FIG. 15), a 50:50 mixture of material 36 and $PC_{71}BM$ was dissolved in a solvent mixture consisting of 98% chloroform and 2% 1,8-octanedithiol and used to prepare a device as described above. The mixture was prepared at a solids concentration of 16.7 mg/mL and spincast at a rate of 2000 rpm, yielding a device with a Jsc of 5.3 mA/cm$^2$, a Voc of 0.55 V, a FF of 53% and a power conversion efficiency of 1.6%.

In another example (Device 3 of FIG. 15), a 30:70 mixture of material 26 and $PC_{71}BM$ was used to prepare a device as described above. The mixture was dissolved in chloroform at a concentration of 16.7 mg/mL and spincast at a rate of 2000 rpm and annealed at 60° C., yielding a device with a Jsc of 6.2 mA/cm$^2$, a Voc of 0.78V, a FF of 55% and a power conversion efficiency of 2.7%.

Current-voltage characteristics under 100 mW/cm$^2$ simulated solar radiation of these Devices 1-3 are plotted in FIG. 15.

Example 14. Fabrication of Devices Using Different Casting Solvents

In some cases, it can be advantageous to select new or different solvents for the fabrication of the active layer. Any volatile solvent which adequately dissolves both donor and acceptor material may be used to fabricate the active layer, so long as the concentration and processing conditions are adjusted to achieve films with thickness in the range of 50 to 300 nm, preferably 75-125 nm, and the annealing temperature is optimized for the solvent being used.

The devices described below were prepared using the method described for the devices in Example 13. In one example (Device 4), a 60:40 mixture of SMBFu and $PC_{71}BM$ were dissolved in chloroform at a concentration of 16.7 mg/mL, spincast on a substrate at 1500 rpm and annealed at 130° C. for 10 minutes, yielding a device with a Jsc of 10.1 mA/cm$^2$, a Voc of 0.88V, a FF of 48% and a power conversion efficiency of 4.3%.

In another example (Device 5 of FIG. 16), a 60:40 mixture of SMBFu and $PC_{71}BM$ were dissolved in thiophene at a concentration of 16.7 mg/mL, spincast on a substrate at 1500 rpm and annealed at 130° C. for 10 minutes, yielding a device with a Jsc of 9.7 mA/cm$^2$, a Voc of 0.89V, a FF of 45% and a power conversion efficiency of 3.9%.

In another example (Device 6 of FIG. 16), a 60:40 mixture of SMBFu and PC$_{71}$BM were dissolved in trichloroethylene at a concentration of 16.7 mg/mL, spincast on a substrate at 800 rpm and annealed at 110° C. for 10 minutes, yielding a device with a Jsc of 10.1 mA/cm$^2$, a Voc of 0.89V, a FF of 47% and a power conversion efficiency of 4.2%.

In another example (Device 7 of FIG. 16), a 60:40 mixture of SMBFu and PC$_{71}$BM were dissolved in carbon disulfide at a concentration of 16.7 mg/mL, spincast on a substrate at 1500 rpm and annealed at 80° C. for 10 minutes, yielding a device with a Jsc of 10.6 mA/cm$^2$, a Voc of 0.92V, a FF of 44% and a power conversion efficiency of 4.2%.

Figure 16:
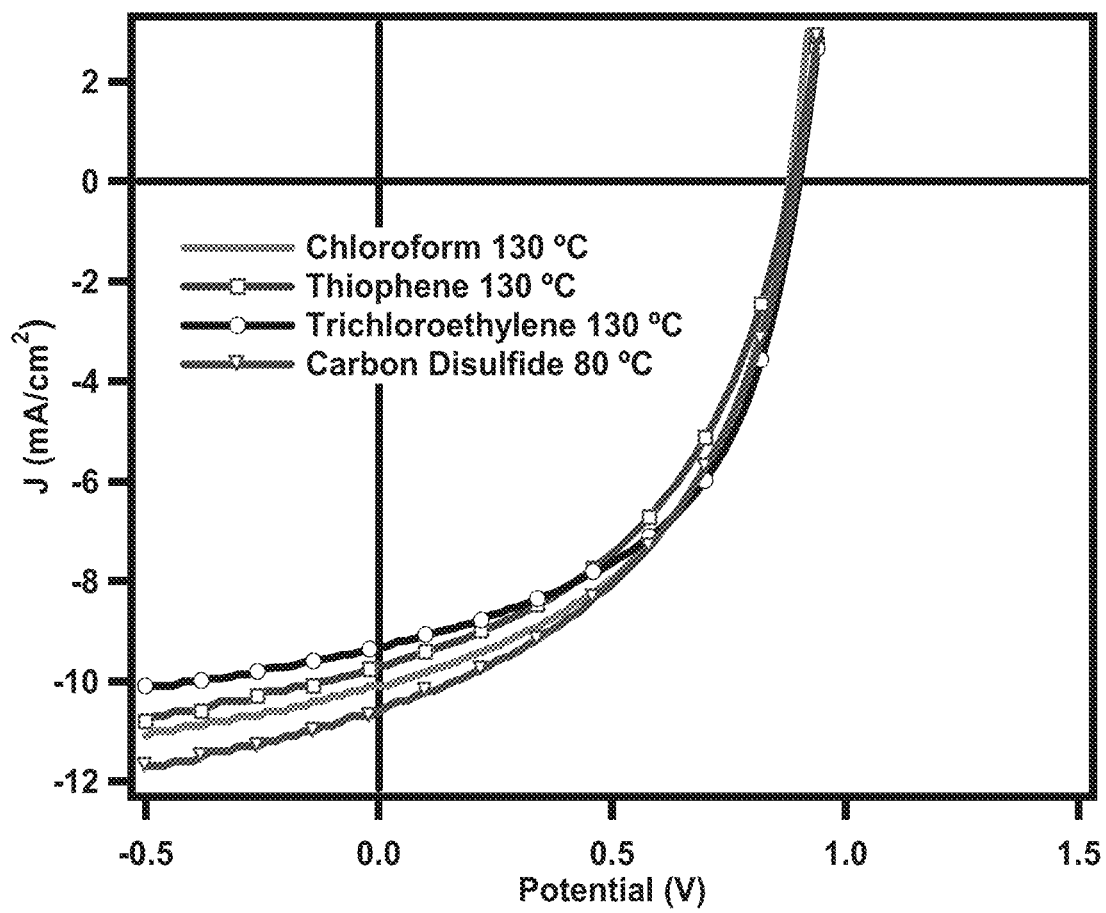
FIG. 16 shows current-voltage curves for certain devices of the invention, where the active layer of the device was cast using various solvents. Carbon disulfide, 80° C., inverted triangles; trichloroethylene, 130° C., circles; thiophene, 130° C., squares; chloroform, 130° C., line with no symbols.

Current-voltage characteristics under 100 mW/cm$^2$ simulated solar radiation of these Devices 4-7 are plotted in FIG. 16.

Example 15. Fabrication of Devices Using Different Acceptor Materials

Although fullerenes typically yield significantly higher efficiencies than other electron accepting materials when used in BHJ solar cells, they are very expensive to synthesize and refine. Additionally, it can be difficult to adjust the ionization potential (HOMO) and electron affinity (LUMO) of fullerene derivatives in order to adjust device characteristics such as Voc. Specifically, the Voc of optimized devices is often found to be about 0.3 V less than the difference between the LUMO of the acceptor and the HOMO of the donor ($\Delta$). For these reasons, it may be advantageous to use electron accepting materials other than fullerenes.

Figure 17A:
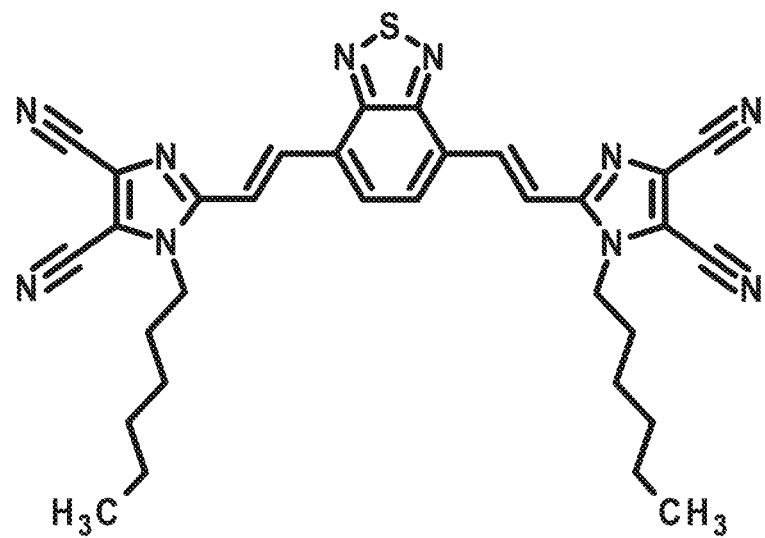
FIG. 17A and FIG. 17B show the structure of Material 4 and energy level diagrams of various material configurations for devices of the invention.

In one example, the DPP based electron donating material C4PT2C6 (indicated as Material 3 of FIG. 17B) and a non-fullerene electron accepting material (Material 4, shown in FIG. 17A) was used in place of PCBM. The device described below was prepared using the method described for the devices in Example 13.

Figure 17B:
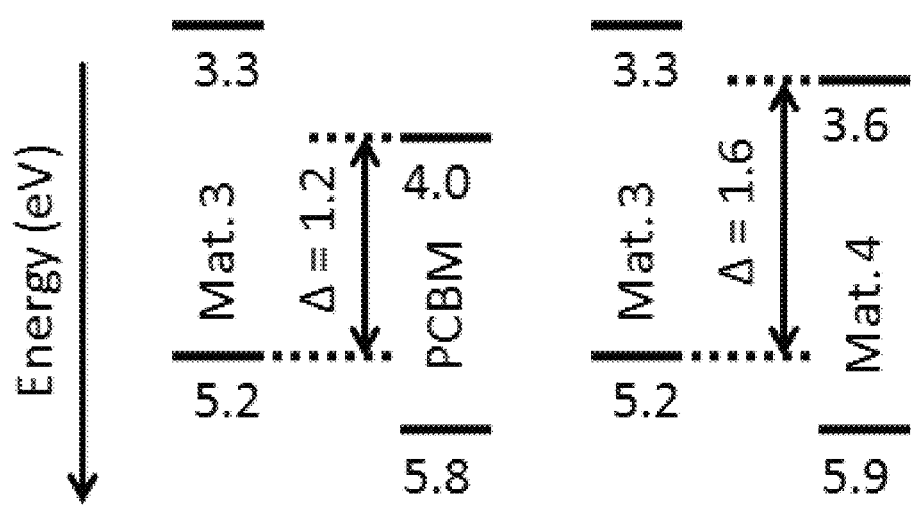

An energy level diagram comparing HOMO and LUMO values of C4PT2C6 (Material 3) with PCBM is shown at left in FIG. 17B, while an energy level diagram comparing HOMO and LUMO values of C4PT2C6 (Material 3) with Material 4 is shown at right in FIG. 17B. The higher LUMO level of this acceptor relative to PCBM leads to a larger A value and indicates that BHJ solar cells prepared from this donor acceptor combination should yield higher Voc's compared to PCBM.

Figure 18:
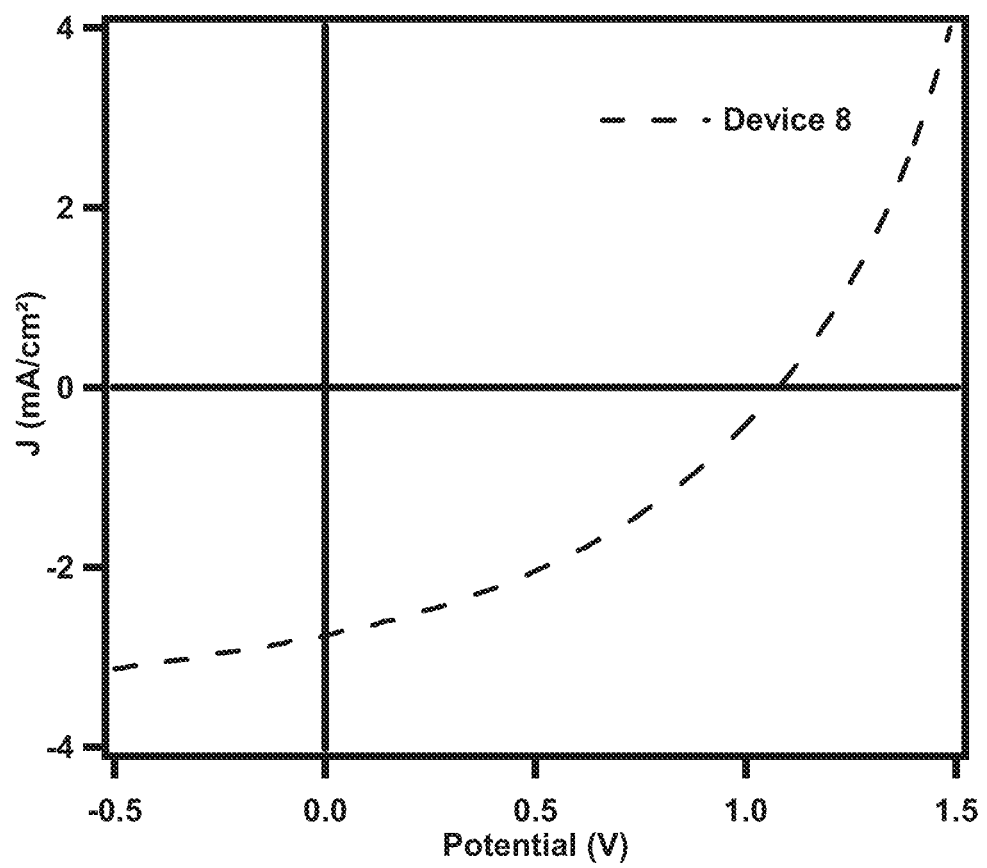
FIG. 18 shows a current-voltage curve for a device prepared with a 50:50 mixture of C4PT2C6 and Material 4.

In one example (Device 8 of FIG. 18), a 50:50 mixture of C4PT2C6 and Material 4 are dissolved in chloroform at a concentration of 16.7 mg/mL, spincast on a substrate at 4000 rpm and annealed at 110° C. for 10 minutes, yielding a device with a Jsc of 2.5 mA/cm$^2$, a Voc of 1.10 V, a FF of 34% and a power conversion efficiency of 1.1%. Current-voltage characteristics under 100 mW/cm$^2$ simulated solar radiation of device 8 are plotted in FIG. 18.

Example 16. Inverted Device Architecture

Devices having inverted architecture were prepared. In one example (Device 9), the work function of an ITO substrate is modified using a self-assembled monolayer of 3-aminopropyltrimethoxysiloxane and measured to be 4.3 eV by UPS. A 60:40 mixture of SMBFu and PC71BM were dissolved in chloroform at a concentration of 16.7 mg/mL and spincast on the modified substrate at 2000 rpm. A layer of PEDOT:PSS was then deposited on top by spincasting a 2:1 mixture of isopropanol:Baytron Clevios P4083 at 3000 rpm. The resulting film was annealed at 110° C. for 30 minutes, followed by the evaporation of Au anodes at a base pressure of 10$^{-6}$ torr and a rate of less than 1 Angstrom/second. This device had a Jsc of 6.4 mA/cm$^2$, a Voc of 0.74 V, a FF of 43% and a power conversion efficiency of 2.0%.

In another example (Device 10), an ITO substrate was modified by spincasting a solution consisting of 4% titanium isopropoxide, 10% dimethoxyethanol and 86% isopropanol by volume at 3000 rpm in an atmosphere with 20 ppm water concentration. This substrate was then annealed at 200° C. for 30 minutes in the same atmosphere. A 60:40 mixture of SMBFu and PC71BM were dissolved in chloroform at a concentration of 16.7 mg/mL and spincast on the modified substrate at 2000 rpm. A layer of PEDOT:PSS was then deposited on top by spincasting a 2:1 mixture of isopropanol:Baytron Clevios P4083 at 3000 rpm. The resulting film was annealed at 110° C. for 30 minutes, followed by the evaporation of Au anodes at a base pressure of 10$^{-6}$ torr and a rate of less than 1 Angstrom/second. This device had a Jsc of 8.8 mA/cm$^2$, a Voc of 0.88 V, a FF of 36% and a power conversion efficiency of 2.8%.

Figure 20:
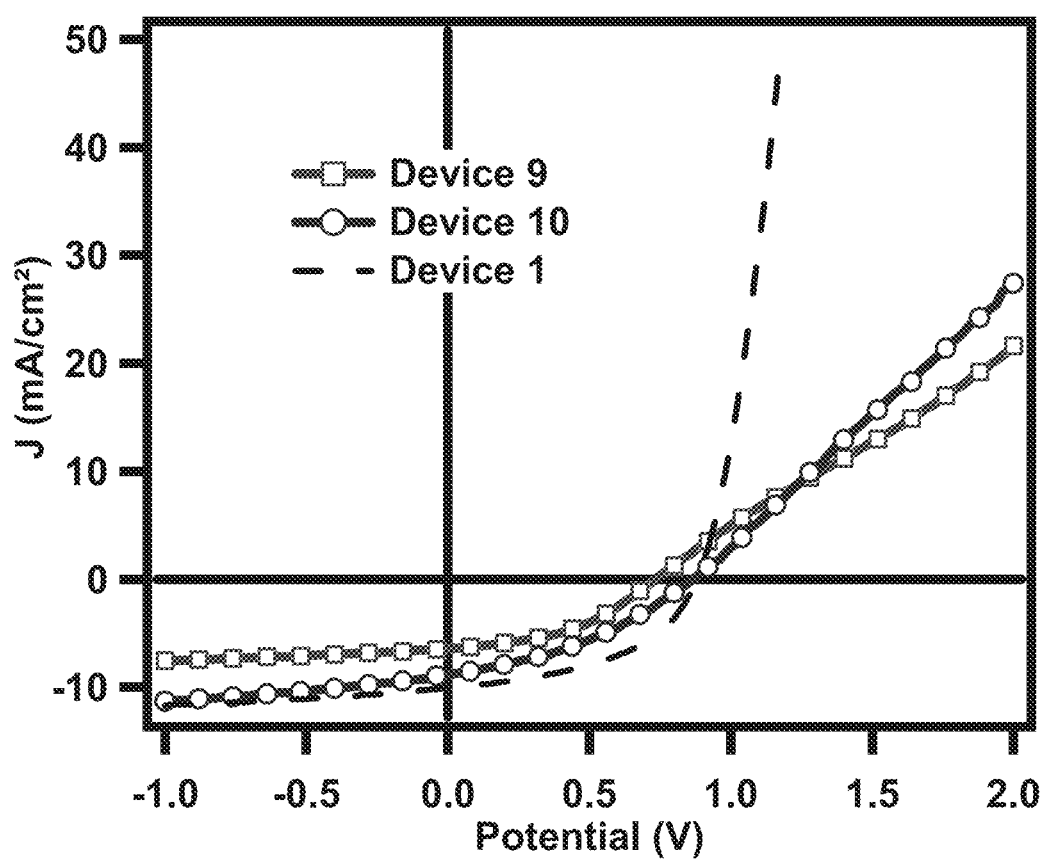
FIG. 20 shows current-voltage curves for a conventional "normal" Device 1 (dashed line, no shapes) of Example 13 versus inverted devices Device 9 (line with squares) and Device 10 (line with circles)

FIG. 19A shows an energy level diagram for a normal device, while FIG. 19B shows an energy level diagram for an inverted device. The current-voltage characteristics of a normal device (Device 1 of FIG. 15 and Example 13) are compared to the inverted devices (Device 9 and Device 10) in FIG. 20.

The disclosures of all publications, patents, patent applications and published patent applications referred to herein by an identifying citation are hereby incorporated herein by reference in their entireties.

Although the foregoing invention has been described in some detail by way of illustration and example for purposes of clarity of understanding, it is apparent to those skilled in the art that certain changes and modifications will be practiced. Therefore, the description and examples should not be construed as limiting the scope of the invention.

What is claimed is:

1. An optoelectronic device comprising:
   a) a first hole-collecting electrode;
   b) an optional hole-transporting layer;
   c) a layer comprising a mixture of an electron donor material and an electron acceptor material; and
   d) a second electron-collecting electrode,
   wherein the electron donor material comprises a compound of the formula:

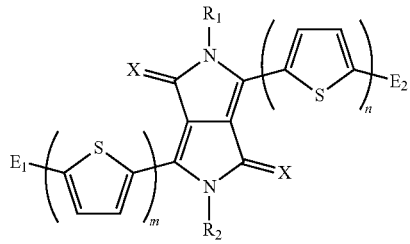

wherein
X is oxygen or sulfur;
m is independently selected from 1, 2, or 3;
n is independently selected from 1, 2, or 3;
E$_1$ and E$_2$ are independently a nonentity, H, benzofuran attached to the remainder of the molecule at the 2-position of the benzofuran ring, or a C$_1$-C$_{12}$ alkyl group; and R₁ and R₂ are independently selected from H, $C_1$-$C_{12}$ alkyl, and —C(=O)—O—$C_1$-$C_{12}$ alkyl.

2. The device of claim 1, wherein X is oxygen.

3. The device of claim 1, wherein m=n=1, m=n=2, or m=n=3.

4. The device of claim 1, wherein R₁ and R₂ are the same and are selected from hexyl, 2-ethylhexyl, t-butoxycarbonyl, and trimethylsilyl.

5. The device of claim 1, wherein the first electrode comprises indium tin oxide and the second electrode comprises aluminum, silver or magnesium.

6. The device of claim 1, wherein the optional hole transporting layer is present and comprises poly(3,4-ethylene dioxythiophene:poly(styrenesulfonate) (PEDOT:PSS).

7. The device of claim 1, wherein the electron acceptor is selected from the group consisting of fullerene electron acceptors, [6,6]-phenyl C61-butyric acid methyl ester (PCBM), $PC_{71}BM$, titanium dioxide, and zinc oxide.

8. The device of claim 1, wherein the electron donor material comprises a compound of the formula:

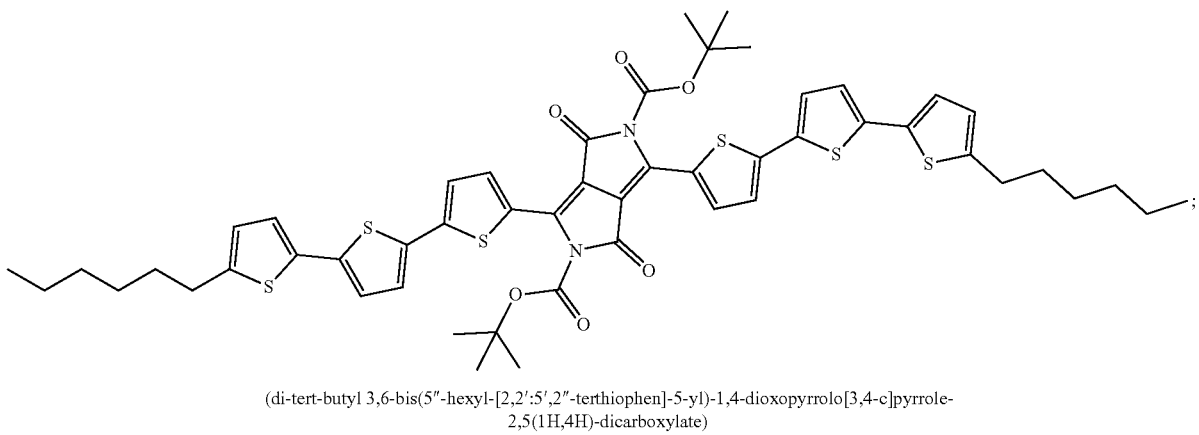

(di-tert-butyl 3,6-bis(5″-hexyl-[2,2′:5′,2″-terthiophen]-5-yl)-1,4-dioxopyrrolo[3,4-c]pyrrole-2,5(1H,4H)-dicarboxylate)

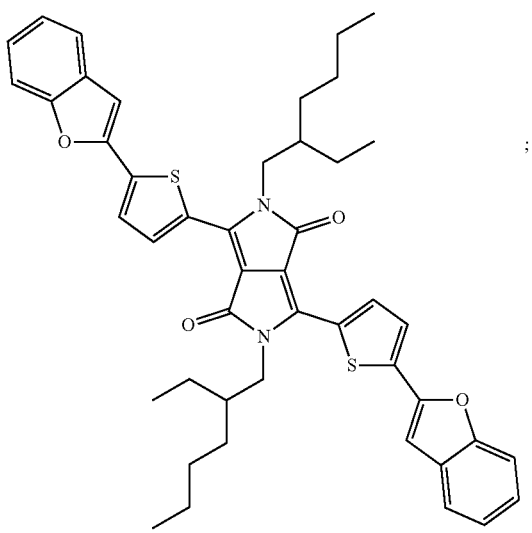

(3,6-bis(5-(benzofuran-2-yl)thiophen-2-yl)-2,5-bis(2-ethylhexyl)pyrrolo[3,4-c]pyrrole-1,4-dione

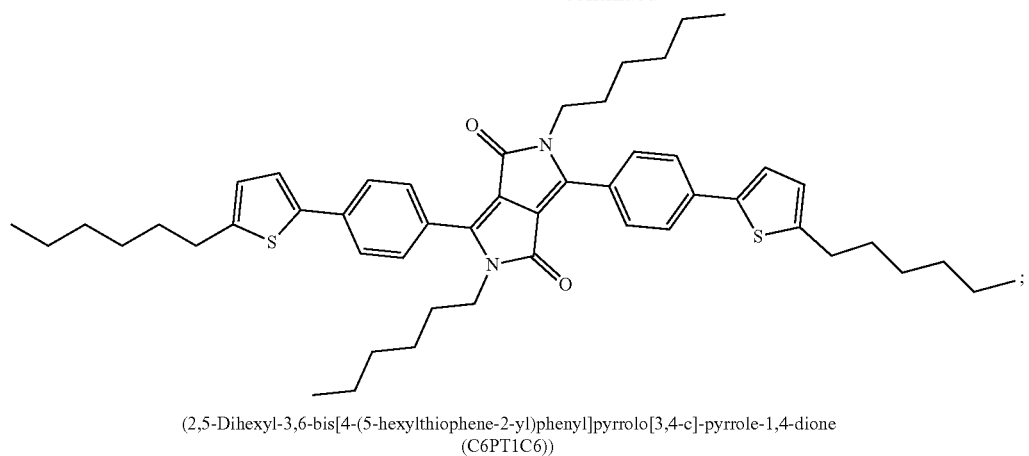
(2,5-Dihexyl-3,6-bis[4-(5-hexylthiophene-2-yl)phenyl]pyrrolo[3,4-c]-pyrrole-1,4-dione (C6PT1C6))
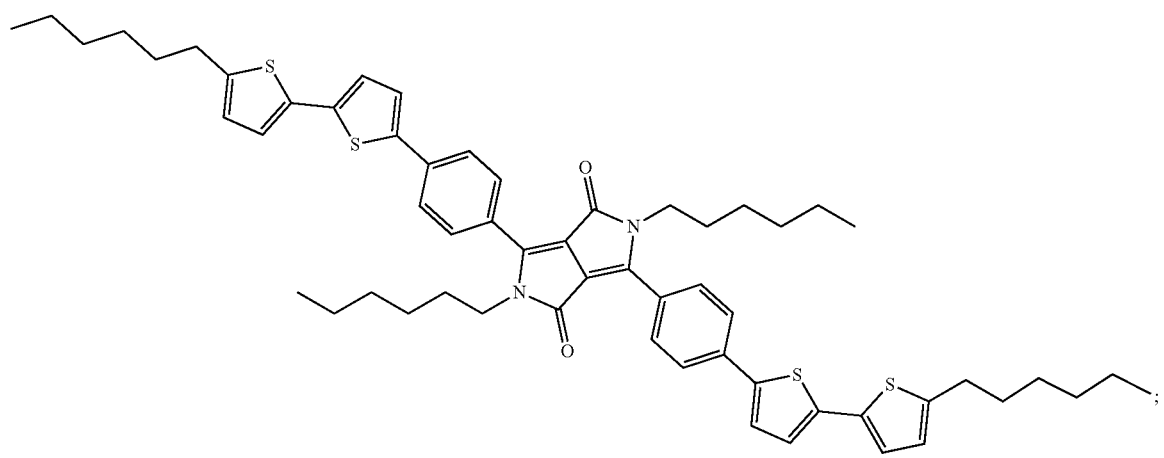
(2,5-dihexyl-3,6-bis(4-(5′-hexyl-[2,2′-bithiophen]-5-yl)phenyl)-2,5-dihydropyrrolo[3,4-c]pyrrole-1,4-dione (C6PT2C6))
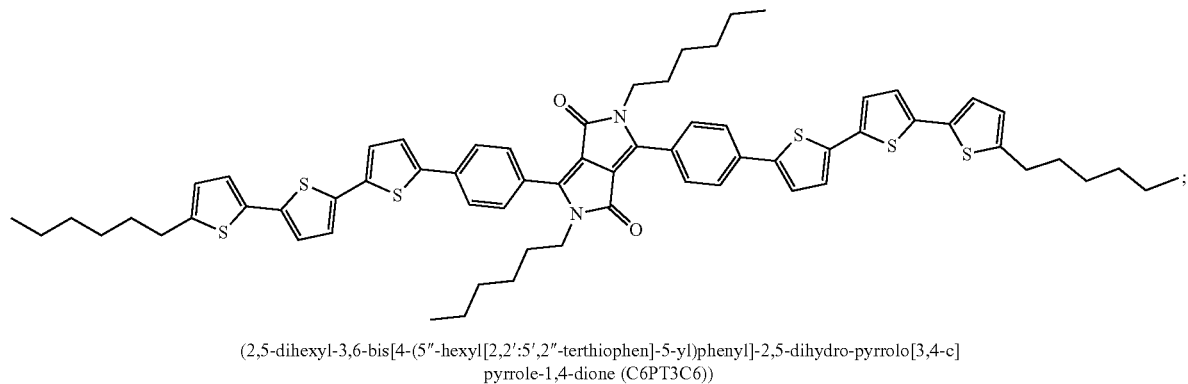
(2,5-dihexyl-3,6-bis[4-(5″-hexyl[2,2′:5′,2″-terthiophen]-5-yl)phenyl]-2,5-dihydro-pyrrolo[3,4-c]pyrrole-1,4-dione (C6PT3C6))

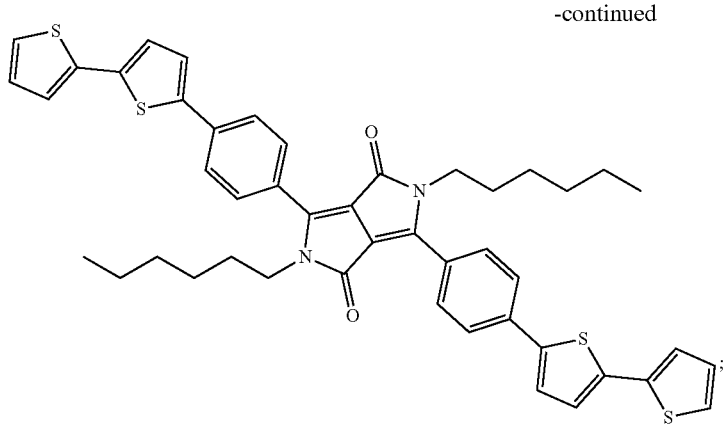

(3,6-bis(4-[2,2'-bithiophen]-5-ylphenyl)-2,5-dihexyl-
2,5-dihydro-pyrrolo[3,4-c]pyrrole-1,4-dione (C6PT2));

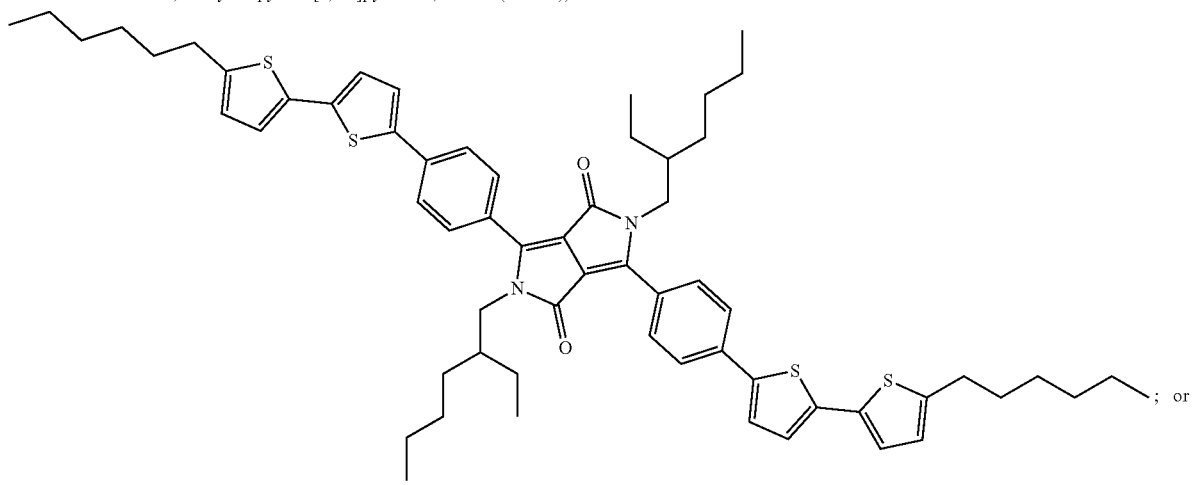

(2,5-bis(2-ethylhexyl)-3,6-bis(4-(5'-hexyl-[2,2'-bithiophen]-5-yl)phenyl)-2,5-dihydropyrrolo
[3,4-c]pyrrole-1,4-dione (EHPT2C6)); or

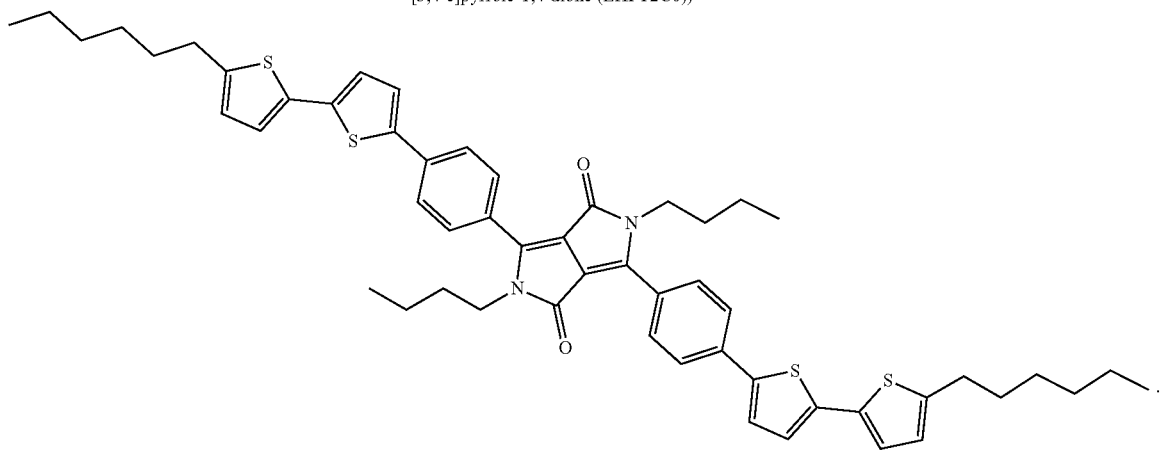

(2,5-dibutyl-3,6-bis[4-(5'-hexyl[2,2'-bithiophen]-5-yl)phenyl]-2,5-dihydro-pyrrolo[3,4-c]
pyrrole-1,4-dione (C4PT2C6)).

9. The device of claim 1, wherein $E_1$ and $E_2$ are independently selected from the group consisting of n-hexyl and benzofuran attached to the remainder of the molecule at the 2-position of the benzofuran ring.

10. The device of claim 1, wherein $E_1$ and $E_2$ are n-hexyl.

11. The device of claim 1, wherein $E_1$ and $E_2$ are benzofuran attached to the remainder of the molecule at the 2-position of the benzofuran ring.

* * * * *